US011004947B2

(12) United States Patent
Gunji et al.

(10) Patent No.: US 11,004,947 B2
(45) Date of Patent: May 11, 2021

(54) NONVOLATILE STORAGE ELEMENT

(71) Applicant: ASAHI KASEI MICRODEVICES CORPORATION, Tokyo (JP)

(72) Inventors: Tomohiro Gunji, Tokyo (JP); Yuukou Tsushima, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 140 days.

(21) Appl. No.: 16/420,692

(22) Filed: May 23, 2019

(65) Prior Publication Data

US 2019/0363168 A1  Nov. 28, 2019

(30) Foreign Application Priority Data

May 25, 2018 (JP) .............................. JP2018-100718
Apr. 17, 2019 (JP) .............................. JP2019-078870

(51) Int. Cl.
*H01L 29/788* (2006.01)
*H01L 29/423* (2006.01)
*H01L 21/28* (2006.01)
*G11C 16/04* (2006.01)
*G11C 16/30* (2006.01)
*H01L 29/08* (2006.01)
*H01L 29/66* (2006.01)

(52) U.S. Cl.
CPC .... *H01L 29/42324* (2013.01); *G11C 16/0408* (2013.01); *G11C 16/30* (2013.01); *H01L 29/0847* (2013.01); *H01L 29/40114* (2019.08); *H01L 29/66825* (2013.01); *H01L 29/7883* (2013.01)

(58) Field of Classification Search
CPC .......................... H01L 29/788; H01L 29/7883
USPC .................................................. 257/315, 321
See application file for complete search history.

(56) References Cited

U.S. PATENT DOCUMENTS

| 4,513,397 A | * | 4/1985 | Ipri | .................... G11C 16/0425 |
| | | | | 257/316 |
| 4,618,876 A | * | 10/1986 | Stewart | ............... H01L 29/7883 |
| | | | | 257/315 |
| 2010/0133603 A1 | | 6/2010 | Sekiguchi | |
| 2012/0001251 A1 | | 1/2012 | Sekiguchi | |

FOREIGN PATENT DOCUMENTS

| JP | 2007-027373 A | 2/2007 |
| JP | 2010-129979 A | 6/2010 |
| JP | 2015-011454 A | 1/2015 |
| JP | 2018-029136 A | 2/2018 |

OTHER PUBLICATIONS

Extended European Search Report dated Feb. 14, 2020, issued in corresponding European Patent Application No. 19176455.4.

* cited by examiner

*Primary Examiner* — Mark V Prenty
(74) *Attorney, Agent, or Firm* — Morgan, Lewis & Bockius LLP

(57) ABSTRACT

The object of the present invention is to provide a nonvolatile storage element capable of suppressing retention degradation. A nonvolatile storage element is provided with a semiconductor substrate and a floating gate provided above the semiconductor substrate, in which the floating gate has an area of 30 $\mu m^2$ or more.

17 Claims, 28 Drawing Sheets

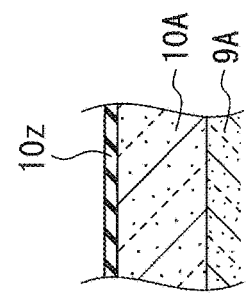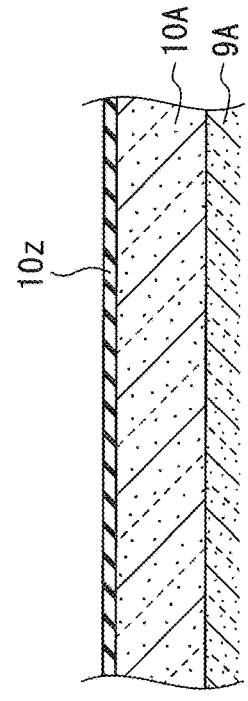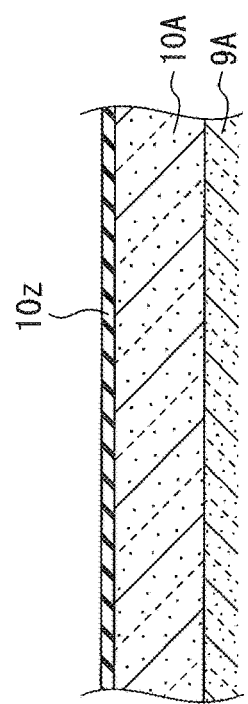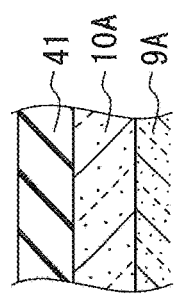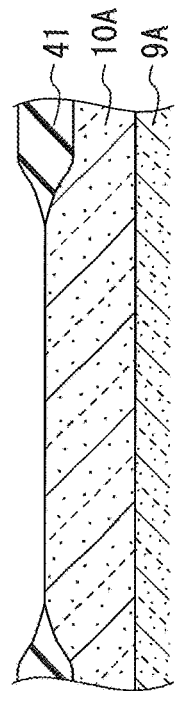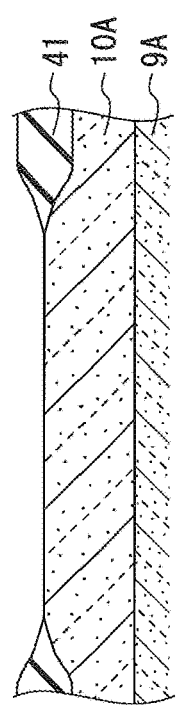

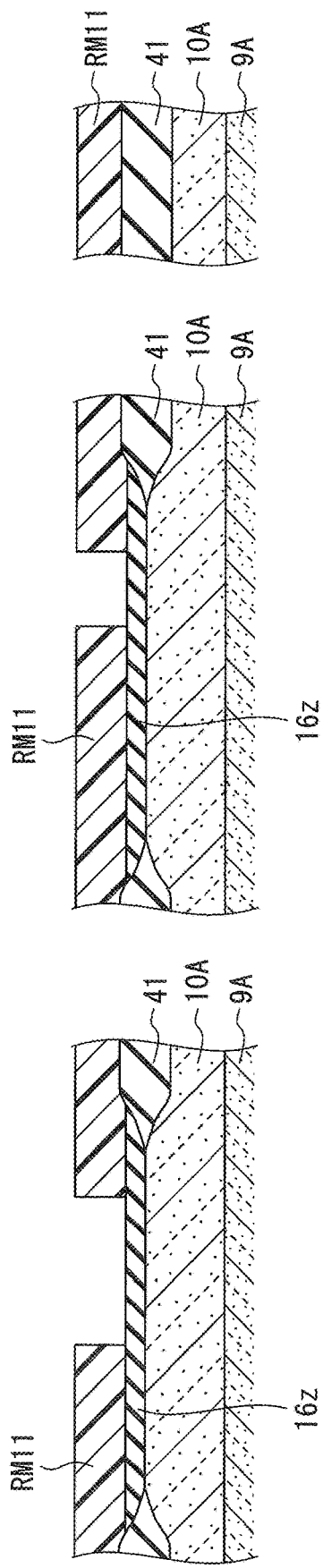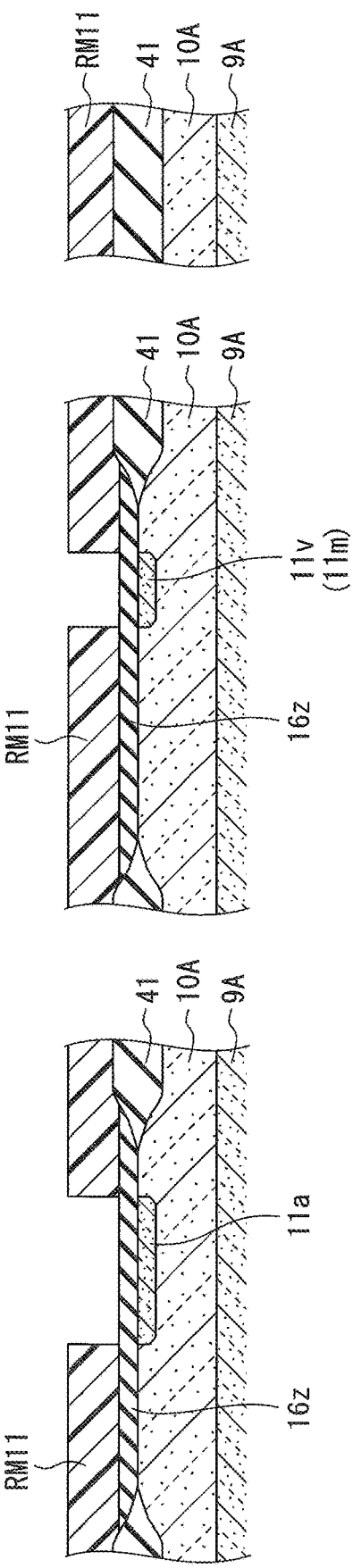

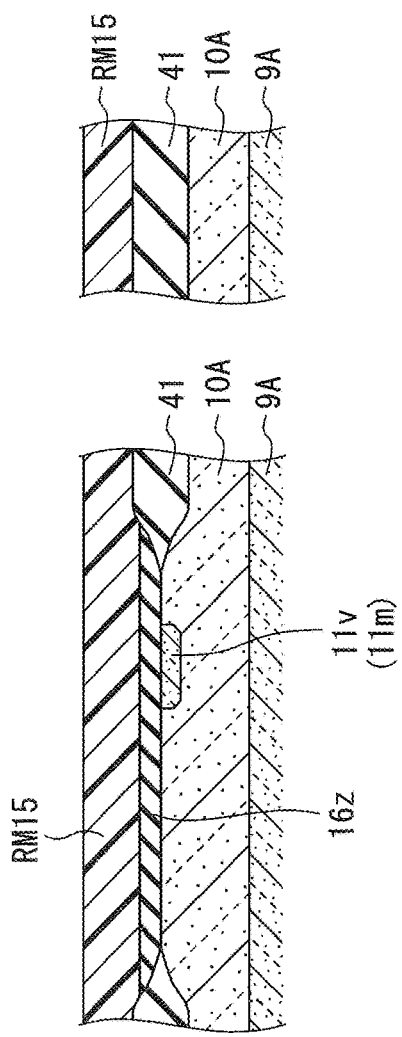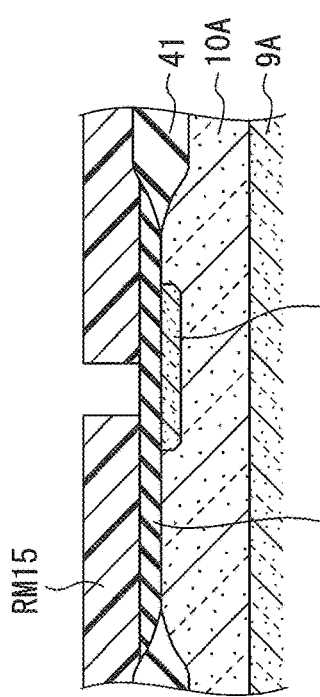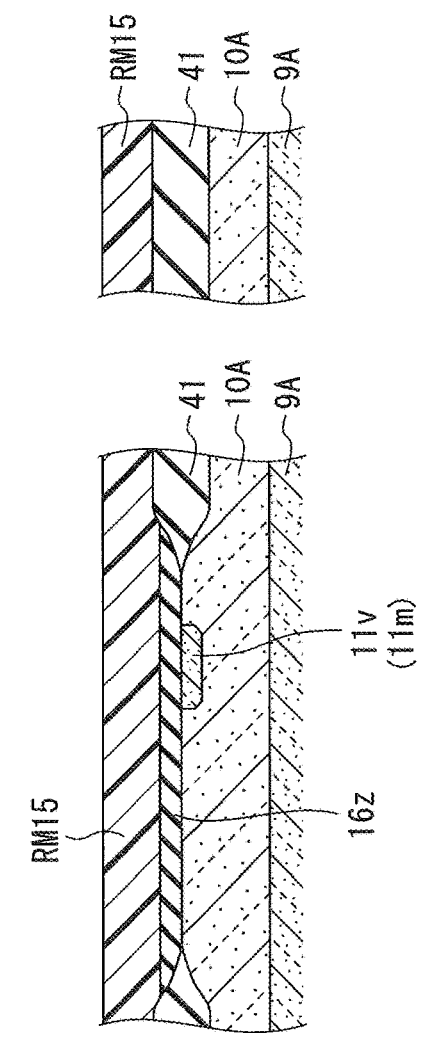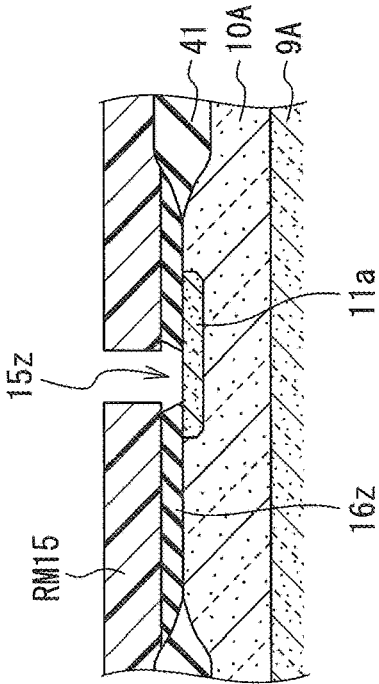

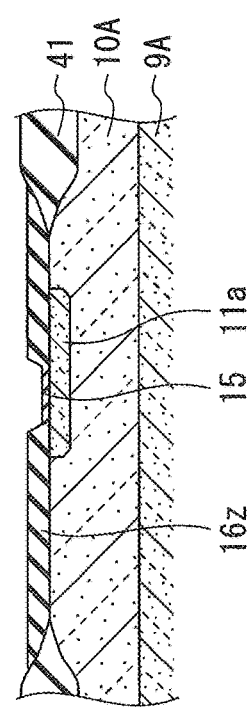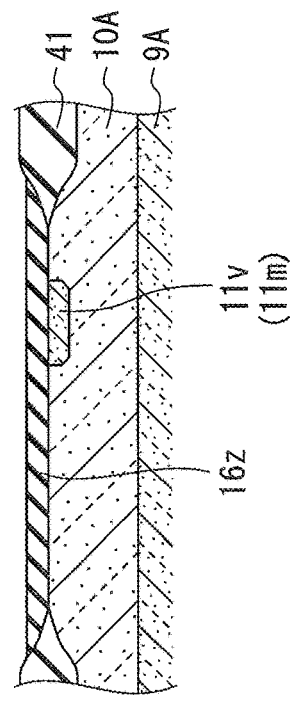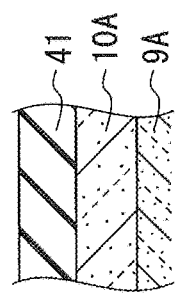

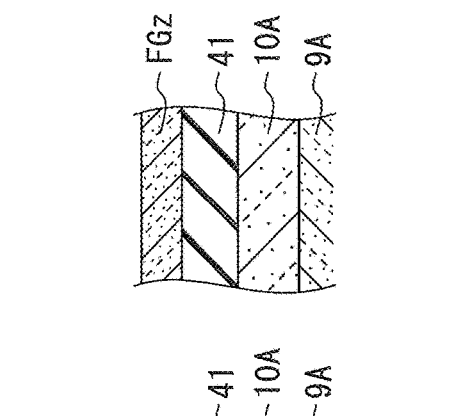
FIG. 14C
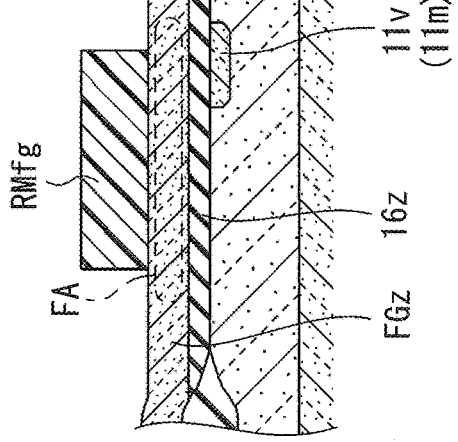
FIG. 14B
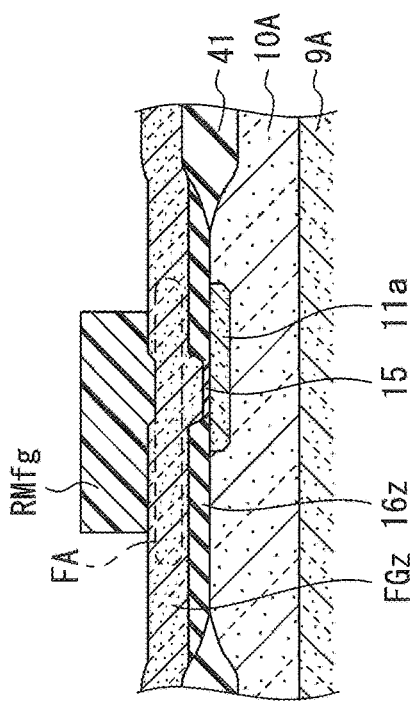
FIG. 14A
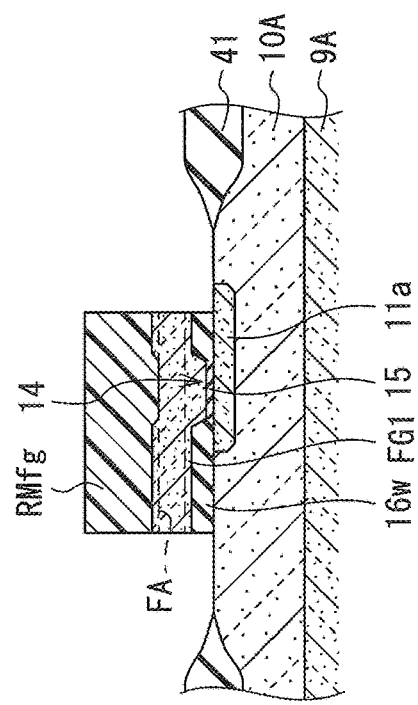
FIG. 14F
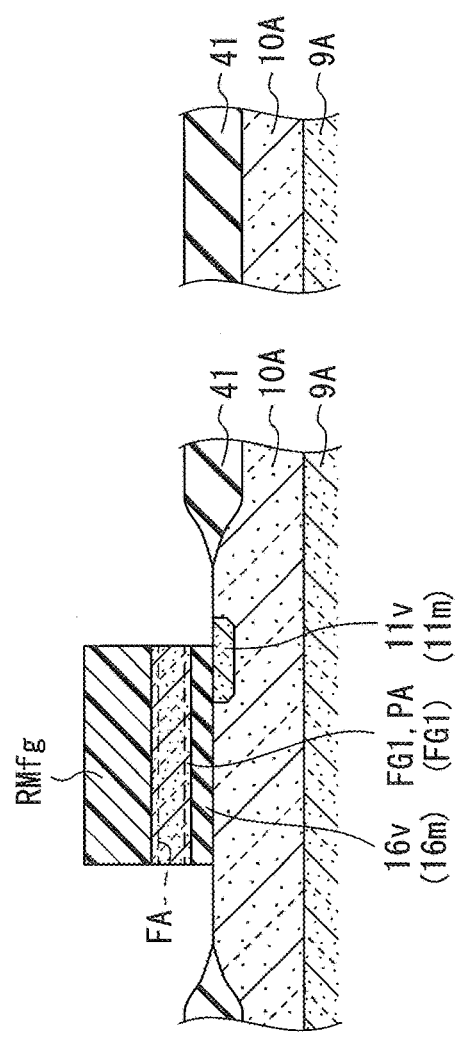
FIG. 14E
FIG. 14D

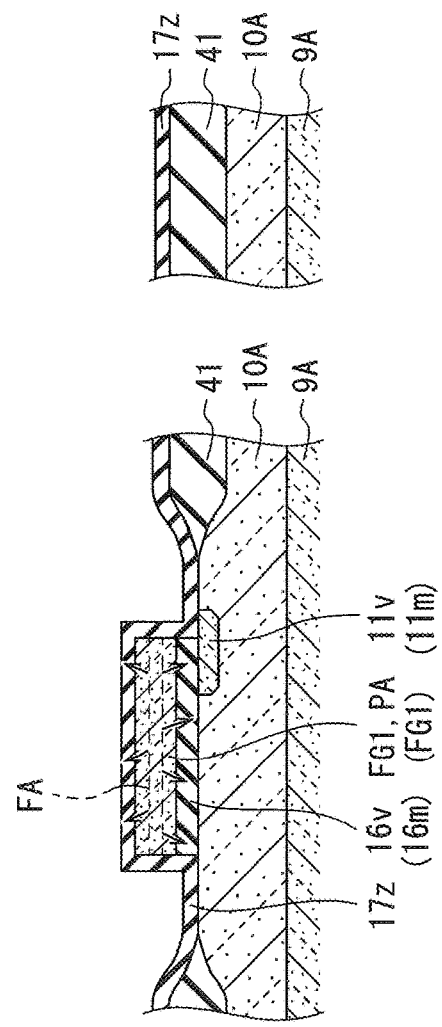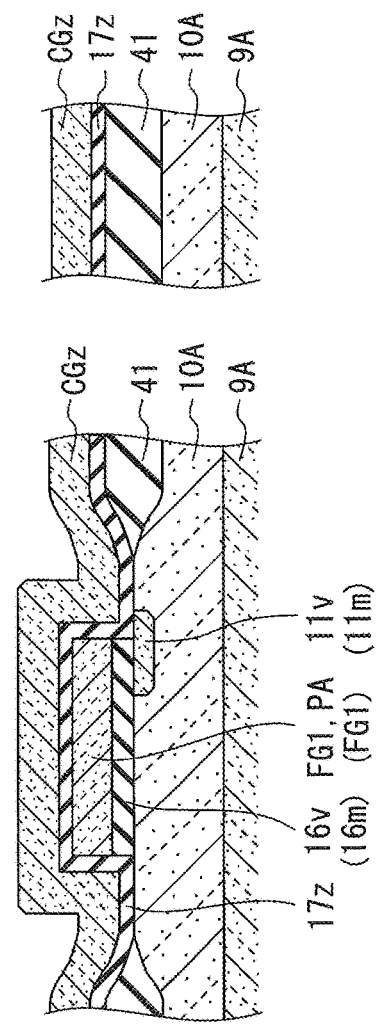

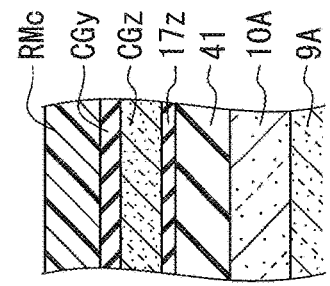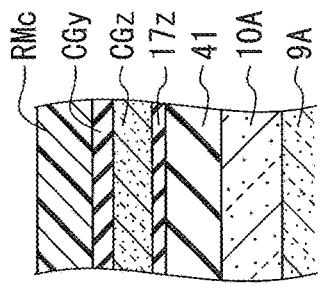
FIG. 16C  FIG. 16F
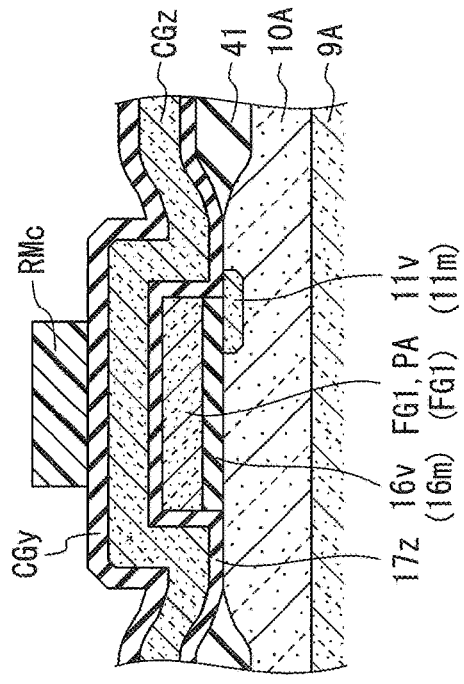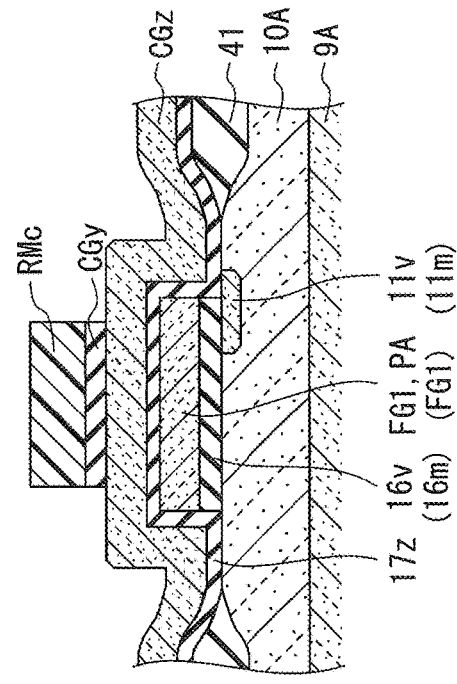
FIG. 16B  FIG. 16E
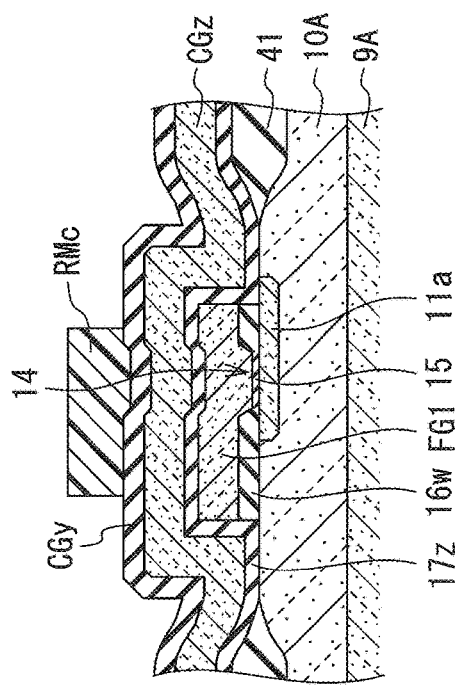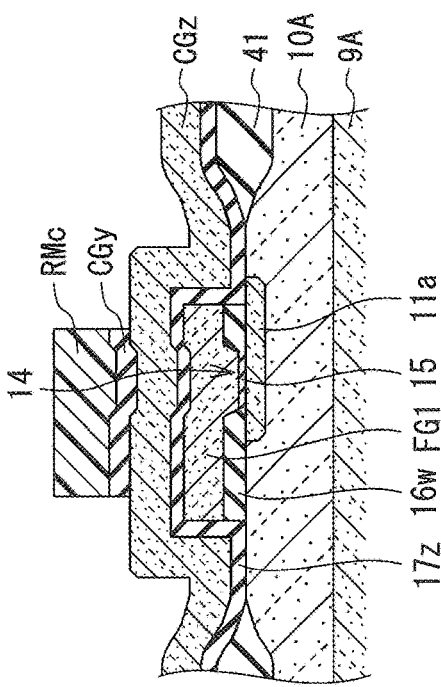
FIG. 16A  FIG. 16D

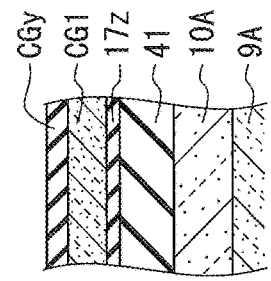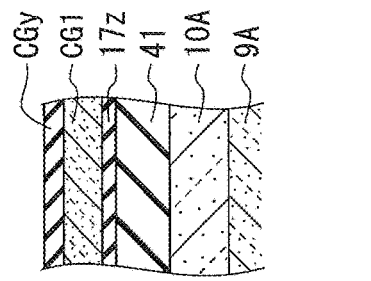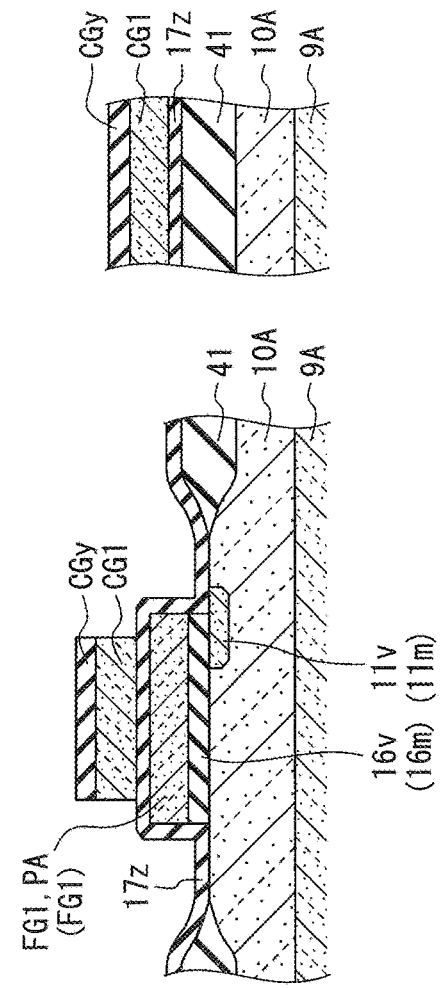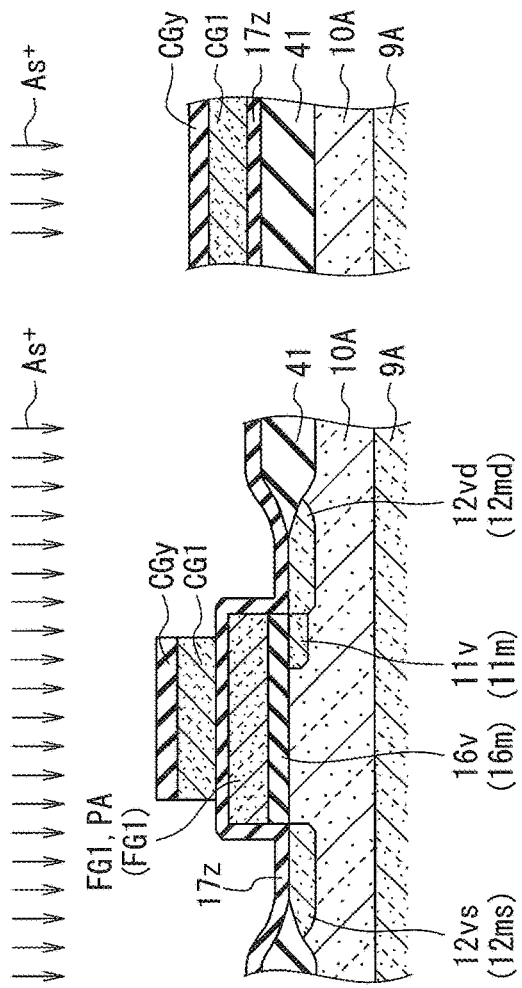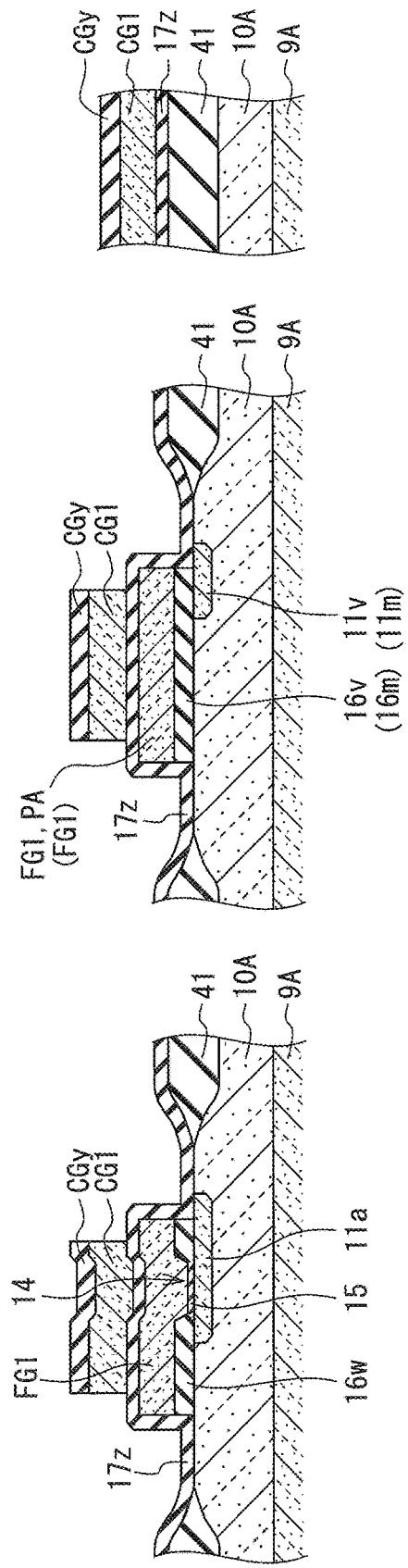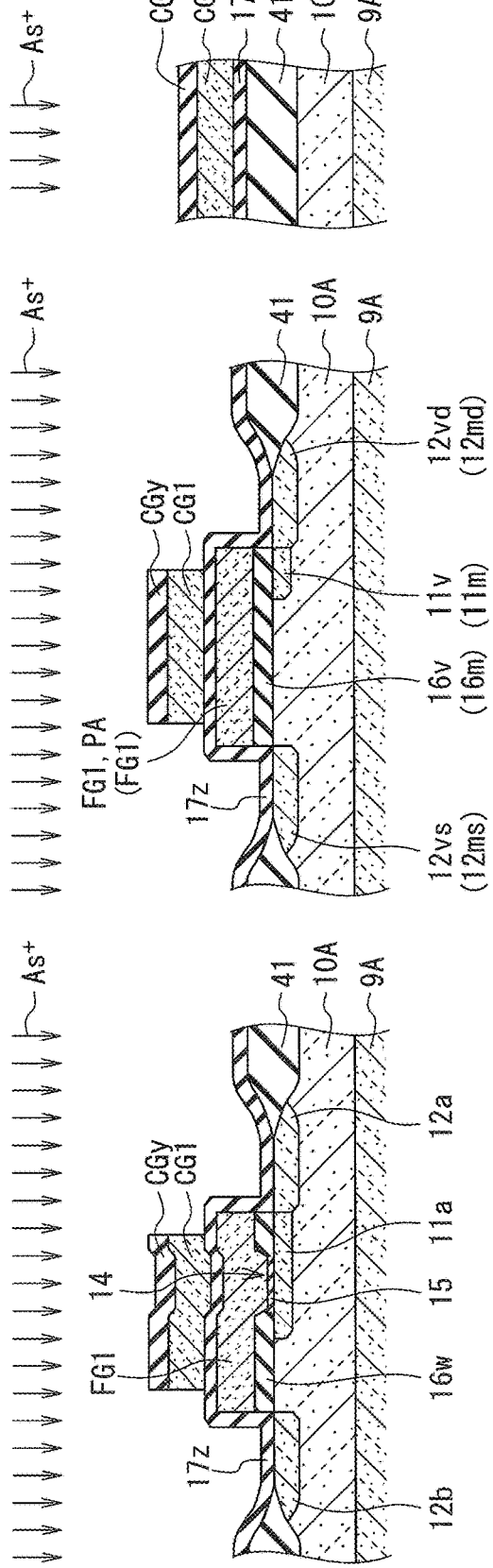

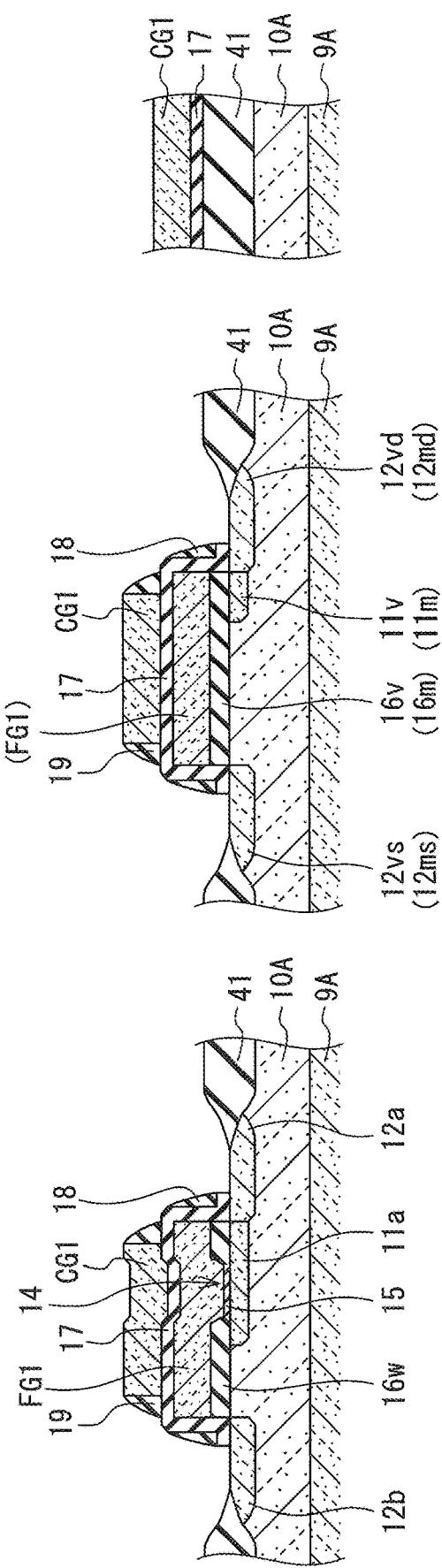

NONVOLATILE STORAGE ELEMENT

BACKGROUND OF THE INVENTION

Field of the Invention

The present invention relates to a nonvolatile storage element.

Description of the Related Art

By the use of a nonvolatile storage element in which a threshold voltage Vth is adjustable in a metal-oxide-semiconductor field effect transistor (MOSFET) configuring an analog circuit, variations in electric characteristics or temperature dependency can be controlled in some cases. For example, PTL 1 has proposed a method for eliminating manufacturing variations in a reference voltage generation circuit by the use of a nonvolatile storage element for an enhancement MOSFET and a depression MOSFET configuring the reference voltage generation circuit.

The nonvolatile storage element achieving such a circuit has a structure provided with a tunnel insulating film, a floating gate, and a control gate. The nonvolatile storage element has a structure referred to as a FLOTOX (Floating Gate Tunneling Oxide) type in which a charge is injected or a charge is extracted by FN (Fowler-Nordheim) tunneling through the tunnel insulating film.

FIGS. 32A and 32B are figures schematically illustrating an example of the structure of a FLOTOX nonvolatile storage element FM in the use for a conventional memory cell array. FIG. 32A is a plan view of the nonvolatile storage element FM. FIG. 32B is a cross-sectional view of the nonvolatile storage element FM cut along the Z-Z line illustrated in FIG. 32A.

As illustrated in FIGS. 32A and 32B, the nonvolatile storage element FM is provided with a semiconductor substrate SB, a gate oxide film GI formed on the semiconductor substrate SB, and a floating gate FG formed on the gate oxide film GI. Moreover, the nonvolatile storage element FM is provided with an insulating film IF formed on the floating gate FG and a control gate CG formed on the insulating film IF. Moreover, the nonvolatile storage element FM is provided with a source diffusion layer SD and a drain diffusion layer DD formed in the semiconductor substrate SB. Apart of the drain diffusion layer DD is disposed below the floating gate FG. Between the floating gate FG and the drain diffusion layer DD, a tunnel oxide film TO is formed.

A voltage is applied to the control gate CG or the drain diffusion layer DD and a charge is injected into the floating gate FG or extracted from the floating gate FG by the FN tunneling through the tunnel oxide film TO. Thus, the nonvolatile storage element FM can control the threshold voltage Vth at which an inversion layer is formed on the semiconductor substrate SB when a voltage is applied to the control gate CG. In the memory cell, a case where a predetermined read voltage is applied to the control gate CG and the threshold voltage Vth exceeds the read voltage (case where the MOSFET is not changed from an OFF state to an ON state) is set to "0". On the other hand, in the memory cell, a case where a predetermined read voltage is applied to the control gate CG and the threshold voltage Vth is less than the read voltage (case where the MOSFET is changed from the OFF state to the ON state) is set to "1". Thus, information can be stored in the memory cell. The memory cell array provided with two or more of such memory cells is laid out in a design rule close to the minimum in a manufacturing process because a high integration is demanded. In the case of the minimum dimension rule of 0.5 µm, the tunnel oxide film TO has a dimension of 0.5 µm×0.5 µm, the floating gate FG has a dimension of 2.6 µm×2.4 µm, and the area ratio of the tunnel oxide film TO to the floating gate FG is 0.04 as an example.

CITATION LIST

Patent Literature

PTL 1: JP 2015-011454 A

SUMMARY OF THE INVENTION

However, when the FLOTOX nonvolatile storage element is used as the MOSFET in an analog circuit, a fluctuation in the threshold voltage Vth directly affects circuit characteristics as compared with a case of being used as a usual memory cell. Therefore, when used in the analog circuit, the allowance of the nonvolatile storage element to the fluctuation in the threshold voltage Vth due to charge leakage from the floating gate (retention degradation) becomes very small as compared with the case of being used in the memory cell.

Moreover, the FLOTOX nonvolatile storage element needs to take the area of the floating gate larger than that in the case of the memory cell array, e.g., 30 $\mu m^2$ or more, in order to obtain a desired current in driving. In this case, the amount of charges to be injected into the floating gate FG increases, and therefore damage on the tunnel oxide film in writing increases. Thus, the FLOTOX nonvolatile storage element has a problem that the fluctuation in the threshold voltage Vth due to charge leakage from the floating gate through a defect generated in the tunnel oxide film (hereinafter sometimes referred to as "first mode retention degradation") is likely to occur.

As a method for solving the problem, it is considered to increase the area of the tunnel oxide film and reduce the amount of charges passing through the tunnel oxide film per unit area thereof to thereby reduce the damage on the tunnel oxide film. However, the FLOTOX nonvolatile storage element has a problem that, when the area of the tunnel oxide film is increased, the occurrence probability of the fluctuation in the threshold voltage Vth due to the fact that the a charge in the floating gate excited by thermal energy jumps over the energy barrier of the tunnel oxide film and leaks (hereinafter sometimes referred to as "second mode retention degradation) becomes high.

It is an object of the present invention to provide a nonvolatile storage element capable of suppressing the retention degradation.

A nonvolatile storage element according to one aspect of the present invention is provided with a semiconductor substrate, a floating gate provided above the semiconductor substrate, a control gate disposed above the floating gate to be insulated from the floating gate, a first region provided in the semiconductor substrate and partially disposed below the floating gate, and a tunnel insulating film at least partially disposed between the floating gate and the first region and having an area ratio to the floating gate of 0.002 or more and 1 or less.

According to one aspect of the present invention, the retention degradation can be suppressed.

BRIEF DESCRIPTION OF THE DRAWINGS

FIGS. 2A to 2C are figures illustrating the schematic configuration of the nonvolatile storage element M1 according to the first embodiment of the present invention, in which FIG. 2A is a cross-sectional view of the nonvolatile storage element M1 cut along the A-A line illustrated in FIG. 1, FIG. 2B is a cross-sectional view of the nonvolatile storage element M1 cut along the B1-B1 line (B2-B2 line) illustrated in FIG. 1, and FIG. 2C is a cross-sectional view of the nonvolatile storage element M1 cut along the C-C line illustrated in FIG. 1.

FIGS. 3A and 3B are figures explaining first mode retention degradation of the nonvolatile storage element M1 according to the first embodiment of the present invention, in which FIG. 3A is a graph illustrating the area ratio of a tunnel insulating film to a floating gate when the ratio of samples having a threshold voltage fluctuation of less than 100 mV is 99.87% or more and FIG. 3B is a graph illustrating the area ratio of the tunnel insulating film to the floating gate when the ratio of samples having a threshold voltage fluctuation of less than 100 mV is 99.997% or more.

FIGS. 4A and 4B are figures explaining second mode retention degradation of the nonvolatile storage element M1 according to the first embodiment of the present invention, in which FIG. 4A is a graph illustrating the area of the tunnel insulating film when the ratio of samples having a threshold voltage fluctuation of less than 100 mV is 99.87% or more and FIG. 4B is a graph illustrating the area of the tunnel insulating film when the ratio of samples having a threshold voltage fluctuation of less than 100 mV is 99.997% or more.

FIGS. 5A and 5B are figures explaining an adaptive region of the area configuration of the floating gate and the tunnel insulating film of the nonvolatile storage element M1 according to the first embodiment of the present invention, in which FIG. 5A is a figure illustrating the adaptive region of the area configuration in which it is expected that 99.87% of the nonvolatile storage elements M1 can secure the life time of ten years or more and FIG. 5B is a figure illustrating the adaptive region of the area configuration in which it is expected that 99.997% of the nonvolatile storage elements M1 can secure the life time of ten years or more.

FIGS. 9A to 9F are cross-sectional views of a manufacturing process (No. 1) of the nonvolatile storage element M1 according to the first embodiment of the present invention.

FIGS. 10A to 10F are cross-sectional views of the manufacturing process (No. 2) of the nonvolatile storage element M1 according to the first embodiment of the present invention.

FIGS. 11A to 11F are cross-sectional views of the manufacturing process (No. 3) of the nonvolatile storage element M1 according to the first embodiment of the present invention.

FIGS. 12A to 12C are cross-sectional views of the manufacturing process (No. 4) of the nonvolatile storage element M1 according to the first embodiment of the present invention.

FIGS. 14A to 14F are cross-sectional views of the manufacturing process (No. 6) of the nonvolatile storage element M1 according to the first embodiment of the present invention.

FIGS. 15A to 15F are cross-sectional views of the manufacturing process (No. 7) of the nonvolatile storage element M1 according to the first embodiment of the present invention.

FIGS. 16A to 16F are cross-sectional views of the manufacturing process (No. 8) of the nonvolatile storage element M1 according to the first embodiment of the present invention.

FIGS. 17A to 17F are cross-sectional views of the manufacturing process (No. 9) of the nonvolatile storage element M1 according to the first embodiment of the present invention.

FIGS. 18A to 18C are cross-sectional views of the manufacturing process (No. 10) of the nonvolatile storage element M1 according to the first embodiment of the present invention.

FIGS. 23A to 23C are figures illustrating the schematic configuration of a nonvolatile storage element M2 according to a second embodiment of the present invention, in which FIG. 23A is a plan view of a principal portion of the nonvolatile storage element M2, FIG. 23B is a cross-sectional view of the nonvolatile storage element M2 cut along the D-D line illustrated in FIG. 23A, and FIG. 23C is a cross-sectional view of the nonvolatile storage element M2 cut along the E-E line illustrated in FIG. 23A.

FIGS. 27A and 27B are figures illustrating the schematic configuration of a nonvolatile storage element M7 according to a third embodiment of the present invention, in which FIG. 27A is a plan view of a principal portion of the nonvolatile storage element M7 and FIG. 27B is a cross-sectional view of the nonvolatile storage element M7 cut along the F-F line illustrated in FIG. 27A.

FIGS. 32A and 32B are figures illustrating the schematic configuration of a conventional nonvolatile storage element FM, in which FIG. 32A is a figure schematically illustrating the plane of the nonvolatile storage element FM and FIG. 32B is a figure schematically illustrating the cross section of nonvolatile storage element FM cut along the Z-Z line illustrated in FIG. 32A.

DESCRIPTION OF THE PREFERRED EMBODIMENTS

Figure 1:
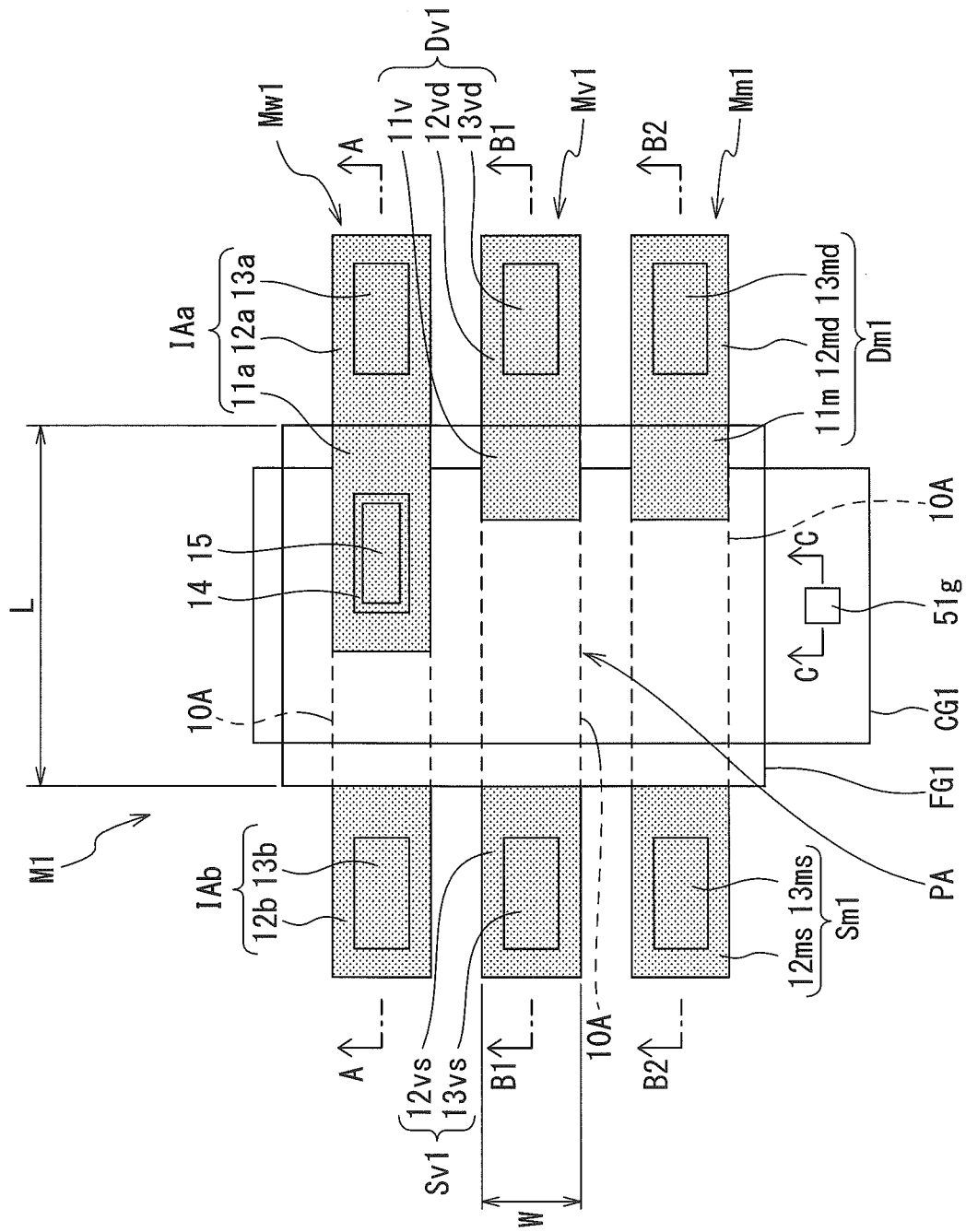
FIG. 1 is a plan view of a principal portion illustrating the schematic configuration of a nonvolatile storage element M1 according to a first embodiment of the present invention.

Next, nonvolatile storage elements according to embodiments of the present invention are described with reference to the drawings.

Hereinafter, a description is given taking type nonvolatile storage element of an N-type MOSFET FLOTOX as an example of the nonvolatile storage elements according to the embodiments. However, the nonvolatile storage element is not limited to this structure and is not limited to the N-type insofar as the nonvolatile storage element is an active element (transistor) having a charge retention region.

First Embodiment

A nonvolatile storage element according to a first embodiment of the present invention is described with reference to FIGS. 1 to 22. First, the schematic configuration of the nonvolatile storage element M1 according to this embodiment is described with reference to FIGS. 1 and 2A to 2C. A driving element Mv1 and a dummy element Mm1 (details thereof are described later) provided in the nonvolatile storage element M1 have the same structure. Therefore, FIG. 2B illustrates both the reference numerals of constituent components of the dummy element Mm1 and the driving element Mv1, in which round brackets are given to the constituent components of the dummy element Mm1 and round brackets are not given to the constituent components of the driving element Mv1. When the same reference numeral is used for the constituent component of each of the driving element Mv1 and the dummy element Mm1, only the reference numeral having no round brackets is given to the constituent component.

As illustrated in FIG. 1, the nonvolatile storage element M1 according to this embodiment is provided with a writing element Mw1, the driving element (an example of a driving MOSFET) Mv1 disposed next to the writing element Mw1, and the dummy element Mm1 disposed next to the driving element Mv1. The nonvolatile storage element M1 is provided with a floating gate FG1 and a control gate CG1 shared by the writing element Mw1, the driving element Mv1, and the dummy element Mm1. Although the details are described later, the nonvolatile storage element M1 is configured so that a charge can be injected into the floating gate FG1 or a charge can be emitted from the floating gate FG1 through a charge inlet 14 provided in the writing element Mw1 by applying a predetermined voltage to a first impurity diffusion region IAa and the control gate CG1 disposed below the floating gate FG1. This makes it possible for the nonvolatile storage element M1 to change a threshold voltage and hold the changed threshold voltage to control variations of electric characteristics or temperature dependency.

The nonvolatile storage element M1 is element-isolated by an element isolation region 41 (see FIGS. 2A to 2C) formed in a P-type semiconductor substrate 9A (see FIGS. 2A to 2C), for example, from another nonvolatile storage element (not illustrated) formed on the same semiconductor substrate 9A.

Figure 2C:
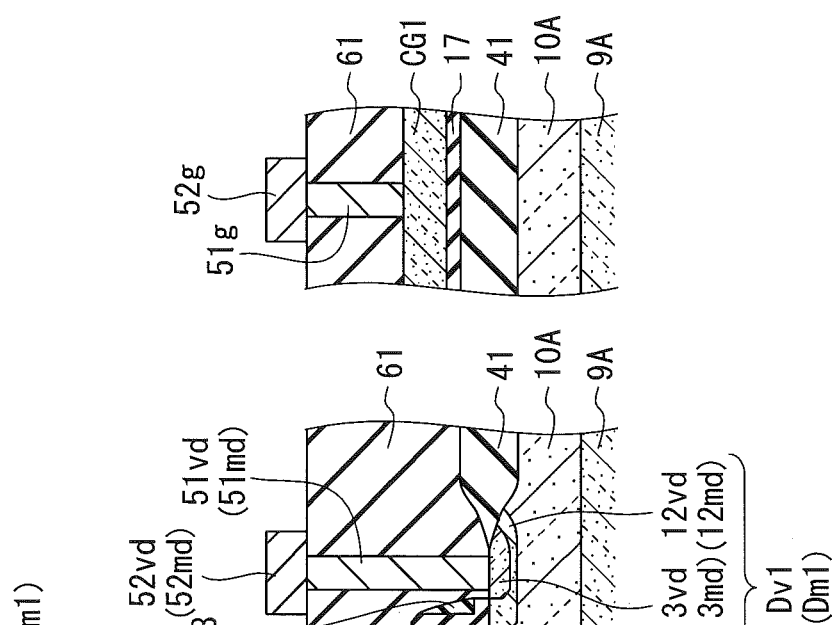
Figure 2B:
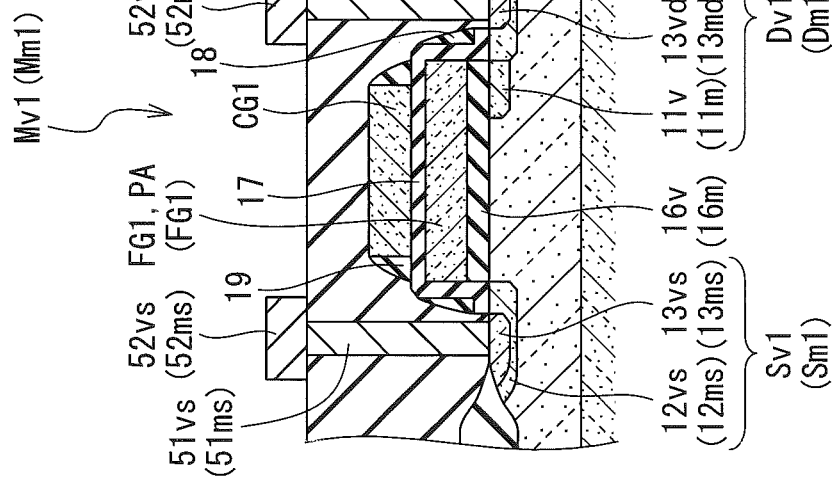
Figure 2A:
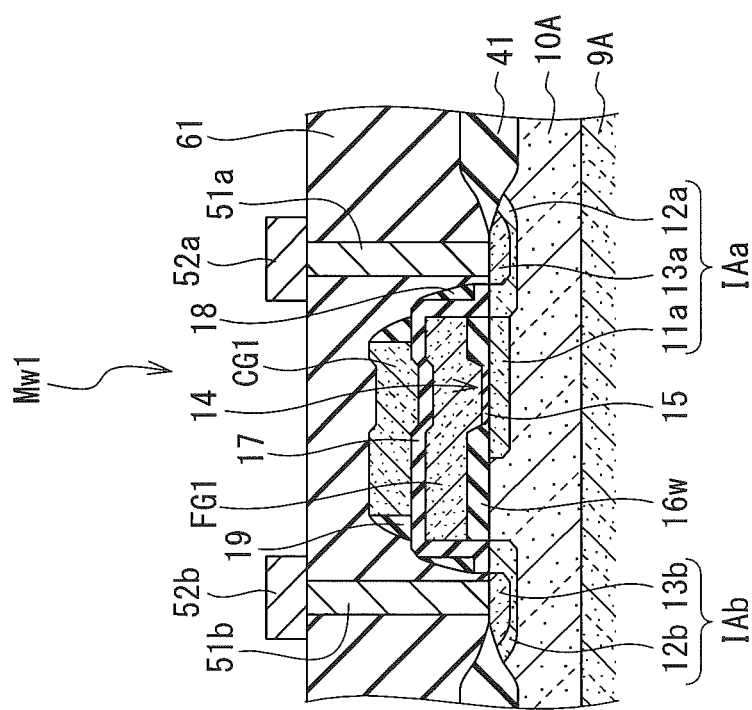

As illustrated in FIG. 2A, the writing element Mw1 provided in the nonvolatile storage element M1 is provided with the semiconductor substrate 9A and a gate insulating film 16w provided on the semiconductor substrate 9A. In the semiconductor substrate 9A, a P-type well (hereinafter abbreviated as "P-well") region 10A is formed. The gate insulating film 16w is made of silicon dioxide ($SiO_2$) and is disposed on the P-well region 10A. The gate insulating film 16w may be made of silicon nitride (SiN) without being limited to the silicon dioxide.

The writing element Mw1 is provided with the floating gate FG1 provided above the semiconductor substrate 9A. A part of the floating gate FG1 is disposed on the gate insulating film 16w. The floating gate FG1 is made of polysilicon.

The writing element Mw1 is provided with the control gate CG1 which is disposed above the floating gate FG1 to be insulated from the floating gate FG1. The control gate CG1 is made of polysilicon, for example.

The writing element Mw1 is provided with the first impurity diffusion region (an example of the first region) IAa provided in the semiconductor substrate 9A and partially disposed below the floating gate FG1 and a second impurity diffusion region IAb provided in the semiconductor substrate 9A. The first impurity diffusion region IAa and the second impurity diffusion region IAb are provided in the P-well region 10A.

As illustrated in FIG. 1, the second impurity diffusion region IAb is formed in a part of the side (one of both sides) of the floating gate FG1 in a plan view of the nonvolatile storage element M1. Herein, the plan view refers to a state where the plane (element formation surface) of the semiconductor substrate 9A on which the floating gate FG1, the control gate CG1, and the like are formed is viewed in an orthogonal direction to element formation surface. As illustrated in FIGS. 1 and 2A, the second impurity diffusion region IAb has an N-type low concentration impurity drain (Lightly Doped Drain, hereinafter abbreviated as "LDD") layer 12b and a contact layer 13b having an impurity concentration higher than that of the LDD layer 12b. The contact layer 13b is provided in the LDD layer 12b. The contact layer 13b is provided in order to take an ohmic contact between the second impurity diffusion region IAb and a plug 51b (see FIG. 2A, details are described later).

As illustrated in FIGS. 1 and 2A, the first impurity diffusion region IAa has a diffusion layer 11a disposed in a part below the floating gate FG1, an N-type LDD layer 12a disposed adjacent to the diffusion layer 11a, and a contact layer 13a having an impurity concentration higher than that of the LDD layer 12a.

As illustrated in FIGS. 1 and 2A, the contact layer 13a is provided in the LDD layer 12a. The contact layer 13a is provided in order to take an ohmic contact between the first impurity diffusion region IAa and a plug 51a (see FIG. 2A, details are described later). As illustrated in FIG. 1, the first impurity diffusion region IAa is formed over a part below the floating gate FG1 and a part of the side (the other side of both sides) of the floating gate FG1 in the plan view of the nonvolatile storage element M1. The diffusion layer 11a is provided in a part below the floating gate FG1 and the LDD layer 12a and the contact layer 13a are provided in a part of the side of the floating gate FG1. The LDD layer 12a and the LDD layer 12b are provided with the floating gate FG1 interposed therebetween in the plan view of the nonvolatile storage element M1.

As illustrated in FIGS. 1 and 2A, the writing element Mw1 is provided with a tunnel insulating film 15 at least partially disposed between the floating gate FG1 and the first impurity diffusion region IAa and having an area ratio to the floating gate FG1 of 0.002 or more and 1 or less. In this embodiment, the entire tunnel insulating film 15 is disposed between the floating gate FG1 and the diffusion layer 11a. As illustrated in FIG. 1, the tunnel insulating film 15 is formed to be smaller than the entire floating gate FG1 in the plan view of the nonvolatile storage element M1. The entire floating gate FG1 has an area of 30 $\mu m^2$ or more in the plan view of the nonvolatile storage element M1. The area of the tunnel insulating film 15 is 0.06 $\mu m^2$ or more and 54 $\mu m^2$ or less in the plan view of the nonvolatile storage element M1. When the area of the entire floating gate FG1 is 30 $\mu m^2$ of the minimum value and the area ratio of the tunnel insulating film 15 to the floating gate FG1 is 0.002 of the minimum value, the area of the tunnel insulating film 15 is 0.06 $\mu m^2$ of the minimum value. Herein, the "entire floating gate FG1" means the floating gate provided in one nonvolatile storage element M1 and does not mean the floating gate in predetermined portions, such as a portion where the writing element Mw1 is provided, a portion where the driving element Mv1 is provided, and a portion where the dummy element Mm1 is provided. Therefore, the "entire floating gate FG1" is distinguished from a "specific region PA of the floating FG1" (details are described later) in the portion where the driving element Mv1 is provided. Hereinafter, the "floating gate FG1" means the "entire floating gate FG1" unless otherwise specified as the "specific region PA of the floating gate FG1". The area of the tunnel insulating film 15 in this embodiment is 25 $\mu m^2$, for example. Therefore, in this embodiment, the ratio of the area of the tunnel insulating film 15 to the area of the floating gate FG1 (area ratio), i.e., a value determined by dividing the area of the tunnel insulating film 15 by the area of the floating gate FG1, is 0.017. Although the details are described later, first mode retention degradation can be improved when the area ratio of the tunnel insulating film 15 to the floating gate FG1 is 0.002 or more.

In order to perform writing of injecting a charge into the floating gate FG1 or extracting a charge from the floating gate FG1 by FN tunneling, the thickness of the tunnel insulating film 15 may be 7 nm or more and 12 nm or less. In this embodiment, the film thickness of the tunnel insulating film 15 is 9.8 nm, for example. When the film thickness of the tunnel insulating film 15 is 7 to 12 nm, direct tunneling of a charge becomes more unlikely to occur and a charge is more easily retained in the floating gate FG1 as compared with the case where the film thickness is less than 7 nm. On the other hand, when the film thickness of the tunnel insulating film 15 is 7 to 12 nm, the injection of a charge into the floating gate FG1 and the extraction of a charge from the floating gate FG1 can be accelerated as compared with the case where the film thickness is larger than 12 nm. The tunnel insulating film 15 may be formed to have a film thickness smaller than that of the gate insulating film 16w. A region of the floating gate FG1 corresponding to the tunnel insulating film 15 serves as the charge inlet 14 injecting a charge into the floating gate FG1 or emitting a charge from the floating gate FG1. More specifically, the floating gate FG1 has the charge inlet 14 for injecting a charge or emitting a charge and functions as a charge retention region.

As illustrated in FIG. 2B, the driving element Mv1 provided in the nonvolatile storage element M1 is provided with the semiconductor substrate 9A and a gate insulating film 16v provided on the semiconductor substrate 9A. The gate insulating film 16v is disposed on the P-well region 10A. Although the details are described later, the gate insulating film 16v is made of the same material as that of the gate insulating film 16w provided in the writing element Mw1.

The gate insulating film 16v in the driving element Mv1 is disposed between the floating gate FG1 in the portion where the driving element Mv1 is provided (i.e., specific region PA) and the semiconductor substrate 9A and has a film thickness larger than that of the tunnel insulating film 15. The gate insulating film 16v in the driving element Mv1 has an almost constant film thickness. No tunnel insulating film is provided in the region where the gate insulating film 16v is formed in the driving element Mv1. Therefore, the surface where the gate insulating film 16v contacts the floating gate FG1 in the driving element Mv1 has a flat shape.

The tunnel insulating film 15 in this embodiment is formed in an opening portion in which an insulating film for forming the gate insulating film 16w is opened. Therefore, the gate insulating film 16w in the writing element Mw1 has a level difference due to an opening portion in the region where the tunnel insulating film 15 is provided. Therefore, the contact surface with the floating gate FG1 is flatter in the gate insulating film 16v in the driving element Mv1 than in the gate insulating film 16w in the writing element Mw1.

The driving element Mv1 is provided with the floating gate FG1 provided above the semiconductor substrate 9A. The floating gate FG1 in the portion where the driving element Mv1 is provided (specific region PA) is continuously formed with the floating gate FG1 in the portion where the writing element Mw1 is provided. A part of the floating gate FG1 is disposed on the gate insulating film 16v. A region on the gate insulating film 16v is equivalent to the specific region PA of the floating gate FG1.

The driving element Mv1 is provided with the control gate CG1 disposed above the floating gate FG1 to be insulated from the floating gate FG1. The control gate CG1 provided in the driving element Mv1 is continuously formed with the control gate CG1 provided in the writing element Mw1.

The driving element Mv1 is provided with a drain region (an example of the second region) Dv1 provided in the semiconductor substrate 9A and formed to be electrically isolated from the first impurity diffusion region IAa. A part of the drain region Dv1 is disposed in a part below the floating gate FG1. The driving element Mv1 is provided with a source region Sv1 provided in the semiconductor substrate 9A. The drain region Dv1 and the source region Sv1 are provided in the P-well region 10A. The drain region Dv1 and the source region Sv1 are defined by the current flowing direction. Therefore, when a direction of passing a current is reversed to a direction of passing a current assumed in the nonvolatile storage element M1 illustrated in FIGS. 1 and 2B, the drain region Dv1 illustrated in FIGS. 1 and 2B serves as the source region Sv1 and the source region Sv1 serves as the drain region Dv1.

As illustrated in FIG. 1, the source region Sv1 is formed in a part of the side (one of both sides) of the floating gate FG1 in the plan view of the nonvolatile storage element M1. As illustrated in FIGS. 1 and 2B, the source region Sv1 has an LDD layer 12vs and a source layer 13vs having an impurity concentration higher than that of the LDD layer 12vs. The source layer 13vs is provided in the LDD layer 12vs. The source layer 13vs is provided in order to take an ohmic contact between the source region Sv1 and a plug 51vs (see FIG. 2B, details are described later).

As illustrated in FIGS. 1 and 2B, the drain region Dv1 has a first drain layer 11v disposed in a part below the floating gate FG1, an N-type LDD layer 12vd disposed adjacent to the first drain layer 11v, and a second drain layer 13vd having an impurity concentration higher than that of the LDD layer 12vd. The second drain layer 13vd is provided in the LDD layer 12vd. The second drain layer 13vd is provided in order to take an ohmic contact between the drain region Dv1 and a plug 51vd (details are described later, see FIG. 2B).

As illustrated in FIG. 1, the drain region Dv is formed over a part below the floating gate FG1 and a part of the side (the other side of both sides) of the floating gate FG1 in the plan view of the nonvolatile storage element M1. The first drain layer 11v is provided in a part below the floating gate FG1. The LDD layer 12vd and the second drain layer 13vd are provided in a part of the side of the floating gate FG1. The LDD layer 12vd and the LDD layer 12vs are provided with the floating gate FG1 interposed therebetween in the plan view of the nonvolatile storage element M1. The first drain layer 11v provided in the driving element Mv1 has a width (length from one of both sides of the floating gate FG1 to the other side thereof) shorter than the width of the diffusion layer 11a provided in the writing element Mw1.

As illustrated in FIG. 2B, the dummy element Mm1 provided in the nonvolatile storage element M1 is provided with the semiconductor substrate 9A and a gate insulating film 16m provided on the semiconductor substrate 9A. The gate insulating film 16m is disposed on the P-well region 10A. Although the details are described later, the gate insulating film 16m is made of the same material as that of the gate insulating film 16w provided in the writing element Mw1 and the gate insulating film 16v provided in the driving element Mv1.

The gate insulating film 16m in the dummy element Mm1 is disposed between the floating gate FG1 in the portion where the dummy element Mm1 is provided and the semiconductor substrate 9A and has a film thickness larger than that of the tunnel insulating film 15. The gate insulating film 16m in the dummy element Mm1 has an almost constant film thickness. No tunnel insulating film is provided in the region where the gate insulating film 16m is formed in the dummy element Mm1. Therefore, the surface where the gate insulating film 16m contacts the floating gate FG1 in the dummy element Mm1 has a flat shape. Since the gate insulating film 16m in the dummy element Mm1 does not have a level difference for forming a tunnel insulating film, the contact surface with the floating gate FG1 is flatter in the gate insulating film 16m than in the gate insulating film 16w in the writing element Mw1.

The dummy element Mm1 is provided with the floating gate FG1 provided above the semiconductor substrate 9A. The floating gate FG1 in the portion where the dummy element Mm1 is provided is continuously formed with the floating gate FG1 in the portion where the writing element Mw1 is provided and the floating gate FG1 in the portion (specific region PA) where the driving element Mv1 is provided. A part of the floating gate FG1 is disposed on the gate insulating film 16m.

The dummy element Mm1 is provided with the control gate CG1 disposed above the floating gate FG1 to be insulated from the floating gate FG1. The control gate CG1 provided in the dummy element Mm1 is continuously formed with the control gate CG1 provided in the writing element Mw1 and the control gate CG1 provided in the driving element Mv1.

The dummy element Mm1 is provided with a drain region Dm1 provided in the semiconductor substrate 9A and formed to be electrically isolated from the first impurity diffusion region IAa. A part of the drain region Dm1 is disposed in a part below the floating gate FG1. The dummy element Mm1 is provided with a source region Sm1 provided in the semiconductor substrate 9A. The drain region Dm1 and the source region Sm1 are provided in the P-well region 10A. The drain region Dm1 and the source region Sm1 are defined by a current flowing direction. Therefore, when a direction of passing a current is reversed to a direction of passing a current assumed in the nonvolatile storage element M1 illustrated in FIGS. 1 and 2B, the drain region Dm1 illustrated in FIGS. 1 and 2B serves as the source region Sm1 and the source region Sm1 serves as the drain region Dm1.

As illustrated in FIG. 1, the source region Sm1 is provided in a part of the side (one of both sides) of the floating gate FG1 in the plan view of the nonvolatile storage element M1. As illustrated in FIGS. 1 and 2B, the source region Sm1 has an LDD layer 12ms and a source layer 13ms having an impurity concentration higher than that of the LDD layer 12ms. The source layer 13ms is provided in the LDD layer 12ms. The source layer 13ms is provided in order to take an ohmic contact between the source region Sm1 and a plug 51*ms* (see FIG. 2B, details are described later.).

As illustrated in FIGS. 1 and 2B, the drain region Dm1 has a first drain layer 11*m* disposed in a part below the floating gate FG1, an N-type LDD layer 12*md* disposed adjacent to the first drain layer 11*m*, and a second drain layer 13*md* having an impurity concentration higher than that of the LDD layer 12*md*. The second drain layer 13*md* is provided in the LDD layer 12*md*. The second drain layer 13*md* is provided in order to take an ohmic contact between the drain region Dm1 and a plug 51*md* (details are described later, see FIG. 2B).

As illustrated in FIG. 1, the drain region Dm1 is formed over a part below the floating gate FG1 and a part of the side (the other side of both sides) of the floating gate FG1 in the plan view of the nonvolatile storage element M1. The first drain layer 11*m* is provided in a part below the floating gate FG1. The LDD layer 12*md* and the second drain layer 13*md* are provided in a part of the side of the floating gate FG1. The LDD layer 12*md* and the LDD layer 12*ms* are provided with the floating gate FG1 interposed therebetween in the plan view of the nonvolatile storage element M1. The first drain layer 11*m* provided in the dummy element Mm1 has a width (length from one of both sides of the floating gate FG1 to the other side thereof) shorter than the width of the diffusion layer 11*a* provided in the writing element Mw1. The first drain layer 11*m* provided in the dummy element Mm1 has the same width (length from one of both sides of the floating gate FG1 to the other side thereof) as that of the first drain layer 11*v* provided in the driving element Mv1.

The floating gate FG1 in the portion where the writing element Mw1 is provided, the floating gate FG1 in the portion (specific region PA) where the driving element Mv1 is provided, and the floating gate FG1 in the portion where the dummy element Mm1 is provided are shared. The floating gate FG1 has an area of 30 $\mu m^2$ or more and 27000 $\mu m^2$ or less in the plan view of the nonvolatile storage element M1. The lower limit value (30 $\mu m^2$ in this embodiment) of the area of the floating gate FG1 is specified for differentiation from a case where a nonvolatile storage element is used as a memory storing digital data. The area of the floating gate FG1 in this embodiment is 1422 $\mu m^2$, for example, in the plan view of the nonvolatile storage element M1. The floating gate FG1 in this embodiment has a rectangular shape in which the long side extends in a direction where the writing element Mw1, the driving element Mv1, and the dummy element Mm1 are arranged in the plan view of the nonvolatile storage element M1. The floating gate FG1 may have the other shapes without being limited to the rectangular shape.

The control gate CG1 in the portion where the writing element Mw1 is provided, the control gate CG1 in the portion where the driving element Mv1 is provided, and the control gate CG1 in the portion where the dummy element Mm1 is provided are shared. The control gate CG1 has a rectangular shape in which the long side extends in a direction where the writing element Mw1, the driving element Mv1, and the dummy element Mm1 are arranged in the plan view of the nonvolatile storage element M1. The control gate CG1 has a long side longer than that of the floating gate FG1 and has a short side shorter than that of the floating gate FG1 in the plan view of the nonvolatile storage element M1. Therefore, the control gate CG1 has a region not overlapping with the floating gate FG1 on the sides of both the short sides. The control gate CG1 may have the other shapes insofar as at least part thereof is disposed on the floating gate FG1 without being limited to the rectangular shape.

As illustrated in FIGS. 2A to 2C, the nonvolatile storage element M1 is provided with an insulating film 17 disposed on the floating gate FG1 and a sidewall 18 (see FIGS. 2A and 2B) formed around the insulating film 17. The control gate CG1 is formed on the insulating film 17. The floating gate FG1 and the control gate CG1 are insulated by the insulating film 17. The insulating film 17 is configured combining a silicon oxide film and a silicon nitriding film and has an oxide/nitride/oxide (ONO) structure. The insulating film 17 is provided covering the upper surface and the side surface of the floating gate FG1 and the side surfaces of the gate insulating films 16*w*, 16*v*, and 16*m*. The insulating film 17 is disposed covering the floating gate FG1 over the writing element Mw1, the driving element Mv1, and the dummy element Mm1. The sidewall 18 is disposed surrounding the insulating film 17 in a level difference portion of the lateral wall of the insulating film 17 over the writing element Mw1, the driving element Mv1, and the dummy element Mm1. Therefore, the writing element Mw1, the driving element Mv1, and the dummy element Mm1 each have the insulating film 17 and the sidewall 18.

The nonvolatile storage element M1 has halogen (for example, fluorine) distributing in at least part of the tunnel insulating film 15, the gate insulating films 16*w*, 16*v*, and 16*m*, and the insulating film 17. In this embodiment, halogen is contained in all of the tunnel insulating film 15, the gate insulating films 16*w*, 16*v*, and 16*m*, and the insulating film 17. Due to the fact that the tunnel insulating film 15 contains halogen (for example, fluorine), the defect density of the tunnel insulating film 15 decreases.

As illustrated in FIGS. 2A and 2B, the nonvolatile storage element M1 is provided with a sidewall 19 formed around the control gate CG1. The sidewall 19 is disposed surrounding the lateral wall of the control gate CG1 over the writing element Mw1, the driving element Mv1, and the dummy element Mm1. Therefore, the writing element Mw1, the driving element Mv1, and the dummy element Mm1 each have the sidewall 19.

The nonvolatile storage element M1 is provided with the control gate CG1 and an interlayer insulating film 61 formed on the element formation surface of the semiconductor substrate 9A. The interlayer insulating film 61 is formed at least in regions where the insulating film 17, the sidewalls 18 and 19, the first impurity diffusion region IAa, the second impurity diffusion region IAb, the drain region Dv1 and Dm1, the source region Sv1 and Sm1, and the element isolation region 41 are provided. The interlayer insulating film 61 exhibits a function as a protective film protecting the control gate CG1, the first impurity diffusion region IAa, the second impurity diffusion region IAb, the drain regions Dv1 and Dm1, the source regions Sv1 and Sm1, and the like.

As illustrated in FIGS. 1 and 2C, the nonvolatile storage element M1 has a plug 51*g* embedded in an opening portion exposing a part of the control gate CG1 to the bottom surface and formed in the interlayer insulating film 61 and a metal wiring line 52 *g* (not illustrated in FIG. 1) electrically connected to the plug 51*g* and formed on the interlayer insulating film 61. The plug 51*g* is provided in a region where the control gate CG1 does not overlap with the floating gate FG1. The metal wiring line 52*g* and the control gate CG1 are electrically connected through the plug 51*g*. This makes it possible to apply a voltage of a predetermined level to the control gate CG1 from the metal wiring line 52*g* through the plug 51*g*.

As illustrated in FIG. 2B, the driving element Mv1 is provided with the plug 51vd embedded in an opening portion exposing a part of the second drain layer 13vd to the bottom surface and formed in the interlayer insulating film 61 and a metal wiring line 52vd electrically connected to the plug 51vd and formed on the interlayer insulating film 61. The metal wiring line 52vd and the drain region Dv1 are electrically connected through the plug 51vd. This makes it possible to apply a voltage of a predetermined level to the drain region Dv1 from the metal wiring line 52nd through the plug 51vd.

The driving element Mv1 is provided with the plug 51vs embedded in an opening portion exposing a part of the source layer 13vs to the bottom surface and formed in the interlayer insulating film 61 and a metal wiring line 52vs electrically connected to the plug 51vs and formed on the interlayer insulating film 61. The metal wiring line 52vs and the source region Sv1 are electrically connected through the plug 51vs. This makes it possible to apply a voltage of a predetermined level to the source region Sv1 from the metal wiring line 52vs through the plug 51vs.

As illustrated in FIG. 2B, the dummy element Mm1 is provided with a plug 51md embedded in an opening portion exposing a part of the second drain layer 13md to the bottom surface and formed in the interlayer insulating film 61 and a metal wiring line 52md electrically connected to the plug 51md and formed on the interlayer insulating film 61. The metal wiring line 52md and the drain region Dm1 are electrically connected through the plug 51md. This makes it possible to apply a voltage of a predetermined level to the drain region Dm1 from the metal wiring line 52md through the plug 51md.

The dummy element Mm1 is provided with a plug 51ms embedded in an opening portion exposing a part of the source layer 13ms to the bottom surface and formed in the interlayer insulating film 61 and a metal wiring line 52ms electrically connected to the plug 51ms and formed on the interlayer insulating film 61. The metal wiring line 52ms and the source region Sm1 are electrically connected through the plug 51ms. This makes it possible to apply a voltage of a predetermined level to the source region Sm1 from the metal wiring line 52ms through the plug 51ms.

As illustrated in FIG. 2A, the writing element Mw1 is provided with a plug 51a embedded in an opening portion exposing a part of the contact layer 13a to the bottom surface and formed in the interlayer insulating film 61 and a metal wiring line 52a electrically connected to the plug 51a and formed on the interlayer insulating film 61. The metal wiring line 52a and the first impurity diffusion region IAa are electrically connected through the plug 51a. This makes it possible to apply a voltage of a predetermined level to the first impurity diffusion region IAa from the metal wiring line 52a through the plug 51a.

The writing element Mw1 is provided with a plug 51b embedded in an opening portion exposing a part of the contact layer 13b to the bottom surface and formed in the interlayer insulating film 61 and a metal wiring line 52b electrically connected to the plug 51b and formed on the interlayer insulating film 61. The metal wiring line 52b and the second impurity diffusion region IAb are electrically connected through the plug 51b. This makes it possible to apply a voltage of a predetermined level to the second impurity diffusion region IAb from the metal wiring line 52b through the plug 51b.

As illustrated in FIG. 2B, the driving element Mv1 configures a MOSFET. The nonvolatile storage element M1 is configured to operate with the other circuits by causing the driving element Mv1 to function as a MOSFET. More specifically, when the nonvolatile storage element M1 operates with the other circuits, a current path is formed in the drain region Dv1 and the source region Sv1 of the driving element Mv1.

On the other hand, as illustrated in FIG. 2A, the writing element Mw1 has the plug 51a and the metal wiring line 52a electrically connected to the first impurity diffusion region IAa and has the plug 51b and the metal wiring line 52b electrically connected to the second impurity diffusion region IAb. While a predetermined voltage is applied to the metal wiring line 52a, the metal wiring line 52b is brought into an open state. Therefore, the second impurity diffusion region IAb is in the floating state and the writing element Mw1 does not configure a MOSFET. The writing element Mw1 functions as a voltage application element in the writing of injecting a charge into the floating gate FG2 or emitting a charge from the floating gate FG2 using the first impurity diffusion region IAa. More specifically, the first impurity diffusion region IAa functions as a writing voltage application region and the drain region Dv1 functions as a drain region of the driving MOSFET.

As illustrated in FIG. 2B, the dummy element Mm1 configures a MOSFET. The dummy element Mm1 may function as a MOSFET and may be used as an element operating with the other circuits together with the driving element Mv1. The dummy element Mm1 may be used as an alternative element for a damaged driving element Mv1. More specifically, a current path is formed in the drain region Dm1 and the source region Sm1 of the dummy element Mm1 as necessary when the nonvolatile storage element M1 operates with the other circuits. Therefore, the drain region Dm1 functions as a drain region of the driving MOSFET in some cases.

Next, a method for adjusting the threshold voltage Vth of the nonvolatile storage element M1 is described.

For example, when 19 V is applied to the control gate CG1 and 0 V is applied to the first impurity diffusion region IAa, an electron is injected into the floating gate FG1 through the tunnel insulating film 15, and then the floating gate FG1 is brought into a negatively charged state. In this state, the floating gate FG1 acts in a direction of suppressing an electric field applied to the gate insulating films 16v and 16m when a positive bias is applied to the control gate CG1. Therefore, the threshold voltage Vth increases in the driving element Mv1 and the dummy element Mm1 of the nonvolatile storage element M1 and the driving element Mv1 and the dummy element Mm1 function as enhancement type MOSFETs.

On the other hand, when 0 V is applied to the control gate CG1 and 19 V is applied to the drain region D1, for example, an electron is extracted from the floating gate FG1 through the tunnel insulating film 15, and then the floating gate FG1 is brought into a positively charged state. In this state, the floating gate FG1 acts in a direction of intensifying an electric field applied to the gate insulating films 16v and 16m when a positive bias is applied to the control gate CG1. Therefore, the threshold voltage Vth decreases in the driving element Mv1 and the dummy element Mm1 of the nonvolatile storage element M1 and the driving element Mv1 and the dummy element Mm1 function as depression type MOSFETs. Thus, the threshold voltage Vth of the nonvolatile storage element M1 can be adjusted to a desired value by controlling the injection of a charge into the floating gate FG1 or the extraction of a charge from the floating gate FG1.

Next, a threshold voltage Vth fluctuation (retention degradation) due to charge leakage from a floating gate is described. Hereinafter, the retention degradation is described mainly taking a phenomenon that an electron inside the floating gate leaks to the outside of the floating gate as an example. The retention degradation similarly occurs also in the case of a phenomenon that an electron is injected into the inside of the floating gate from the outside of the floating gate (substantially, a phenomenon that a hole inside the floating gate leaks to the outside of the floating gate).

The retention degradation includes two modes of first mode retention degradation and second mode retention degradation. The first mode retention degradation is a threshold voltage Vth fluctuation caused by the leakage of a charge from the floating gate through a defect generated in a tunnel insulating film. The defect in the tunnel insulating film is generated due to the fact that the tunnel insulating film is damaged by a charge passing in injecting a charge into the floating gate (in writing). The second retention degradation is a threshold voltage Vth fluctuation occurring caused by the fact that an electron in the floating gate excited by thermal energy jumps over the energy barrier of the tunnel insulating film and leaks.

First, the first mode retention degradation is described. The first mode retention degradation is a phenomenon that a charge leakages from the floating gate through a defect in the tunnel insulating film. Therefore, the degree of the first mode retention degradation is dependent on the defect density in the tunnel insulating film. The defect in the tunnel insulating film is generated in the charge injection into the floating gate (in writing). Furthermore, the first mode retention degradation has a feature that the temperature dependency is low. According to the mechanism described above, the amount of charges passing through the tunnel insulating film in the writing may be reduced in order to suppress the first mode retention degradation. When the threshold voltage Vth of the nonvolatile storage element is adjusted to a certain specific value, the total amount of charges injected into the floating gate depends on the area of the floating gate and becomes larger when the area is larger. On the other hand, a charge moves through a region where the tunnel insulating film is formed. Therefore, the amount of charges passing through the tunnel insulating film per unit area thereof becomes smaller when the area of the tunnel insulating film is larger. Therefore, the generation of the defect in the tunnel insulating film is further suppressed when the ratio of the area of the tunnel insulating film to the area of the floating gate is larger.

Figure 3A:
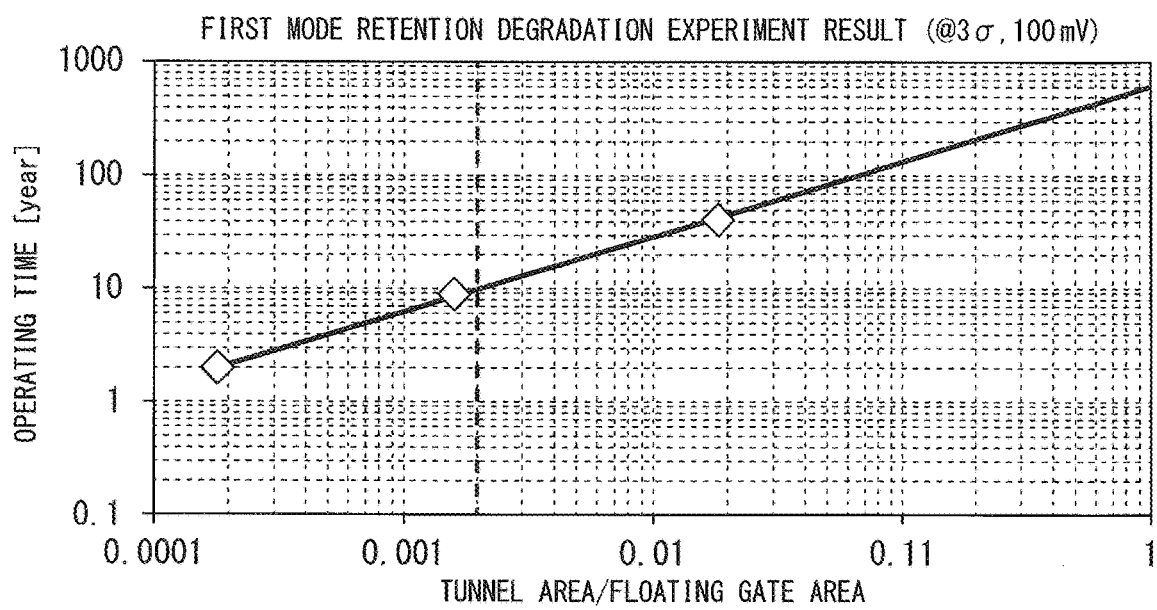
Figure 3B:
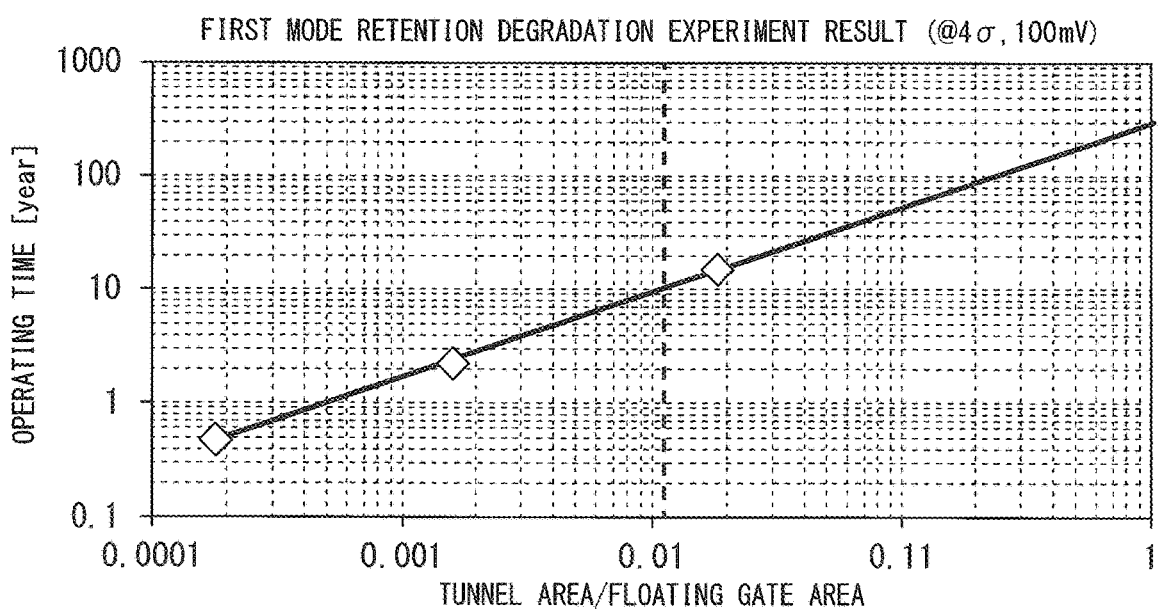

FIGS. 3A and 3B are graphs illustrating the experiment results of the area ratio of the tunnel insulating film to the floating gate and the fluctuation life time of the threshold voltage Vth due to the first mode retention degradation at room temperature. This experiment is an accelerated test of adjusting the threshold voltage Vth of nonvolatile storage elements different in the area ratio of the tunnel insulating film to the floating gate to a predetermined threshold voltage Vth, and then measuring the fluctuation life time of the threshold voltage Vth after allowed to stand for predetermined time. For this experiment, measurement samples of nonvolatile storage elements having the same structure as that of the nonvolatile storage element M1 illustrated in FIGS. 1 and 2A to 2C were used. As the measurement samples, three kinds of nonvolatile storage elements of a nonvolatile storage element A having an area ratio of a tunnel insulating film to a floating gate of 0.000176, a nonvolatile storage element B having the area ratio of 0.001582, and a nonvolatile storage element C having the area ratio of 0.017721 were used. 4000 nonvolatile storage elements A were prepared and allowed to stand under a 27° C. atmosphere. When 168 hours, 500 hours, and 1000 hours passed after allowed to stand, the threshold voltage Vth of each of the 4000 nonvolatile storage elements A was measured, and then the fluctuation amounts of the threshold voltages Vth at each of the standing time were calculated. The nonvolatile storage elements B and C were similarly measured for the threshold voltage Vth at each of the three standing time above using 4000 measurement samples for each of the nonvolatile storage elements B and C, and then the fluctuation amounts of the threshold voltages Vth before and after the standing were calculated.

"Tunnel area/Floating gate area" of the horizontal axis of each of the graphs illustrated in FIGS. 3A and 3B represents the area ratio of the tunnel insulating film to the floating gate. In this experiment, the area ratio of the tunnel insulating film to the floating gate is adjusted by fixing the area of the floating gate and changing the area of the tunnel insulating film. "Operating time [year]" of the vertical axis of each of the graphs illustrated in FIGS. 3A and 3B represents a converted value of the operating time of each nonvolatile storage element based on the time dependency (dependency on each standing time (168 hours, 500 hours, and 1000 hours)) of the threshold voltage Vth in each nonvolatile storage element. The ◇ marks in the graph illustrated in FIG. 3A indicate the operating time in which the ratio of the measurement samples having a threshold voltage Vth fluctuation of less than 100 mV is 99.87% (equivalent to 3 σ on one side) of all the measurement samples used for the experiment for each of the nonvolatile storage elements A, B, and C. The left ◇ mark indicates the time dependency of the threshold voltage Vth of the nonvolatile storage element A, the center ◇ mark indicates the time dependency of the threshold voltage Vth of the nonvolatile storage element B, and the right ◇ mark indicates the time dependency of the threshold voltage Vth of the nonvolatile storage element C. The straight line connecting the ◇ marks in the graph illustrated in FIG. 3A is an approximate straight line based on the operating time. The ◇ marks in the graph illustrated in FIG. 3B indicate the operating time in which the ratio of the measurement samples having a threshold voltage Vth fluctuation of less than 100 mV is 99.997% (equivalent to 4 σ on one side) of all the measurement samples used for the experiment for each of the nonvolatile storage elements A, B, and C. The left ◇ mark indicates the time dependency of the threshold voltage Vth of the nonvolatile storage element A, the center ◇ mark indicates the time dependency of the threshold voltage Vth of the nonvolatile storage element B, and the right ◇ mark indicates the time dependency of the threshold voltage Vth of the nonvolatile storage element C. The straight line connecting the ◇ marks in the graph illustrated in FIG. 3B is an approximate straight line based on the operating time.

Herein, the operating time in which the threshold voltage Vth of the nonvolatile storage element fluctuates by 100 mV is defined as the life time. As indicated by the dashed straight line in FIG. 3A, it is found that the area ratio of the tunnel insulating film to the floating gate needs to be 0.002 or more in order for 99.87% of all the measurement samples (equivalent to 3 σ on one side) to secure the life time of ten years or more. As indicated by the dashed straight line in FIG. 3B, it is found that the area ratio of the tunnel insulating film to the floating gate needs to be 0.011 or more in order for 99.997% of all the measurement samples (equivalent to 4 σ on one side) to secure the life time of ten years or more. Thus, the nonvolatile storage element may have a floating gate and a tunnel insulating film in which the area ratio of the tunnel insulating film to the floating gate is 0.002 or more. When the area ratio of the tunnel insulating film to the floating gate is 0.011 or more and 1 or less, the first mode retention degradation (low temperature retention) is further improved. Therefore, when an analog circuit in which the nonvolatile storage element is used requires a highly accurate voltage, the nonvolatile storage element may have a floating gate and a tunnel insulating film in which the area ratio of the tunnel insulating film to the floating gate is 0.011 or more.

Next, the second mode retention degradation is described. The second mode retention degradation is caused by the fact that a charge in the floating gate excited by thermal energy jumps over the energy barrier of the tunnel insulating film and leaks (hereinafter sometimes referred to as "charge leakage"). The charge leakage may occur anywhere in the tunnel insulating film region having the same energy barrier. More specifically, the occurrence probability of the charge leakage depends on the area of the tunnel insulating film and can be reduced by reducing the area. Moreover, the phenomenon of the charge leakage is relevant to the thermal excitation of an electron, and therefore is further accelerated when the temperature is higher.

Figure 4A:
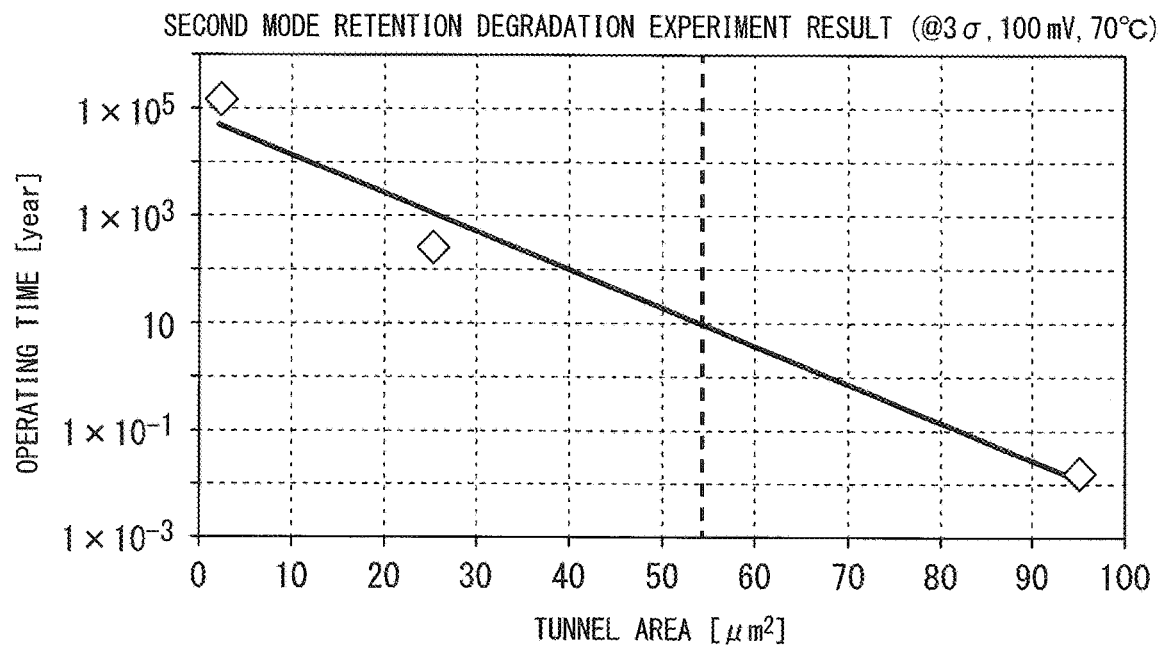
Figure 4B:
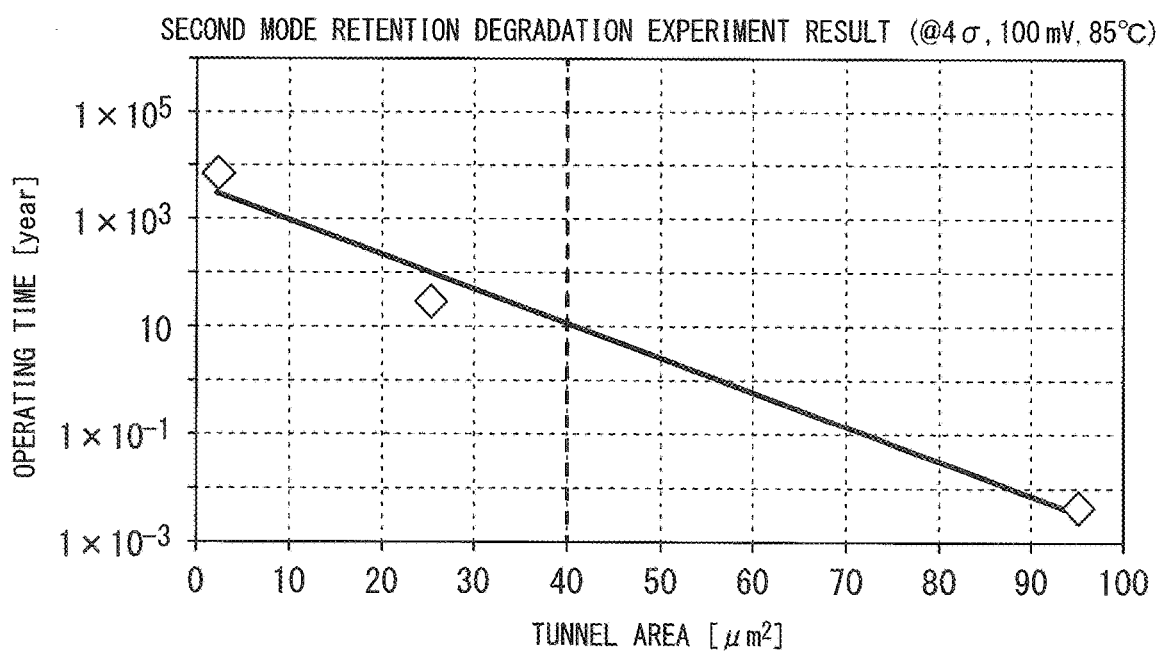

FIGS. 4A and 4B are graphs illustrating the experiment results of the area of the tunnel insulating film and the fluctuation life time of the threshold voltage Vth of the nonvolatile storage element due to the second mode retention degradation at 70° C. This experiment is an accelerated test of adjusting a threshold voltage to a predetermined threshold voltage Vth, and then measuring the threshold voltage Vth after standing of the nonvolatile storage element allowed to stand under certain conditions. For this experiment, measurement samples of nonvolatile storage elements having the same structure as that of the nonvolatile storage element M1 illustrated in FIG. 1 were used. In this experiment, 4000 nonvolatile storage elements adjusted to the predetermined threshold voltage Vth were allowed to stand under each of the three conditions of 24 hours under a 200° C. atmosphere, ten hours under a 250° C. atmosphere, and 24 hours under a 250° C. atmosphere. The threshold voltages Vth of the nonvolatile storage elements after standing under each of the conditions were measured, and then the fluctuation amounts of the threshold voltages Vth before and after the standing were calculated.

"Tunnel area [$\mu m^2$]" of the horizontal axis of each of the graphs illustrated in FIGS. 4A and 4B represents the area (area in a plan view of the nonvolatile storage element) of the tunnel insulating film provided in the nonvolatile storage element. "Operating time [year]" of the vertical axis of each of the graphs illustrated in FIGS. 4A and 4B represents the converted value of the operating time of each nonvolatile storage element based on the time dependency and the temperature dependency (Arrhenius equation) of the threshold voltage Vth in each nonvolatile element. The ◇ mark in the graph illustrated in FIG. 4A indicates the operating time in which the ratio of the measurement samples having a threshold voltage Vth fluctuation of less than 100 mV is 99.87% (equivalent to 3 σ on the one side) of all the measurement samples used for the experiment. The straight line connecting the ◇ marks in the graph illustrated in FIG. 4A is an approximate straight line based on the operating time. The ◇ marks in the graph illustrated in FIG. 4B indicate the operating time in which the ratio of the measurement samples having a threshold voltage Vth fluctuation of less than 100 mV is 99.997% (equivalent to 4 σ on one side) of all the measurement samples used for the experiment. The straight line connecting the ◇ marks in the graph illustrated in FIG. 4B is an approximate straight line based on the operating time.

Herein, the operating time in which the threshold voltage Vth of the nonvolatile storage element fluctuates by 100 mV is defined as the life time. As indicated by the dashed straight line in FIG. 4A, it is found that the area of the tunnel insulating film (tunnel area) needs to be 54 $\mu m^2$ or less in order for 99.87% (equivalent to 3 σ on one side) of all the measurement samples to secure the life time of ten years or more. As indicated by the dashed straight line in FIG. 4B, it is found that the area of the tunnel insulating film (tunnel area) needs to be 40 $\mu m^2$ or less in order for 99.997% (equivalent to 4 σ on one side) of all the measurement samples to secure the life time of ten years or more. Thus, the nonvolatile storage element may have a tunnel insulating film having an area of 54 $\mu m^2$ or less. When the area of the tunnel insulating film is 40 $\mu m^2$ or less, the second mode retention degradation (normal retention) is further improved. Therefore, when an analog circuit in which the nonvolatile storage element is used requires a highly accurate voltage, the nonvolatile storage element may have a tunnel insulating film having an area of 40 $\mu m^2$ or less.

Figure 5A:
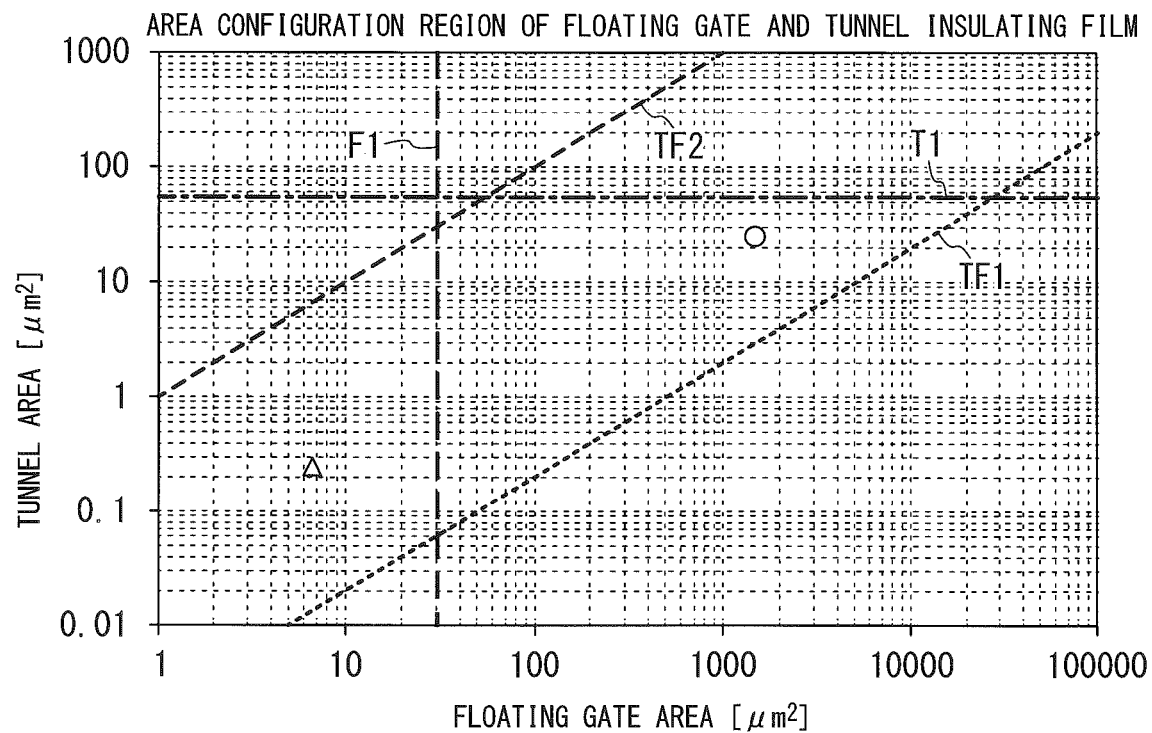
Figure 5B:
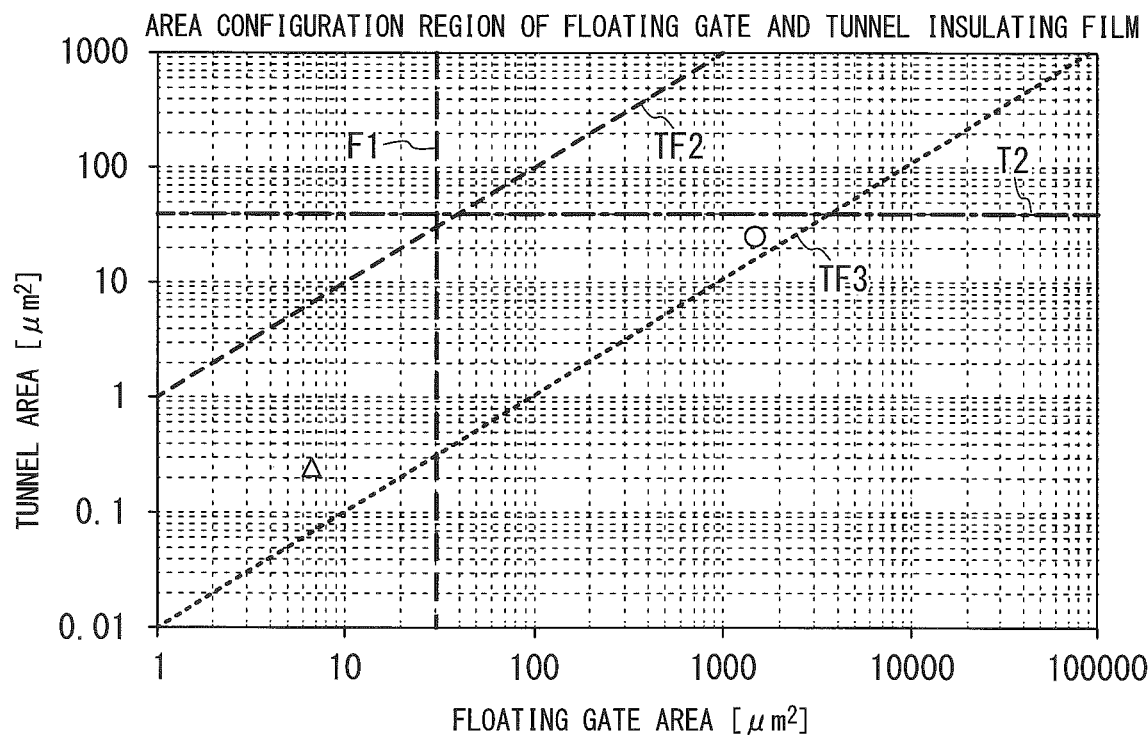

FIGS. 5A and 5B are graphs illustrating the adaptive region of the area configuration of the floating gate and the tunnel insulating film provided in the nonvolatile storage element according to this embodiment. FIG. 5A is the graph created based on the numerical values obtained from the graphs illustrated in FIGS. 3A and 4A. More specifically, FIG. 5A illustrates the adaptive region of the area configuration in which it is expected that the nonvolatile storage element can secure the life time of ten years or more with the probability of 99.87%. FIG. 5B is the graph created based on the numerical values obtained from the graphs illustrated in FIGS. 3B and 4B. More specifically, FIG. 5B illustrates the adaptive region of the area configuration in which it is expected that the nonvolatile storage element can secure the life time of ten years or more with the probability of 99.997%. Hereinafter, the adaptive region of the area configuration of the floating gate and the tunnel insulating film in which it is expected that 99.87% (3 σ on one side) of nonvolatile storage elements distributed in the market can secure the life time of ten years or more is referred to as "standard adaptive region". The adaptive region of the area configuration of the floating gate and the tunnel insulating film in which it is expected that 99.997% (4 σ on one side) of nonvolatile storage elements distributed in the market can secure the life time of ten years or more is referred to as "highly accurate adaptive region".

"Floating gate area [$\mu m^2$]" of the horizontal axis of each of the graphs illustrated in FIGS. 5A and 5B represents the area of the floating gate provided in the nonvolatile storage element (area in a plan view of the nonvolatile storage element). "Tunnel area [$m^2$]" of the vertical axis of each of the graphs illustrated in FIGS. 5A and 5B represents the area of the tunnel insulating film provided in the nonvolatile storage element (area in the plan view of the nonvolatile storage element). A dashed straight line F1 in the graph illustrated in each of FIGS. 5A and 5B indicates the lower limit value of the floating gate area. A dashed straight line T1 in the graph illustrated in FIG. 5A indicates the upper limit value of the tunnel area in the standard adaptive region. A dashed straight line TF1 in the graph illustrated in FIG. 5A indicates a characteristic when the area ratio of the tunnel insulating film to the floating gate is 0.002. A dashed straight line TF2 in the graph illustrated in each of FIGS. 5A and 5B indicates a characteristic when the area ratio of the tunnel insulating film to the floating gate is 1. A dashed straight line T2 in the graph illustrated in FIG. 5B indicates the upper limit value of the tunnel area in the highly accurate adaptive region. A dashed straight line TF3 in the graph illustrated in FIG. 5B indicates a characteristic when the area ratio of the tunnel insulating film to the floating gate is 0.011. The ○ marks in the graphs illustrated in FIGS. 5A and 5B indicate the floating gate area and the tunnel area of the nonvolatile storage element M1 according to this embodiment and the Δ marks indicate an example of the floating gate area and the tunnel area of a memory cell storing digital data (0 or 1).

The straight lines TF1, TF2, and TF3 are straight lines determined based on the area ratio of the tunnel insulating film to the floating gate in which the first mode retention degradation described with reference to FIGS. 3A and 3B is suppressed. The straight lines T1 and T2 are straight lines determined based on the area of the tunnel insulating film in which the second mode retention degradation described with reference to FIGS. 4A and 4B is suppressed. The straight line F1 is a straight line determined based on the lower limit value of the area of the floating gate for differentiation from a case where a nonvolatile storage element of the same structure as that of the nonvolatile storage element M according to this embodiment is used as a memory storing digital data.

Therefore, as illustrated in FIG. 5A, a region surrounded by the straight line T1, the straight line F1, the straight line TF1, and the straight line TF2 is the standard adaptive region of the floating gate and the tunnel insulating film. The regions on the straight line T1, the straight line F1, the straight line TF1, and the straight line TF2 are included in the standard adaptive region. The nonvolatile storage element having the floating gate and the tunnel insulating film having an area included in the standard adaptive region becomes an element in which the probability that the first mode retention degradation and the second mode retention degradation do not occur is expected to be 99.87% even when the operating time has reached ten years in total.

As illustrated in FIG. 5B, a region surrounded by the straight line T2, the straight line F1, the straight line TF3, and the straight line TF2 is the highly accurate adaptive region of the floating gate and the tunnel insulating film. The regions on the straight line T2, the straight line F1, the straight line TF2, and the straight line TF3 are included in the highly accurate adaptive region. The nonvolatile storage element having the floating gate and the tunnel insulating film having an area included in the highly accurate adaptive region becomes an element in which the probability that the first mode retention degradation and the second mode retention degradation do not occur is expected to be 99.997% even when the operating time has reached ten years in total.

The area of the floating gate FG1 of the nonvolatile storage element M1 according to this embodiment is 1422 $\mu m^2$ and the area of the tunnel insulating film 15 thereof is 25.2 $\mu m^2$. On the other hand, the area of the floating gate of the memory cell for digital data is 6.24 $\mu m^2$ and the area of the tunnel insulating film thereof is 0.25 $\mu m^2$. Therefore, as illustrated in FIGS. 5A and 5B, the nonvolatile storage element M1 is included in both the standard adaptive region and the highly accurate adaptive region. The memory cell for digital data is not included in the standard adaptive region and the highly accurate adaptive region.

From the description above, by setting the area of the tunnel insulating film to 54 $\mu m^2$ or less when the FLOTOX nonvolatile storage element is used as the MOSFET having a floating gate area of 30 $\mu m^2$ or more in an analog circuit, the probability that a charge in the floating gate excited by thermal energy jumps over the energy barrier of the tunnel insulating film and leaks is suppressed and the second mode retention degradation can be suppressed. Moreover, by setting the area ratio of the tunnel insulating film to the floating gate to 0.002 or more when the nonvolatile storage element is used as the MOSFET having a floating gate area of 30 $\mu m^2$ or more, the amount of charges passing through the tunnel insulating film per unit area thereof decreases and the first mode retention degradation can also be suppressed. This makes it possible for the nonvolatile storage element to minimize the influence on analog circuit characteristics caused by the first mode retention degradation and the second mode retention degradation.

Therefore, the adaptive region of the area configuration of the floating gate and the tunnel insulating film is a region demarcated by the two straight lines based on the lower limit value and the upper limit value of the area ratio of the tunnel insulating film to the floating gate required in order to suppress the first mode retention degradation, the straight line based on the upper limit value of the tunnel area required in order to suppress the second mode retention degradation, and the straight line based on the lower limit value of the floating gate area. The peaks of the adaptive region of the area configuration of the floating gate and the tunnel insulating film are the intersection between the two straight lines based on the lower limit value and the upper limit value of the area ratio and the straight line based on the upper limit value of the tunnel area and the intersection between the two straight lines and the straight line based on the lower limit value of the floating gate area.

The upper limit value of the area of the tunnel insulating film is a value fluctuating depending on to what extent the life time of the nonvolatile storage element is set. The lower limit value of the area of the floating gate is a value fluctuating depending on the use of the nonvolatile storage element. Therefore, the lower limit value of the area of the floating gate may be smaller than the lower limit value illustrated in FIG. 5 depending on the driving capability required for the analog circuit provided with the nonvolatile storage element. Accordingly, the upper limit value of the tunnel area and the lower limit value of the floating area demarcating the adaptive region of the area configuration of the floating gate and the tunnel insulating film illustrated in FIGS. 5A and 5B may be an example and the other values may be acceptable.

The nonvolatile storage element according to this embodiment produced to be included in the adaptive region of the area configuration of the floating gate and the tunnel insulating film described above can minimize the influence on analog circuit characteristics caused by the first mode retention degradation and the second mode retention degradation.

Figure 6:
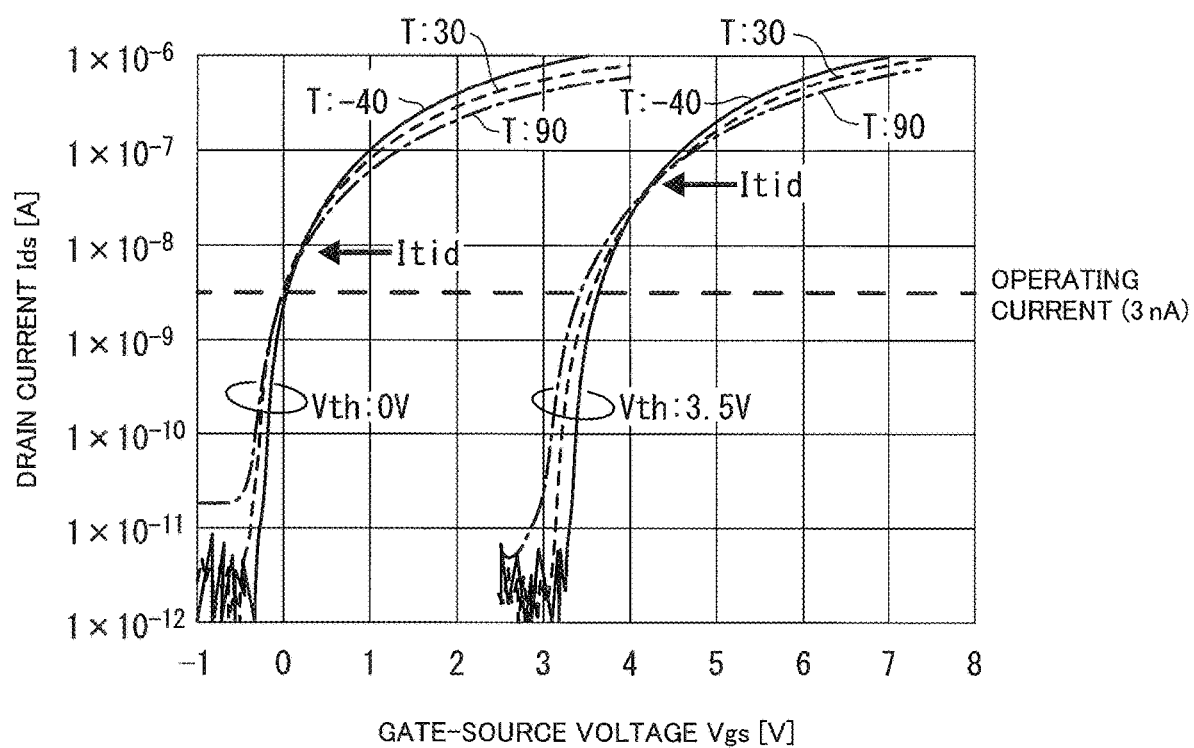
FIG. 6 is a figure explaining a specific region PA of a driving element Mv1 provided in the nonvolatile storage element M1 according to the first embodiment and is a figure illustrating an example of temperature characteristic of a drain current.
Figure 7:
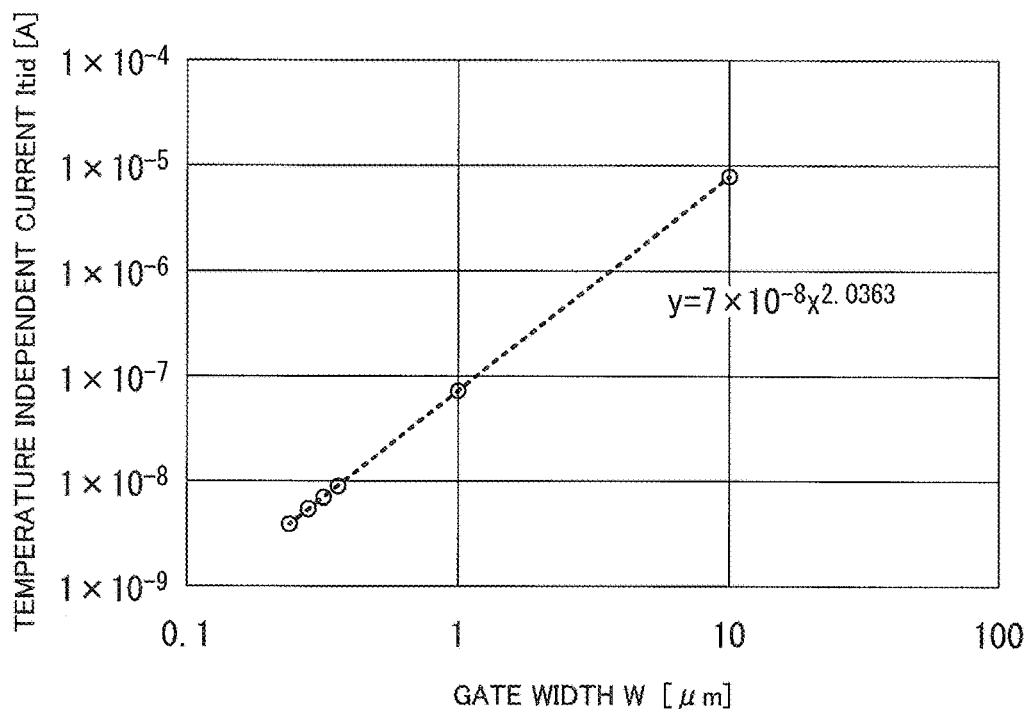
FIG. 7 is a figure explaining the specific region PA of the driving element Mv1 provided in the nonvolatile storage element M1 according to the first embodiment and is a figure illustrating an example of the relationship between the gate width and a temperature independent current of the driving element Mv1.
Figure 8:
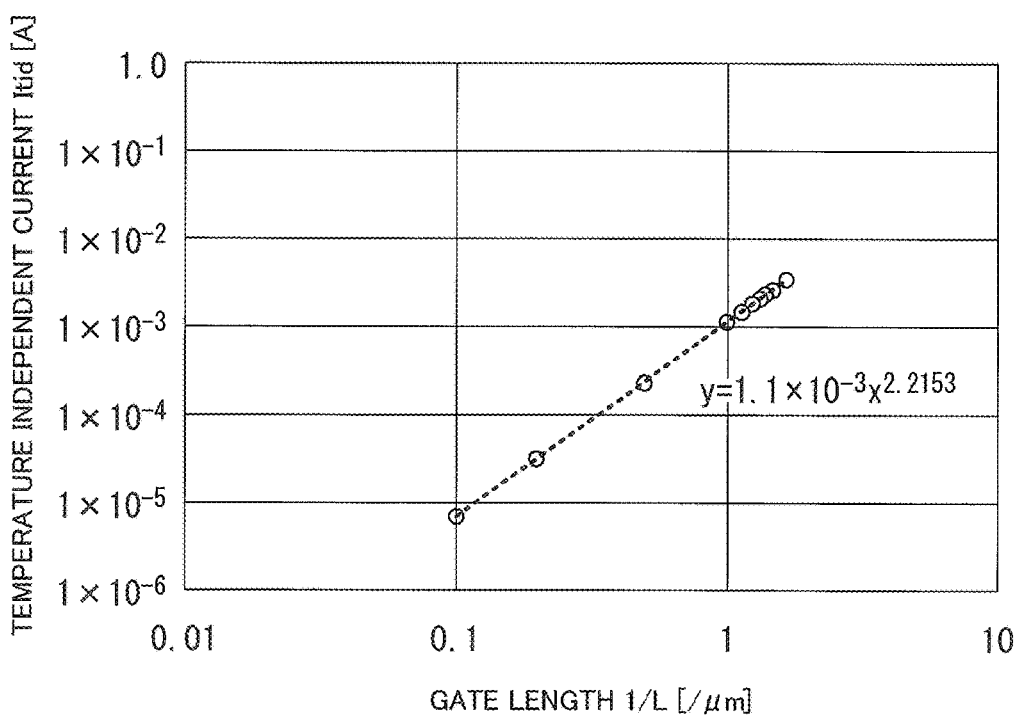
FIG. 8 is a figure explaining the specific region PA of the driving element Mv1 provided in the nonvolatile storage element M1 according to the first embodiment and is a figure illustrating an example of the relationship between the gate length and the temperature independent current of the driving element Mv1.

Herein, the specific region PA which is the region of the floating gate FG1 in the portion where the driving element Mv1 is provided is described using FIGS. 6 to 8 referring to FIGS. 1 and 2A to 2C. The horizontal axis of the graph illustrated in FIG. 6 represents a gate-source voltage Vgs [V] between a control gate and a source region provided in a nonvolatile storage element having the same structure as that the driving element Mv1. The vertical axis of the graph illustrated in FIG. 6 represents a drain current Ids [A] of the nonvolatile storage element. On the left side in FIG. 6, the characteristic when a value of the threshold voltage Vth of the nonvolatile storage element is adjusted to 0 V is illustrated. On the right side in FIG. 6, the characteristic when the value of the threshold voltage Vth of the nonvolatile storage element is adjusted to 3.5 V is illustrated. "T: −40" illustrated in FIG. 6 illustrates the characteristic of the drain current Ids to the gate-source voltage Vgs of the nonvolatile storage element when the ambient temperature is −40° C. "T: 30" illustrated in FIG. 6 illustrates the characteristic of the drain current Ids to the gate-source voltage Vgs of the nonvolatile storage element when the ambient temperature is 30° C. "T: 90" illustrated in FIG. 6 illustrates the characteristic of the drain current Ids to the gate-source voltage Vgs of the nonvolatile storage element when the ambient temperature is 90° C.

As illustrated in FIG. 6, the nonvolatile storage element having the same structure as the driving element Mv1 has a characteristic that the current value of the drain current Ids to the ambient temperature is reversed with a predetermined value of the gate-source voltage Vgs as the boundary. More specifically, the current value of the drain current Ids of the nonvolatile storage element is larger at a high ambient temperature than at a low ambient temperature in a range where the gate-source voltage Vgs is lower than the predetermined value, the current value is identical irrespective of the ambient temperature at the predetermined value, and the current value is smaller at a high ambient temperature than at a low ambient temperature in a range where the gate-source voltage Vgs is higher than the predetermined value. Hereinafter, drain currents at which the threshold voltages are adjusted to the same value and current values of which are identical to each other even when the ambient temperature is different in a plurality of nonvolatile storage elements are referred to as "temperature independent current".

In the actual operation of the nonvolatile storage element M1, the driving element Mv1 mainly operates. Therefore, due to the fact that the driving element Mv1 is configured to operate by a temperature independent current Itid, an improvement of temperature characteristics of the nonvolatile storage element M1 can be achieved.

Furthermore, the nonvolatile storage element M1 is a technology for low power consumption. Therefore, when a temperature independent current Itid of the nonvolatile storage element M1 (i.e., temperature independent current Itid of the driving element Mv) is in a low current consumption region (for example, several nA or less) as illustrated in FIG. 6, the nonvolatile storage element M1 having low power consumption and excellent also in temperature characteristics can be achieved.

Between the temperature independent current Itid of the driving element Mv1 and the channel width and the channel length of the driving element Mv1, i.e., the gate width W and the gate length L in the specific region PA of the floating gate FG1, the relationship illustrated in the following expression (1) is established.

[Expression 1]

$$Itid = A \times \frac{W^\alpha}{L^\beta} \quad (1)$$

In Expression (1), "A" indicates the constant. Next, the constant A, an index $\alpha$ of the gate width W, and an index $\beta$ of the gate length L in Expression (1) are described. The constant A, the index $\alpha$, and the index $\beta$ are determined by producing a plurality of NMOS samples which have the same structure as that of the driving element Mv1 and in which either the gate width W or the gate length L is varied and using a measurement value of the temperature independent current of each sample.

Table 1 illustrates the measurement results of the temperature independent current to the gate width of the NMOS having the same structure as that of the driving element Mv1. "W [μm]" illustrated in the upper row in Table 1 indicates the gate width of the NMOS, "Itid [A]" illustrated in the upper row indicates the temperature independent current, and "A" illustrated in the upper row indicates the constant A in Expression (1). A method for calculating the constant A is described later. The gate length L of each sample is 10 μm. The temperature independent current was measured with a state that a voltage of 0.1 V was applied between the source and the drain of the NMOS.

TABLE 1

| W [μm] | Itid [A] | A |
|---|---|---|
| 0.24 | $3.7 \times 10^{-9}$ | $1.1 \times 10^{-5}$ |
| 0.28 | $5.3 \times 10^{-9}$ | $1.2 \times 10^{-5}$ |
| 0.32 | $6.8 \times 10^{-9}$ | $1.1 \times 10^{-5}$ |
| 0.36 | $8.7 \times 10^{-9}$ | $1.1 \times 10^{-5}$ |
| 1.00 | $7.6 \times 10^{-8}$ | $1.3 \times 10^{-5}$ |
| 10.0 | $7.4 \times 10^{-6}$ | $1.1 \times 10^{-5}$ |

(L = 10 μm)

As illustrated in Table 1, the temperature independent current was measured for six kinds of the samples when the gate width W of the NMOS is in the range of 0.24 μm to 10.0 μm. FIG. 7 illustrates the relationship between the gate width W and the temperature independent current Itid created using the measurement results of the temperature independent current illustrated in Table 1. The horizontal axis of the graph illustrated in FIG. 7 represents the gate width W [μm] (i.e., W [μm] illustrated in Table 1) of the NMOS used as the measurement sample. The vertical axis of the graph illustrated in FIG. 7 represents the temperature independent current Itid [A] of the NMOS (i.e., Itid [A] illustrated in Table 1). The graph illustrated in FIG. 7 is a log-log graph. The dotted line illustrated in FIG. 7 is a power approximation curve connecting the measurement points. An expression illustrated in FIG. 7 is an expression indicating the power approximation curve. "x" of the expression is the gate width W and "y" of the expression is the temperature independent current Itid.

As illustrated in FIG. 7, the temperature independent current Itid of the NMOS varies depending on the gate width W of the NMOS when the gate length of the NMOS is fixed. The temperature independent current Itid of the NMOS has a characteristic of increasing with an increase in the gate width W of the NMOS and being given by "$7 \times 10^{-8}$ $W^{2.036}$". The coefficient (index) in which the temperature independent current Itid of the NMOS depends on the gate width W of the NMOS is the index $\alpha$ in Expression (1). Therefore, the $\alpha$ value is 2.036.

Table 2 illustrates the measurement results of the temperature independent current to the gate length of the NMOS having the same structure as that the driving element Mv1. "1/L [/μm]" illustrated in the top row in Table 2 indicates the reciprocal of the gate length of the NMOS, "Itid [A]" illustrated in the top row indicates a temperature independent current, and "A" illustrated in the top row indicates the constant A in Expression (1). "Ave." illustrated in the bottom row in Table 2 indicates an average value of the constants A. Methods for calculating the constant A and the average value of the constants A are described later. The gate width W of each sample is 10 μm. The temperature independent current was measured with a state that a voltage of 0.1 V was applied between the source and the drain of the NMOS.

TABLE 2

| 1/L [μm] | Itid [A] | A |
|---|---|---|
| 1.67 | $3.5 \times 10^{-3}$ | $1.0 \times 10^{-5}$ |
| 1.47 | $2.6 \times 10^{-3}$ | $1.0 \times 10^{-5}$ |
| 1.39 | $2.4 \times 10^{-3}$ | $1.1 \times 10^{-5}$ |
| 1.32 | $2.2 \times 10^{-3}$ | $1.1 \times 10^{-5}$ |
| 1.25 | $1.9 \times 10^{-3}$ | $1.0 \times 10^{-5}$ |
| 1.14 | $1.5 \times 10^{-3}$ | $1.1 \times 10^{-5}$ |
| 1.00 | $1.1 \times 10^{-3}$ | $1.0 \times 10^{-5}$ |
| 0.50 | $2.2 \times 10^{-4}$ | $9.3 \times 10^{-6}$ |
| 0.20 | $3.0 \times 10^{-5}$ | $9.8 \times 10^{-6}$ |
| 0.10 | $7.4 \times 10^{-6}$ | $1.1 \times 10^{-5}$ |
|  | Ave. | $1.1 \times 10^{-5}$ |

(W = 10 μm)

As illustrated in Table 2, the temperature independent current was measured for ten kinds of samples when the reciprocal of the gate length L of the NMOS is in the range of 1.67 μm to 0.10 μm. FIG. 8 illustrates the relationship between the reciprocal of the gate length L and the temperature independent current Itid created using the measurement results of the temperature independent current illustrated in Table 2. The horizontal axis of the graph illustrated in FIG. 8 represents the reciprocal 1/L [/μm] (i.e., 1/L [/μm] illustrated in Table 2) of the gate length L of the NMOS used as the measurement sample. The vertical axis of the graph illustrated in FIG. 8 represents the temperature independent current Itid [A] (i.e., Itid [A] illustrated in Table 2) of the NMOS. The graph illustrated in FIG. 8 is a log-log graph. The dotted line illustrated in FIG. 8 is a power approximation curve connecting the measurement points. An expression illustrated in FIG. 8 is an expression indicating the power approximation curve. "x" of the expression is the reciprocal 1/L of the gate length L and "y" of the expression is the temperature independent current Itid.

As illustrated in FIG. 8, the temperature independent current Itid of the NMOS varies depending on the gate length L of the NMOS when the gate width of the NMOS is fixed. The temperature independent current Itid of the NMOS has a characteristic of increasing with an increase in the reciprocal 1/L of the gate length L (i.e., with a reduction in the gate length L of the NMOS) and being given by "$1.1 \times 10^{-8}$ $(1/L)^{2.215}$". The coefficient (index) in which the temperature independent current Itid of the NMOS depends on the reciprocal 1/L of the gate length L of the NMOS is the index β in Expression (1). Therefore, the β value is 2.215.

When the values of the index α and the index β obtained by the above-described measurement are assigned to Expression (1), the following expression (2) is obtained.

[Expression 2]

$$Itid = A \times \frac{W^{2.036}}{L^{2.215}} \quad (2)$$

When Expression (2) is modified, the following expression (3) is obtained.

[Expression 3]

$$\frac{Itid}{A} = \frac{W^{2.036}}{L^{2.215}} \quad (3)$$

The value of the constant A illustrated in Table 1 is calculated by assigning the gate width W, the gate length L, and the temperature independent current Itid illustrated in Table 1 to Expression (2). For example, $A=1.1\times10^{-5}$ illustrated in the second row of Table 1 is calculated by assigning W=0.24 μm, Itid=$3.7\times10^9$ A, and L=10 μm illustrated in the second row of Table 1 to Expression (2). Similarly, the value of the constant A illustrated in Table 2 is calculated by assigning the reciprocal 1/L of the gate length L, the gate width W, and the temperature independent current Itid illustrated in Table 2 to Expression (2). For example, $A=1.0\times10^{-5}$ illustrated in the second row of Table 2 is calculated by assigning 1/L=1.67 (/μm), Itid=$3.5\times10^{-3}$ A, and W=10 μm illustrated in the second row of Table 2 to Expression (2). The average value (numerical value indicated on the right side of "Ave.") of the constants A illustrated in Table 2 is the average value of six constant A values illustrated in Table 1 and ten constant A values illustrated in Table 2. In this embodiment, the average value is defined as the constant A value.

In this embodiment, an operating current of the driving element Mv1 is assumed to be 1 nA or less. Therefore, with respect to the condition that the temperature independent current Itid is equal to or less than the operating current, the following expression (4) is obtained by assigning 1 nA which is the assumed maximum operating current and the average value "$1.1\times10^{-5}$" of the constants A illustrated in Table 2 to Itid of Expression (3).

Expression (4)

$$9.28 \times 10^{-5} \geq \frac{W^{2.036}}{L^{2.215}} \quad (4)$$

Therefore, when the gate length of the specific region PA of the floating gate FG1 is defined as L (see FIG. 1), the gate width W and the gate length L of the specific region PA of the floating gate FG1 may satisfy the relationship of Expression (4) described above. Due to the fact that the gate width W and the gate length L of the specific region PA of the floating gate FG1 of the driving element Mv1 satisfy the relationship of Expression (4) described above, the drain current Ids of the driving element Mv1 is hard to depend on the ambient temperature and the value is 1 nA or less, and therefore the nonvolatile storage element M1 can achieve an improvement of temperature stability and a reduction in power consumption.

When Expression (2) is solved for the gate length L, the following expression (5) is obtained.

Expression (5)

$$L = \left(\frac{Itid}{A \times W^{2.036}}\right)^{\frac{1}{-2.215}} \quad (5)$$

Herein, an area S of the specific region PA of the floating gate FG1 is given by the product (W×L) of the gate width W and the gate length L. The condition of the area S of the specific region PA in which the gate width W is 0.5 μm of the minimum value and the temperature independent current Itid is equal to or less than the operating current (1 nA) is 17.5 μm² or more, when S=W×L and Expression (5) are used. More specifically, the region of the floating gate FG1 in the driving element Mv1, i.e., a specific region PA, may have an area of 17.5 μm² or more and may satisfy the relationship of Expression (4). Thus, the drain current Ids of the driving element Mv1 is hard to depend on the ambient temperature and the value is 1 nA or less at the minimum value (0.5 μm) of a 0.5 μm generation manufacturing process which is a next generation manufacturing process, and therefore the nonvolatile storage element M1 can achieve an improvement of temperature stability and a reduction in power consumption.

The temperature independent current Itid of Expression (2) can be expressed by the following expression (6) when the area S of the specific region PA is used.

Expression (6)

$$Itid = A \times \frac{W^{4.251}}{S^{2.215}} \quad (6)$$

It is supposed that the entire floating gate FG1 has an area larger than 30 μm² when the area of the floating gate FG1 specified for differentiation from a case where a nonvolatile storage element is used as a memory storing digital data is 30 μm² or more and 27000 μm² or less. In this case, when it is supposed that the area of the specific region PA of the floating gate FG1 is 30 μm² or more and the gate width W is 0.5 μm of the minimum value, the temperature independent current Itid is $3.0 \times 10^{-10}$ A or less, which is smaller than the minimum value assumed in this embodiment. Thus, when the entire floating gate FG1 has an area larger 30 μm², the area of the specific region PA of the floating gate FG1 may be 30 μm² or more. Thus, the nonvolatile storage element M1 can achieve a further reduction in power consumption.

(Method for Manufacturing Nonvolatile Storage Element)

Next, a method for manufacturing the nonvolatile storage element M1 according to this embodiment is described with reference to FIG. 1 and FIGS. 2A to 2C and FIGS. 9A to 9F to 18A to 18C. FIGS. 9A to 9F to 18A to 18C illustrate manufacturing processes of one nonvolatile storage element of a plurality of nonvolatile storage elements simultaneously formed on one semiconductor substrate. FIGS. 9A and 9D, 10A and 10D, 11A and 11D, 12A, 13A and 13D, 14A and 14D, 15A and 15D, 16A and 16D, 17A and 17D, and 18A illustrate cross sections of manufacturing processes (i.e., cross sections of manufacturing process of the writing element Mw1) of the nonvolatile storage element M1 cut along the A-A line in FIG. 1. FIGS. 9B and 9E, 10B and 10E, 11B and 11E, 12B, 13B and 13E, 14B and 14E, 15B and 15E, 16B and 16E, 17B and 17E, and 18B illustrate cross sections of manufacturing processes (i.e., cross sections of manufacturing process of the driving element Mv1 (and the dummy element Mm1)) of the nonvolatile storage element M1 cut along the B1-B1 line (and B2-B2 line) in FIG. 1. FIGS. 9C and 9F, 10C and 10F, 11C and 11F, 12C, 13C and 13F, 14C and 14F, 15C and 15F, 16C and 16F, 17C and 17F, and 18C illustrate cross sections of manufacturing processes (i.e., cross sections of manufacturing process of a portion where the plug 51g is provided) of the nonvolatile storage element M1 cut along the C-C line in FIG. 1. In FIGS. 9A, 9B, and 9C, 9D, 9E, and 9F, 10A, 10B, and 10C, 10D, 10E, and 10F, 11A, 11B, and 11C, 11D, 11E, and 11F, 12A, 12B and 12C, 13A, 13B, and 13C, 13D, 13E, and 13F, 14A, 14B, and 14C, 14D, 14E, and 14F, 15A, 15B, and 15C, 15D, 15E, and 15F, 16A, 16B, and 16C, 16D, 16E, and 16F, 17A, 17B, and 17C, 17D, 17E, and 17F, and 18A, 18B, and 18C the manufacturing processes of the nonvolatile storage element M are illustrated in this order in a time series.

First, the P-type semiconductor substrate 9A is thermally oxidized to form an oxide film 10z of silicon dioxide having a film thickness of 300 Å on the surface of the semiconductor substrate 9A as illustrated in FIGS. 9A, 9B, and 9C. Next, boron is injected into an upper portion of the semiconductor substrate 9A to form an impurity layer. Next, the impurity layer is thermally diffused by 1200° C. furnace annealing to form the P-well region 10A in the upper portion of the semiconductor substrate 9A as illustrated in FIGS. 9A, 9B, and 9C.

Next, the oxide film 10z is removed, a pad oxide film is formed on the semiconductor substrate 9A, and then silicon nitride is deposited on the pad oxide film to form a nitride film. Next, photoresist is applied onto the nitride film, the photoresist is exposed and developed, and then a resist mask covering a region where a nonvolatile storage element is finally formed is formed.

Next, dry etching of the nitride film is performed with the resist mask as a mask to remove the nitride film in a region other than a region below the resist mask. Subsequently, the resist mask is removed by dry ashing. Next, thermally oxidization is performed until the film thickness of the pad oxide film of a region not covered with the nitride film reaches 7000 Å by the LOCOS method.

Next, wet etching of the nitride film is performed with hot phosphoric acid. Next, the pad oxide film is removed with fluoric acid until the P-well region 10A in the region where the nitride film is formed is exposed. Thus, as illustrated in FIGS. 9D, 9E, and 9F, the element isolation region 41 is formed in the predetermined region on the semiconductor substrate 9A.

Next, the semiconductor substrate 9A is thermally oxidized, silicon dioxide is deposited in the region where the P-well region 10A is exposed with a thickness of 480 Å, and an oxide film 16z partially serving as the gate insulating films 16w, 16v, and 16m is formed on the entire surface of the semiconductor substrate 9A as illustrated in FIGS. 10A and 10B. As illustrated in FIGS. 10A, 10B, and 10C, the oxide film 16z is formed in the region where the P-well region 10A is exposed and is hardly formed on the oxide film configuring the element isolation region 41. Next, photoresist is applied to the entire surface of the semiconductor substrate 9A including the oxide film 16z, and then the photoresist is exposed and developed. Thus, as illustrated in FIGS. 10A, 10B, and 10C, a resist mask RM11 is formed in which the oxide film 16z in a region where the diffusion layer 11a, the first drain layer 11v, and the first drain layer 11m (see FIGS. 1 and 2A to 2C) are formed in the future is at least exposed. The resist mask RM11 has an opening region continuously formed over the region where the diffusion layer 11a, the first drain layer 11v, and the first drain layer 11m are formed in the future. In a part of the opening region, the oxide film 16z is exposed. In the remaining portion of the opening region, the element isolation region 41 is exposed.

Next, arsenic ions are injected with the resist mask RM11 as a mask. The arsenic ion is injected with such energy that the arsenic ion can pass through the oxide film 16z to reach the P-well region 10A but cannot reach the P-well region 10A passing through the element isolation region 41. Thus, The diffusion layer 11a is formed in the P-well region 10A below the oxide film 16z opened by the resist mask RM11 as illustrated in FIG. 10D. As illustrated in FIG. 10E, The first drain layer 11v is formed in the P-well region 10A below the oxide film 16z opened by the resist mask RM11.

Furthermore, as illustrated in FIG. 10F, The first drain layer 11*m* is formed in the P-well region 10A below the oxide film 16*z* opened by the resist mask RM11. The diffusion layer 11*a*, the first drain layer 11*v*, and the first drain layer 11*m* are simultaneously formed in a state of being isolated from each other. Thereafter, the resist mask RM11 is removed by dry etching.

Next, photoresist is applied to the entire surface of the semiconductor substrate 9A, and then the photoresist is exposed and developed. Thus, as illustrated in FIGS. 11A, 11B, and 11C, a resist mask RM15 exposing the oxide film 16*z* in a region where the tunnel insulating film 15 (see FIG. 2) is formed in the future is formed.

Next, wet etching of the oxide film 16*z* is performed with the resist mask RM15 as a mask. Thus, as illustrated in FIGS. 11D, 11E, and 11F, an opening portion 15*z* is formed in which the oxide film 16*z* in a region where the tunnel insulating film 15 is formed in the future is removed. Then, the resist mask RM15 is removed by dry etching.

Next, the semiconductor substrate 9A is thermally oxidized, silicon dioxide is formed until the film thickness reaches 98 Å in the opening portion 15*z* in which the P-well region 10A is exposed, and then, as illustrated in FIG. 12A, the tunnel insulating film 15 is formed in apart on the P-well region 10A in a region where the writing element Mw1 (see FIG. 2) is formed in the future. On the other hand, as illustrated in FIG. 12B, no tunnel insulating film is formed on the P-well region 10A in a region where the driving element Mv1 and the dummy element Mm1 (see FIGS. 2A to 2C) are formed in the future and the oxide film 16*z* having an almost constant film thickness remains. As illustrated in FIG. 12C, the oxide film 16*z* is not present in a region where the plug 51*g* is formed in the future, and therefore the element isolation region 41 is exposed.

Figure 13A:
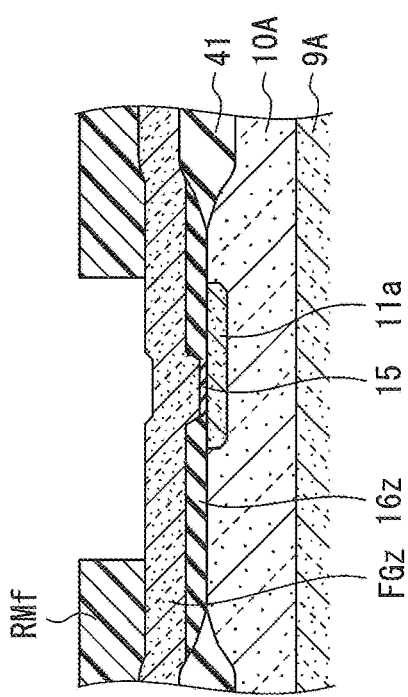
FIGS. 13A to 13F are cross-sectional views of the manufacturing process (No. 5) of the nonvolatile storage element M1 according to the first embodiment of the present invention.
Figure 13B:
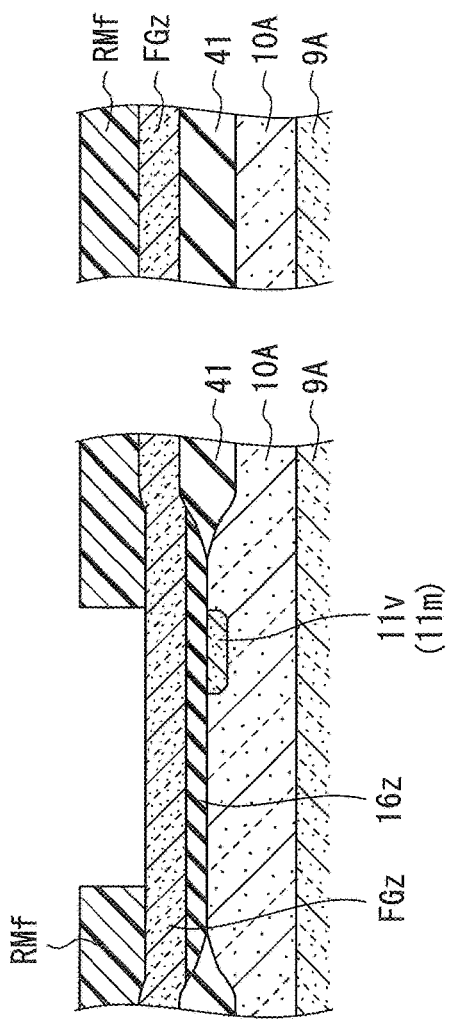
Figure 13C:
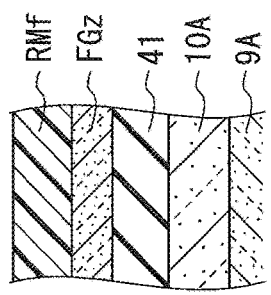

Next, polysilicon is deposited on the semiconductor substrate 9A including the top of the tunnel insulating film 15 with a thickness of 2000 Å, and then a polysilicon film FGz partially serving as the floating gate FG1 (see FIGS. 1 and 2A to 2C) in the future is formed as illustrated in FIGS. 13A, 13B, and 13C. Next, photoresist is applied to the entire surface of the semiconductor substrate 9A, and then the photoresist is exposed and developed. Thus, as illustrated in FIGS. 13A, 13B, and 13C, a resist mask RMf exposing the polysilicon film FGz in a region where the floating gate FG1 is formed in the future is formed.

Figure 13D:
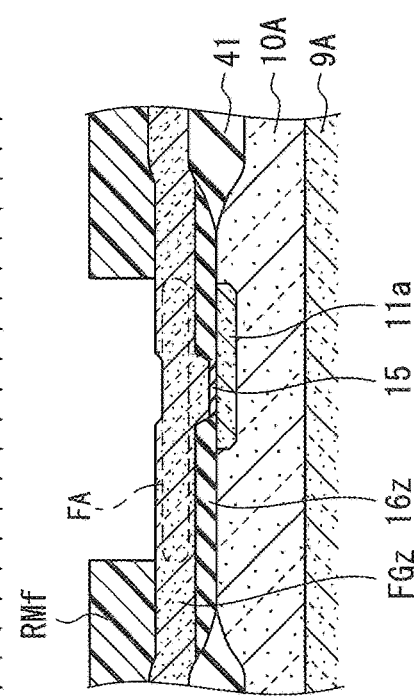
Figure 13E:
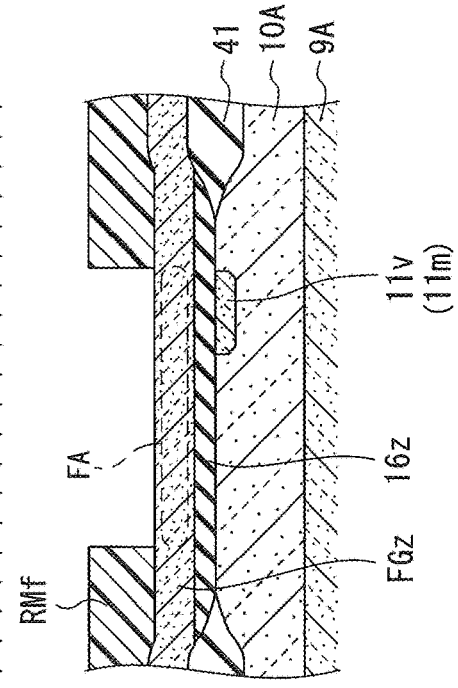
Figure 13F:
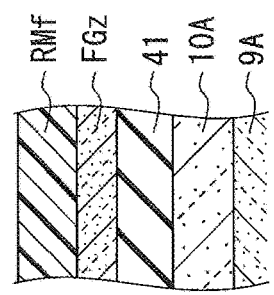

Next, as illustrated in FIGS. 13D, 13E, and 13F, fluorine ions are injected into the polysilicon film FGz with the resist mask RMf as a mask. Thus, a fluorine existing region FA in which a relatively large amount of fluorine is present is formed in the region of the polysilicon film FGz not covered with the resist mask RMf. Thereafter, the resist mask RMf is removed by dry ashing.

Next, photoresist is applied to the entire surface of the semiconductor substrate 9A, and then the photoresist is exposed and developed. Thus, as illustrated in FIGS. 14A, 14B, and 14C, a resist mask RMfg covering the polysilicon film FGz in a region where the floating gate FG1 and the gate insulating films 16*w*, 16*v*, and 16*m* are formed in the future is formed.

Next, as illustrated in FIGS. 14D, 14E, and 14F, the polysilicon film FGz and the oxide film 16*z* in a portion other than a portion below the resist mask RMfg are successively removed by dry etching with the resist mask RMfg as a mask. Thus, the floating gate FG1 and the gate insulating films 16*w*, 16*v*, and 16*m* are formed. By the formation of the floating gate FG1, the charge inlet 14 is formed at a position corresponding to the tunnel insulating film 15. Thereafter, the resist mask RMfg is removed by dry ashing.

Next, as illustrated in FIGS. 15A, 15B, and 15C, an oxide/nitride/oxide (ONO) film 17*z* covering the floating gate FG1 and the gate insulating films 16*w*, 16*v*, and 16*m* and partially serving as the insulating film 17 (see FIG. 2) in the future is formed. The ONO film 17*z* is formed by successively performing thermal oxidation of the semiconductor substrate 9A and deposition and thermal oxidation of the nitride film. By the heat in the formation of the ONO film 17*z*, the fluorine in the floating gate FG1 can be rapidly taken into the ONO film 17*z*, the gate insulating films 16*w*, 16*v*, and 16*m*, and the tunnel insulating film 15 to be segregated. More specifically, as indicated by the curved arrow toward the outside from the fluorine existing region FA in FIGS. 15A and 15B, the fluorine can be distributed with a high concentration in all the directions surrounding the floating gate FG1 from the fluorine existing region FA by the heat in the formation of the ONO film 17*z*.

As illustrated in FIGS. 15D, 15E, and 15F, polysilicon is formed on the entire surface of the ONO film 17*z* after the formation of the ONO film 17*z* to form a polysilicon film CGz partially serving as the control gate CG1 (see FIGS. 1 and 2) in the future.

Next, as illustrated in FIGS. 16A, 16B, and 16C, silicon dioxide is deposited on the entire surface of the polysilicon film CGz to form an oxide film CGy. Next, photoresist is applied to the entire surface of the oxide film CGy, and then the photoresist is exposed and developed. Thus, as illustrated in FIGS. 16A, 16B, and 16C, a resist mask RMc covering the oxide film CGy in a region where the control gate CG1 is formed in the future is formed.

Next, as illustrated in FIGS. 16D, 16E, and 16F, the oxide film CGy in a portion other than a portion below the resist mask RMc is removed by dry etching with the resist mask RMc as a mask. Thus, a mask for forming the control gate CG1 is formed by the oxide film CGy. Thereafter, the resist mask RMc is removed by dry etching.

Next, as illustrated in FIGS. 17A, 17B, and 17C, the polysilicon film CGz in a portion other than a portion below the oxide film CGy is removed by dry etching with the oxide film CGy as a mask. Thus, the control gate CG1 is formed.

Next, arsenic ions are injected into the P-well region 10A with the floating gate FG1 as a mask. Thus, as illustrated in FIG. 17D, the LDD layer 12*b* is formed in a part of the P-well region 10A on one of both sides of the floating gate FG1 in a region where the writing element Mw1 is formed in the future and the LDD layer 12*a* is formed in a part of the P-well region 10A on the other side of both sides of the floating gate FG1 in the region. As illustrated in FIG. 17E, simultaneously with the formation of the LDD layers 12*a* and 12*b*, the LDD layer 12*vs* is formed in a part of the P-well region 10A on one of both sides of the floating gate FG1 in a region where the driving element Mv1 is formed in the future and the LDD layer 12*vd* is formed in a part of the P-well region 10A on the other side of both sides of the floating gate FG1 in the region. As illustrated in FIG. 17E, simultaneously with the formation of the LDD layers 12*a* and 12*b*, the LDD layer 12*ms* is formed in a part of the P-well region 10A on one of both sides of the floating gate FG1 in a region where the dummy element Mm1 is formed in the future and the LDD layer 12*md* is formed in a part of the P-well region 10A on the other side of both sides of the floating gate FG1 in the region. On the other hand, a region where the plug 51*g* is finally formed is covered with the control gate CG1, and therefore no LDD layer is formed in the P-well region 10A in the region as illustrated in FIG. 17F. Thereafter, the oxide film CGy is removed by dry ashing.

Next, an oxide film of silicon dioxide is formed on the entire surface on the semiconductor substrate 9A including the control gate CG1 and the ONO film 17z. Next, the oxide film and the ONO film 17z are partially dry etched while leaving the periphery of each of the control gate CG1 and the ONO film 17z. Thus, as illustrated in FIGS. 18A and 18C, the insulating film 17 covering the floating gate FG1 is formed, the sidewall 18 is formed in the periphery of the insulating film 17, and the sidewall 19 is formed in the periphery of the control gate CG1. As illustrated in FIG. 18C, the insulating film 17 and continuously formed with the insulating film 17 covering the floating gate FG1 is formed in a region where the plug 51g is formed in the future.

Next, arsenic ions are injected into the LDD layers 12a, 12b, 12vs, 12vd, 12ms, and 12md with the control gate CG1, the insulating film 17, and the sidewalls 18 and 19 as a mask. Thus, as illustrated in FIG. 2A, the contact layer 13b is formed in a partial region of the LDD layer 12b and the second impurity diffusion region IAb is formed in the P-well region 10A on one of both sides of the floating gate FG1 in a region where the writing element Mw1 is formed in the future. The contact layer 13a is formed in a partial region of the LDD layer 12a and the first impurity diffusion region IAa is formed in a part of the P-well region 10A below and on the other side of both sides of the floating gate FG1 in a region where the writing element Mw1 is formed in the future.

As illustrated in FIG. 2B, the source layer 13v is formed in a partial region of the LDD layer 12vs and the source region Sv1 is formed in the P-well region 10A on one of both sides of the floating gate FG1 in a region where the driving element Mv1 is formed in the future. The second drain layer 13vd is formed in a partial region of the LDD layer 12vd and the drain region Dv1 is formed in a part of the P-well region 10A below and on the other side of both sides of the floating gate FG1 in a region where the driving element Mv1 is formed in the future.

As illustrated in FIG. 2B, the source layer 13ms is formed in a partial region of the LDD layer 12ms and the source region Sm1 is formed in the P-well region 10A on one of both sides of the floating gate FG1 in a region where the dummy element Mm1 is formed in the future. The second drain layer 13md is formed in a partial region of the LDD layer 12md and the drain region Dm1 is formed in a part of the P-well region 10A below and on the other side of both sides of the floating gate FG1 in a region where the dummy element Mm1 is formed in the future.

Next, as illustrated in FIGS. 2A to 2C, an insulating interlayer insulating film 61 is formed on the entire surface of the semiconductor substrate 9A including the control gate CG1, the floating gate FG1, the first impurity diffusion region IAa, the second impurity diffusion region IAb, the source regions Sv1 and Sm1, the drain regions Dv1 and Dm1, and the like.

Next, as illustrated in FIG. 2A, opening portions opening a part of the contact layers 13a and 13b to the bottom surface are formed in the interlayer insulating film 61. Simultaneously with the formation of the opening portions, opening portions opening a part of the source layers 13vs and 13ms to the bottom surface and opening portions opening a part of the second drain layers 13vd and 13md to the bottom surface are formed in the interlayer insulating film 61 as illustrated in FIG. 2B. Simultaneously with the formation of these opening portions, an opening portion opening a part of the control gate CG1 in a region not overlapping with the floating gate FG1 to the bottom surface is formed in the interlayer insulating film 61 as illustrated in FIG. 2C.

Next, as illustrated in FIG. 2A, the plugs 51a and 51b made of metal materials are embedded in the opening portions on the contact layers 13a and 13b. As illustrated in FIG. 2B, simultaneously with the embedding of the plugs 51a and 51b, the plugs 51vd and 51md made of metal materials are embedded in the opening portions on the second drain layers 13vd and 13md, respectively and the plugs 51vs and 51ms made of metal materials are embedded in the opening portions formed on the source layers 13vs and 13ms, respectively. As illustrated in FIG. 2C, the plug 51g made of a metal material is embedded in the opening portion on the control gate CG1 simultaneously with the formation of the plugs 51a and 51b.

Next, as illustrated in FIG. 2A, the metal wiring line 52a is formed on the plug 51a exposed to the interlayer insulating film 61 and the metal wiring line 52b is formed on the plug 51b exposed to the interlayer insulating film 61. Thus, the writing element Mw1 is completed. Simultaneously with the formation of the metal wiring lines 52a and 52b, the metal wiring line 52vs is formed on the plug 51vs exposed to the interlayer insulating film 61 and the metal wiring line 52nd is formed on the plug 51vd exposed to the interlayer insulating film 61 as illustrated in FIG. 2B. Thus, the driving element Mv1 is completed. Simultaneously with the formation of the metal wiring lines 52a and 52b, the metal wiring line 52ms is formed on the plug 51ms exposed to the interlayer insulating film 61 and the metal wiring line 52md is formed on the plug 51md exposed to the interlayer insulating film 61 as illustrated in FIG. 2B. Thus, the dummy element Mm1 is completed. Simultaneously with the formation of the metal wiring line 52a and 52b, the metal wiring line 52g is formed on the plug 51g exposed to the interlayer insulating film 61 as illustrated in FIG. 2C. Thus, the nonvolatile storage element M1 provided with the writing element Mw1, the driving element Mv1, and the dummy element Mm1 is completed.

(Reference Voltage Generation Circuit Provided with Nonvolatile Storage Element)

Next, a reference voltage generation circuit is described with reference to FIGS. 19 to 22 as an example of the analog circuit provided with the nonvolatile storage element M1 according to this embodiment. The analog circuit to which the nonvolatile storage element M1 is applied is not limited to the reference voltage generation circuit insofar as the circuit is a circuit using the nonvolatile storage element M1 in an analog manner. For example, the nonvolatile storage element M1 is effective also in analog circuits requiring accuracy in the threshold voltage of the MOSFET, such as an operational amplifier circuit and a comparator circuit.

Next, the circuit configuration of a reference voltage generation circuit RC3 is described with reference to FIG. 19.

Figure 19:
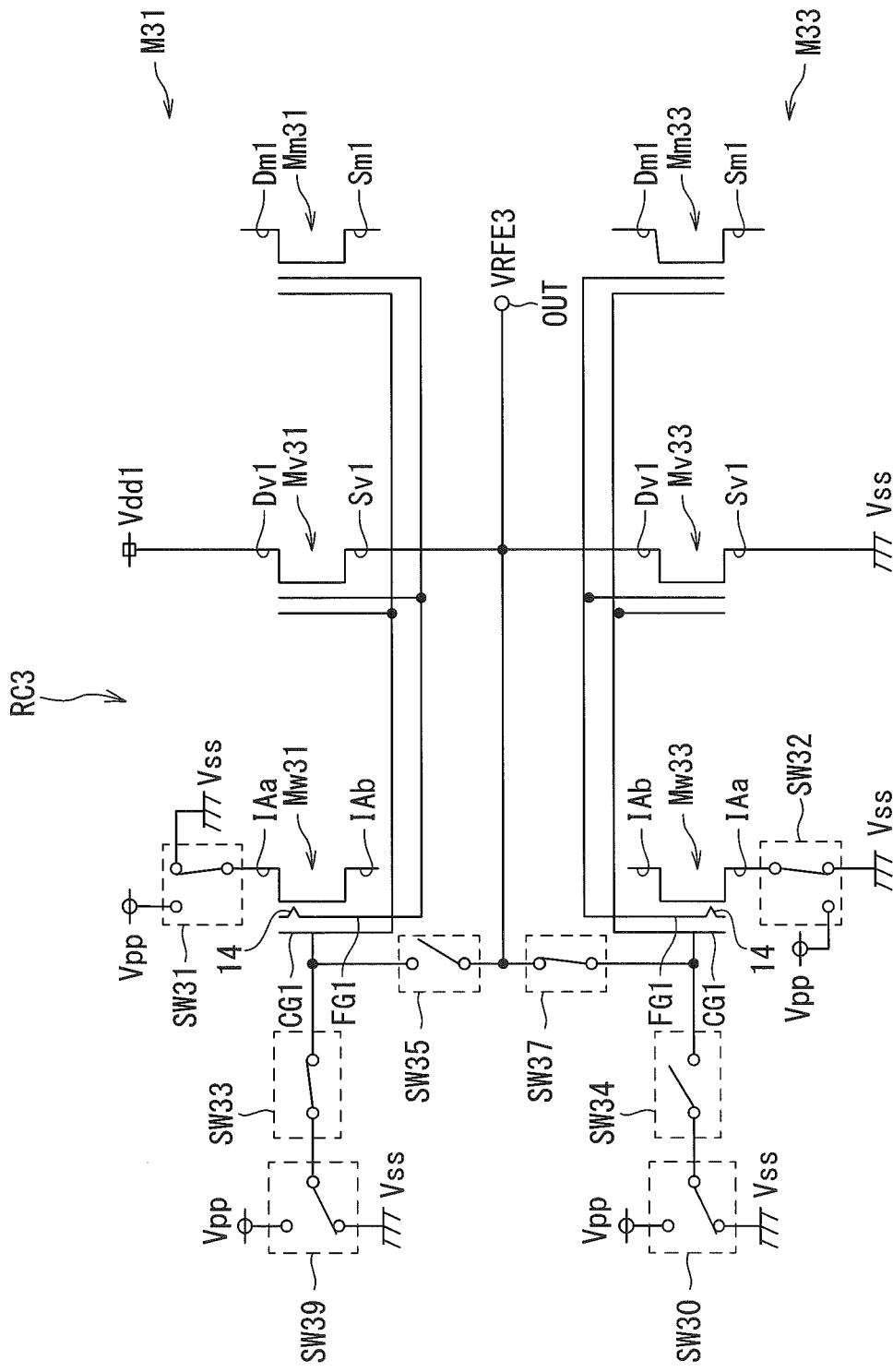
FIG. 19 is a circuit configuration diagram of a reference voltage generation circuit RC3 provided with the nonvolatile storage element according to the first embodiment of the present invention.

As illustrated in FIG. 19, the reference voltage generation circuit RC3 in this embodiment is provided with a nonvolatile storage element M31 and a nonvolatile storage element M33 connected in series. The nonvolatile storage element M31 and the nonvolatile storage element M33 each have the same configuration as that of the nonvolatile storage element M1 according to this embodiment illustrated in FIGS. 1 and 2A to 2C. The nonvolatile storage element M31 is provided with a writing element Mw31, a driving element Mv31, and a dummy element Mm31. The nonvolatile storage element M33 is provided with a writing element Mw33, a driving element Mv33, and a dummy element Mm33. The writing element Mw31 and the writing element Mw33 have the same configuration as that of the writing element Mw1 illustrated in FIGS. 1 and 2A. The driving element Mv31 and the driving element Mv33 have the same configuration as that of the driving element Mv1 illustrated in FIGS. 1 and 2B. The dummy element Mm31 and the dummy element Mm33 have the same configuration as that of the dummy element Mm1 illustrated in FIGS. 1 and 2C.

The control gate CG1 of the driving element Mv31, the control gate CG1 of the dummy element Mm31, and the control gate CG1 of the writing element Mw31 are continuously formed and shared. The floating gate FG1 of the driving element Mv31, the floating gate FG1 of the dummy element Mm31, and the floating gate FG1 of the writing element Mw31 are continuously formed and shared. The charge inlet 14 provided in the writing element Mw31 is formed in a region not in contact with a current path formed in the driving element Mv31. The charge inlet 14 provided in the writing element Mw31 is formed in a region not in contact with a current path formed in the dummy element Mm31. The charge inlet 14 provided in the writing element Mw31 is formed in a region not in contact with a current path including the drain region Dv1 and the source region Sv1 of the driving element Mv31. The charge inlet 14 provided in the writing element Mw31 is formed in a region not in contact with a current path including the drain region Dm1 and the source region Sm1 of the dummy element Mm31.

The control gate CG1 of the driving element Mv33, the control gate CG1 of the dummy element Mm33, and the control gate CG1 of the writing element Mw33 are continuously formed and shared. The floating gate FG1 of the driving element Mv33, the floating gate FG1 of the dummy element Mm33, and the floating gate FG1 of the writing element Mw33 are continuously formed and shared. The charge inlet 14 provided in the writing element Mw33 is formed in a region not in contact with a current path formed in the driving element Mv33. The charge inlet 14 provided in the writing element Mw33 is formed in a region not in contact with a current path formed in the dummy element Mm33. The charge inlet 14 provided in the writing element Mw33 is formed in a region not in contact with a current path including the drain region Dv1 and the source region Sv1 of the driving element Mv33. The charge inlet 14 provided in the writing element Mw33 is formed in a region not in contact with a current path including the drain region Dm1 and the source region Sm1 of the dummy element Mm33.

When the reference voltage generation circuit RC3 operates with the other circuits, the driving element Mv31 and the driving element Mv33 are connected in series between a driving power supply terminal Vdd1 and a low voltage supply terminal Vss. More specifically, the drain region Dv1 of the driving element Mv31 is connected to the driving power supply terminal Vdd1. The source region Sv1 of the driving element Mv33 is connected to the low voltage supply terminal Vss. The source region Sv1 of the driving element Mv31 and the drain region Dv1 of the driving element Mv33 are connected.

In the reference voltage generation circuit RC3, the dummy element Mm31 is not used and is in the floating state. Therefore, when the reference voltage generation circuit RC3 operates with the other circuits, both the source region Sm1 and the drain region Dm1 of the dummy element Mm31 are not connected to the driving power supply terminal Vdd1 and the low voltage supply terminal Vss.

In the reference voltage generation circuit RC3, the dummy element Mm33 is not used and is in the floating state. Therefore, when the reference voltage generation circuit RC3 operates with the other circuits, both the source region Sm1 and the drain region Dm1 of the dummy element Mm33 are not connected to the driving power supply terminal Vdd1 and the low voltage supply terminal Vss.

The writing element Mw31 is provided with the first impurity diffusion region IAa partially disposed below the floating gate FG1. The reference voltage generation circuit RC3 is provided with a switch SW31 having one terminal connected to the first impurity diffusion region IAa of the writing element Mw31. One of the other terminals of the switch SW31 is connected to a low voltage supply terminal Vss and the other one of the other terminals of the switch SW31 is connected to an application terminal of a pulse voltage Vpp. The reference voltage generation circuit RC3 is configured to be able to apply either one of the low voltage Vss and the pulse voltage Vpp to the first impurity diffusion region IAa of the writing element Mw31 by switching the switch SW31 as appropriate. To the second impurity diffusion region IAb of the writing element Mw31, a predetermined switch is not connected and the second impurity diffusion region IAb is in the floating state.

The writing element Mw33 is provided with the first impurity diffusion region IAa partially disposed below the floating gate FG1. The reference voltage generation circuit RC3 is provided with a switch SW32 having one terminal connected to the first impurity diffusion region IAa of the writing element Mw33. One of the other terminals of the switch SW32 is connected to a low voltage supply terminal Vss and the other one of the other terminals of the switch SW32 is connected to an application terminal of a pulse voltage Vpp. The reference voltage generation circuit RC3 is configured to be able to apply either one of the low voltage Vss and the pulse voltage Vpp to the first impurity diffusion region IAa of the writing element Mw33 by switching the switch SW32 as appropriate. To the second impurity diffusion region IAb of the writing element Mw33, a predetermined switch is not connected and the second impurity diffusion region IAb is in the floating state.

The reference voltage generation circuit RC3 is provided with a switch SW35 and a switch SW37 connected in series between the control gate CG1 of the writing element Mw31 and the control gate CG1 of the writing element Mw33. The other terminals of the switch SW35 and the switch SW37 are connected to each other. The other terminals of the switch SW35 and the switch SW37 are connected to a connection portion where the source region Sv1 of the driving element Mv31 and the drain region Dv1 of the driving element Mv33 are connected to each other. The reference voltage generation circuit RC3 is provided with a voltage output terminal OUT connected to the connection portion and outputting a reference voltage VREF.

The reference voltage generation circuit RC3 is provided with a switch SW33 having one terminal connected to the control gate CG1 of the writing element Mw31 and a switch SW39 having one terminal connected to the other terminal of the switch SW33. One of the other terminals of the switch SW39 is connected to an application terminal of a pulse voltage Vpp and the other one of the other terminals of the switch SW39 is connected to a low voltage supply terminal Vss. The reference voltage generation circuit RC3 is configured to be able to apply either one of the pulse voltage Vpp and the low voltage Vss to the control gate CG1 of the writing element Mw31 by switching the switch SW39 as appropriate when the switch SW33 is in a connection state (short-circuit state).

The reference voltage generation circuit RC3 is provided with a switch SW34 having one terminal connected to the control gate CG1 of the writing element Mw33 and a switch SW30 having one terminal connected to the other terminal of the switch SW34. One of the other terminals of the switch SW30 is connected to an application terminal of a pulse voltage Vpp and the other one of the other terminals of the switch SW30 is connected to a low voltage supply terminal Vss. The reference voltage generation circuit RC3 is configured to be able to apply either one of the pulse voltage Vpp and the low voltage Vss to the control gate CG1 of the writing element Mw33 by switching the switch SW30 as appropriate when the switch SW34 is in a connection state (short-circuit state).

The writing element Mw31 is a region present for injecting a charge into the floating gates FG1 of the driving element Mv31 and the dummy element Mm31 and does not pass a current as a transistor. Similarly, the writing element Mw33 is a region present for injecting a charge into the floating gates FG2 of the driving element Mv33 and the dummy element Mm33 and does not pass a current as a transistor. Therefore, the writing element Mw31 and the writing element Mw33 need not to have a source region or a drain region and the form is not limited insofar as a structure of having a charge inlet is provided.

Figure 20:
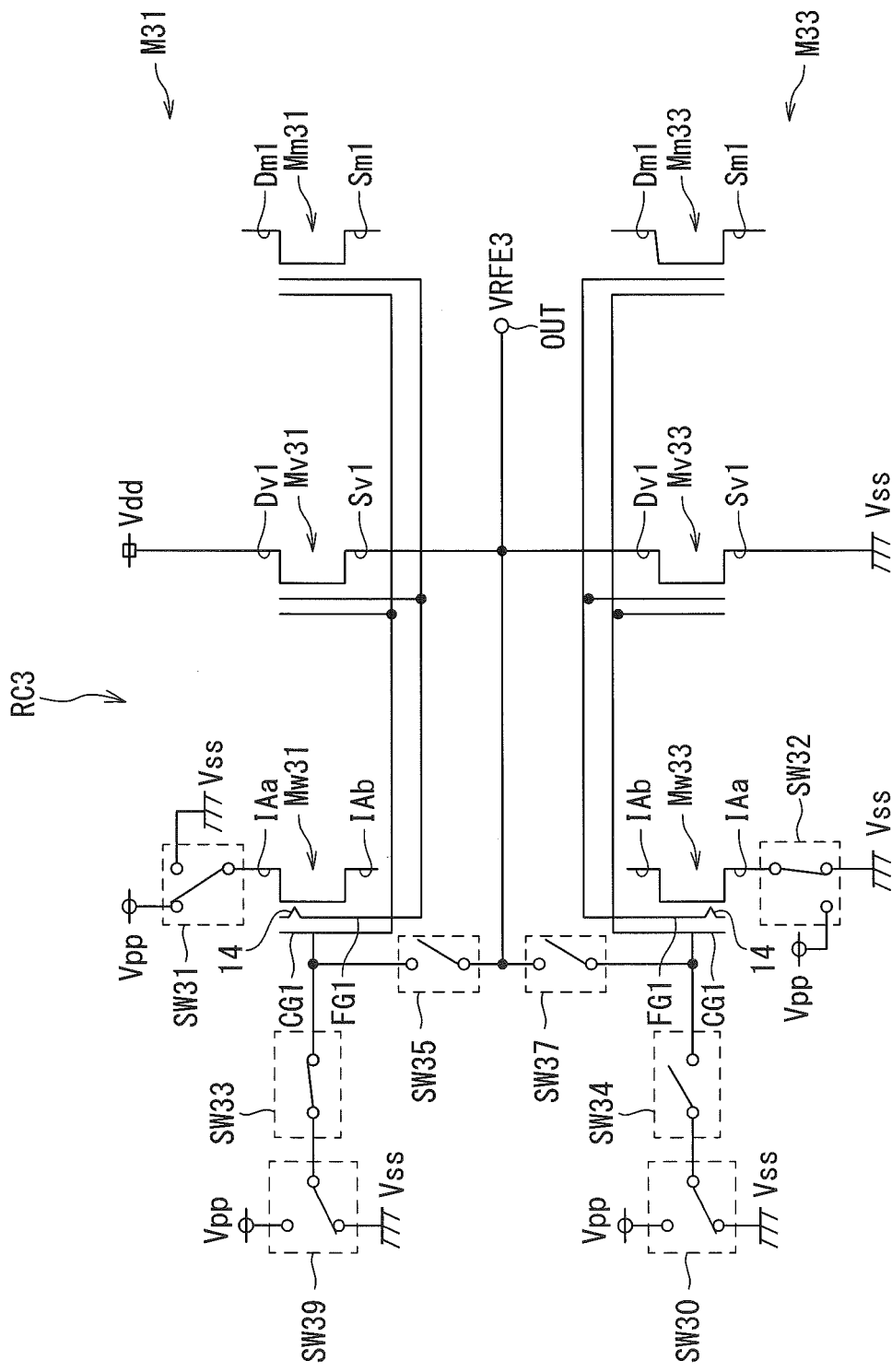
FIG. 20 is a figure for explaining the reference voltage generation circuit RC3 provided with the nonvolatile storage element according to the first embodiment of the present invention and for explaining a state of adjusting a nonvolatile storage element M31 on the upper stage side of the reference voltage generation circuit RC3 to a depression state.
Figure 21:
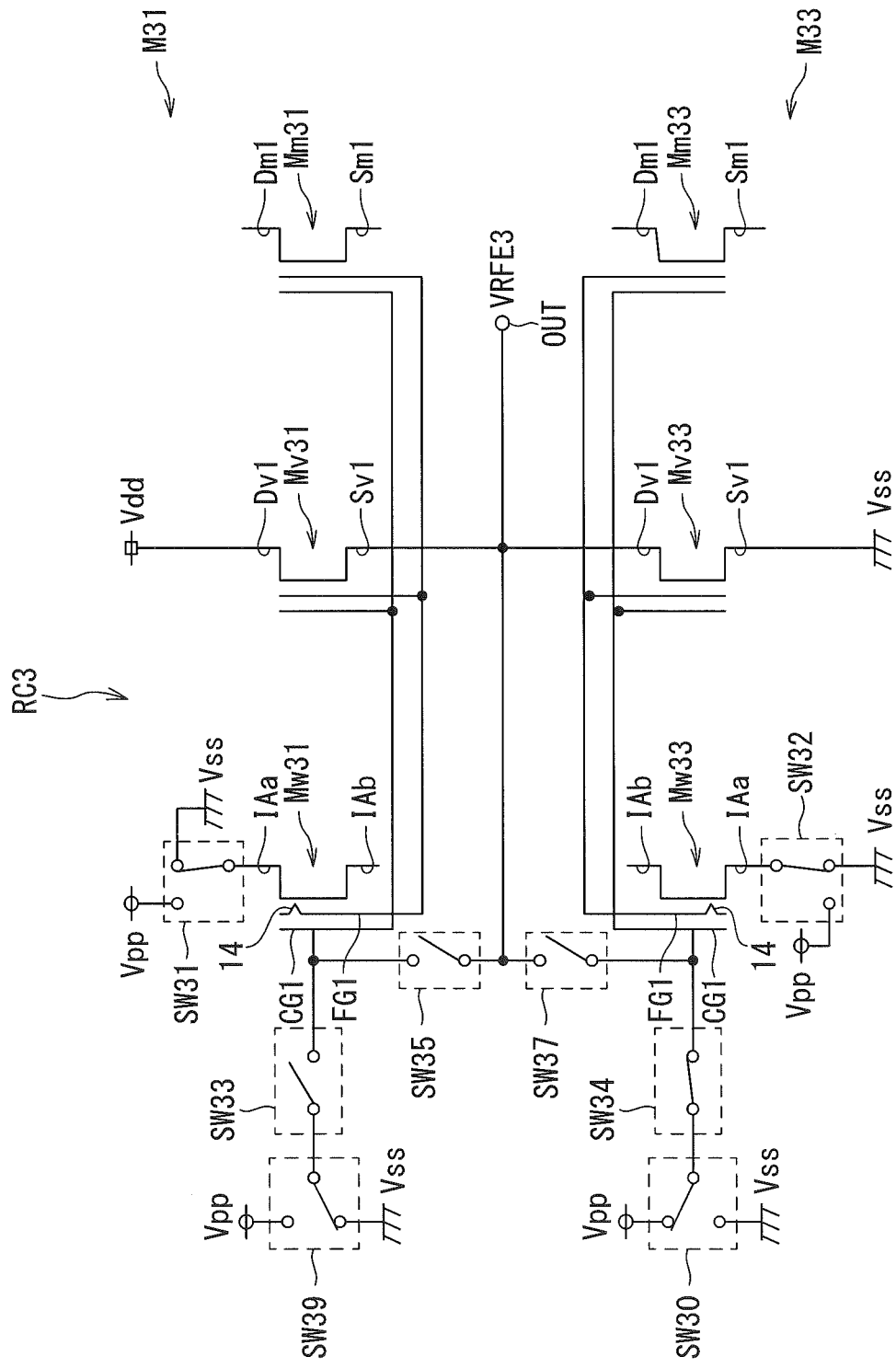
FIG. 21 is a figure for explaining the reference voltage generation circuit RC3 provided with the nonvolatile storage element according to the first embodiment of the present invention and for explaining a state of adjusting a nonvolatile storage element M33 on the lower stage side of the reference voltage generation circuit RC3 to an enhancement state.

Next, a method for adjusting the threshold voltage of the reference voltage generation circuit RC3 is described using FIGS. 20 and 21 referring to FIG. 19.

As illustrated in FIGS. 20 and 21, the reference voltage generation circuit RC3 is connected to a high voltage supply terminal Vdd in place of the driving power supply terminal Vdd1 when injecting a charge into the floating gate FG1 or emitting a charge from the floating gate FG1. In the reference voltage generation circuit RC3, a charge is injected into the floating gate FG1 through the writing elements Mw31 and Mw33 in the charge injection. As illustrated in FIG. 19, when operating the reference voltage generation circuit RC3, a current flows through the driving elements Mv31 and Mv33. In the reference voltage generation circuit RC3, the nonvolatile storage element M31 side (i.e., writing element Mw31, driving element Mv31, and dummy element Mm31) is in a depression state and the nonvolatile storage element M33 side (i.e., writing element Mw33, driving element Mv33, and dummy element Mm33) is in an enhancement state.

As illustrated in FIG. 19, the reference voltage generation circuit RC3 switches the switches SW30 to SW35, SW37, and SW39 to the following states when generating the reference voltage VREF.

Switch SW30: Arbitrary (low voltage supply terminal Vss side in FIG. 19)
Switch SW31: Low voltage supply terminal Vss side
Switch SW32: Low voltage supply terminal Vss side
Switch SW33: Connection state (short-circuit state)
Switches SW34 and SW35: Open state (open-circuit state)
Switch SW37: Connection state (short-circuit state)
Switch SW39: Low voltage supply terminal Vss side As illustrated in FIG. 20, the reference voltage generation circuit RC3 switches the switches SW30 to SW35, SW37, and SW39 to the following states in rewriting for bringing the nonvolatile storage element M31 side (i.e., writing element Mw31, driving element Mv31, and dummy element Mm31) into a depression state. Herein, a case where the threshold voltage before the adjustment on the nonvolatile storage element M31 side is higher than the threshold voltage after the adjustment is taken as an example.

Switch SW30: Arbitrary (low voltage supply terminal Vss side in FIG. 20)
Switch SW31: Pulse voltage Vpp side
Switch SW32: Low voltage supply terminal Vss side
Switch SW33: Connection state (short-circuit state)
Switch SW34: Open stat (open-circuit state)
Switches SW35 and SW37: Open stat (open-circuit state)
Switch SW39: Low voltage supply terminal Vss side Therefore, the pulse voltage Vpp is applied to the first impurity diffusion region IAa of the writing element Mw31 and the low voltage Vss is applied to the control gate CG1, and therefore an electron is emitted to the first impurity diffusion region IAa from the floating gate FG1 through the charge inlet 14 configured in the region where the tunnel insulating film is formed. Thus, the threshold voltage of the writing element Mw31 becomes low. On the contrary, when the low voltage Vss is applied to the first impurity diffusion region IAa of the writing element Mw31 and the pulse voltage Vpp is applied to the control gate CG1, an electron is injected into the floating gate FG1 from the first impurity diffusion region IAa through the charge inlet 14. Thus, the threshold voltage of the writing element Mw31 becomes high. The control gate CG1 and the floating gate FG1 are shared by the writing element Mw31, the driving element Mv31, and the dummy element Mm31. Therefore, the driving element Mv31 and the dummy element Mm31 each have the same threshold voltage as that of the writing element Mw31.

As illustrated in FIG. 21, the reference voltage generation circuit RC3 switches the switches SW30 to SW35, SW37, and SW39 to the following states in rewriting for bringing the nonvolatile storage element M33 side (i.e., writing element Mw33, driving element Mv33, and dummy element Mm33) into an enhancement state. Herein, a case where the threshold voltage before the adjustment on the nonvolatile storage element M33 side is lower than the threshold voltage after the adjustment is taken as an example.

Switch SW30: Pulse voltage Vpp side
Switch SW31: Low voltage supply terminal Vss side
Switch SW32: Low voltage supply terminal Vss sde
Switch SW33: Open state (open-circuit state)
Switch SW34: Connection state (short-circuit state)
Switches SW35 and SW37: Open state (open-circuit state)
Switch SW39: Arbitrary (low voltage supply terminal Vss side in FIG. 21)

Therefore, the low voltage Vss is applied to the first impurity diffusion region IAa of the writing element Mw33 and the pulse voltage Vpp is applied to the control gate CG1, and therefore an electron is injected into the floating gate FG1 from the first impurity diffusion region IAa through the charge inlet 14 configured in the region where the tunnel insulating film is formed. Thus, the threshold voltage of the writing element Mw33 becomes high. On the contrary, when the pulse voltage Vpp is applied to the first impurity diffusion region IAa of the writing element Mw33 and the low voltage Vss is applied to the control gate CG1, an electron is emitted to the first impurity diffusion region IAa from the floating gate FG1 through the charge inlet 14. Thus, the threshold voltage of the writing element Mw33 becomes low. The control gate CG1 and the floating gate FG1 are shared by the writing element Mw33, the driving element Mv33, and the dummy element Mm33. Therefore, the driving element Mv33 and the dummy element Mm33 each have the same threshold voltage as that of the writing element Mw33.

It is a matter of course that the nonvolatile storage elements of the same type are used as the MOSFETs configuring the reference voltage generation circuit RC3, i.e., transistor, in this embodiment. Therefore, in the reference voltage generation circuit RC3, the conductance or the temperature characteristics can be made identical in the two transistors, and thus the ideally translated characteristics of the two transistors can be obtained.

Figure 22:
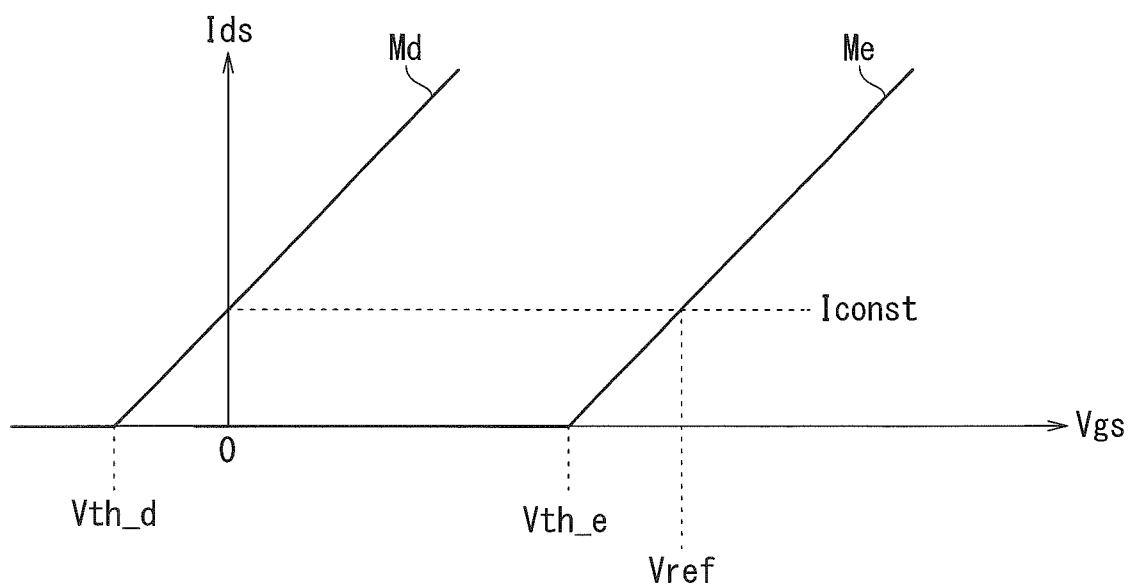
FIG. 22 is a figure illustrating an example of current/voltage characteristics of a depression transistor Md and an enhancement transistor Me.

FIG. 22 illustrates an example of the current/voltage characteristics of a depression type transistor and an enhancement type transistor. The horizontal axis represents a gate-source voltage Vgs between the control gate and the source region. The vertical axis represents a drain current Ids. "Md" represents the current/voltage characteristics of the depression type transistor. "Me" represents the current/voltage characteristics of the enhancement type transistor. Since the gate-source voltage Vgs is fixed at 0 V, the depression type transistor Md passes a drain current of a constant current Iconst insofar as the drain-source voltage between the drain region and the source region is in a saturated region. The drain current of the constant current Iconst flows also into the enhancement type transistor Me connected in series to the depression type transistor Md. Therefore, the gate-source voltage Vgs of the enhancement type transistor Me in which Ids=Iconst is established can be extracted from the voltage output terminal OUT as the reference voltage Vref (i.e., a reference voltage VREF).

When the threshold voltage of the depression type transistor Md is expressed as Vth_d and the threshold voltage of the enhancement type transistor Me is expressed as Vth_e, the reference voltage Vref is the sum of the absolute value of the threshold voltage Vth_d and the absolute value of the threshold voltage Vth_e, i.e., the reference voltage Vref can be expressed as "Vref=|Vth_d|+|Vth_e|.

The translated current/voltage characteristics of the two transistors illustrated in FIG. 22 cannot be strictly achieved because the conductance or the temperature characteristics varies/vary in each transistor when the depression type transistor and the enhancement type transistor are configured using different types of transistors. More specifically, in a conventional reference voltage generation circuit, temperature characteristics arise also in a reference voltage extracted from a voltage output terminal. In contrast thereto, in the reference voltage generation circuit in this embodiment using the nonvolatile storage elements of the same type, the reference voltage Vref free from manufacturing variations or temperature characteristics can be obtained. Moreover, it is one of advantages that the reference voltage Vref to be extracted can be set to an arbitrary value by adjusting the threshold voltage Vth_e of the enhancement type transistor. Furthermore, it is also one of advantages that the amount of a current passed into the reference voltage generation circuit can be set to an arbitrary value by adjusting the threshold voltage Vth_d of the depression type transistor.

The reference voltage Vref can be adjusted by adjusting at least one of the threshold voltage Vth_d of the depression type transistor Md and the threshold voltage Vth_e of the enhancement type transistor Me as appropriate. For example, when the threshold voltage Vth_d of the depression type transistor Md is made high in a state where the threshold voltage Vth_e of the enhancement type transistor Me is fixed, the current value of the constant current Iconst becomes large, and therefore the reference voltage Vref also becomes high. For example, when the threshold voltage Vth_d of the depression type transistor Md is made high in a state where the threshold voltage Vth_e of the enhancement type transistor Me is fixed, the current value of the constant current Iconst becomes small, and therefore the reference voltage Vref also becomes low. For example, when the threshold voltage Vth_e of the enhancement type transistor Me is made low in a state where the threshold voltage Vth_d of the depression type transistor Md is fixed, the current value of the constant current Iconst does not vary but the reference voltage Vref becomes low. For example, when the threshold voltage Vth_e of the enhancement type transistor Me is made high in a state where the threshold voltage Vth_d of the depression type transistor Md is fixed, the current value of the constant current Iconst does not vary but the reference voltage Vref becomes high.

As described above, this embodiment can achieve a nonvolatile storage element having high charge retention characteristics while giving flexibility to the layout of the elements. Therefore, a highly accurate analog circuit can be achieved in which the degradation of electric characteristics is effectively suppressed and the influence of manufacturing variations is very low. Moreover, according to this embodiment, variations in electric characteristics can be reduced. A nonvolatile storage element having excellent charge retention characteristics and an analog circuit provided with the same can be achieved.

The reference voltage generation circuit RC3 in this embodiment has the nonvolatile storage element M1 of the configuration illustrated in FIGS. 1 and 2A to 2C, and therefore a current path in the charge injection and the charge emission and a current path during the operation of the reference voltage generation circuit RC3 (in driving of driving the other circuits) are separable. Thus, the reference voltage generation circuit RC3 can prevent unexpected rewriting of the nonvolatile storage element and can achieve an improvement of the reliability.

The nonvolatile storage element M1 according to this embodiment is provided with the writing element Mw1 and the driving element Mv1 each having the semiconductor substrate 9A, the floating gate FG1 provided above the semiconductor substrate 9A, and the control gate CG2 disposed above the floating gate FG1 to be insulated from the floating gate FG1. The writing element Mw1 is provided with the first impurity diffusion region IAa provided in the semiconductor substrate 9A and partially disposed below the floating gate FG1 and the tunnel insulating film 25 at least partially disposed between the floating gate FG1 and the first impurity diffusion region IAa and having an area ratio to the floating gate FG1 of 0.002 or more and 1 or less. The driving element Mv1 is provided with the drain region D1 provided in the semiconductor substrate 9A and formed to be electrically isolated from the first impurity diffusion region IAa and the source region S1 provided in the semiconductor substrate 9A.

The nonvolatile storage element M1 having such a configuration can suppress the first mode retention degradation and the second mode retention degradation.

The nonvolatile storage element M1 according to this embodiment is provided with the floating gate FG1 having an area of 30 μm$^2$ or more. Thus, the nonvolatile storage element M1 according to this embodiment is usable as a MOSFET suitable for an analog circuit, such as a reference voltage generating circuit. In the analog circuit provided with the nonvolatile storage element M1 according to this embodiment, a characteristic fluctuation due to the retention degradation is suppressed and the influence of manufacturing variations or temperature characteristics can be reduced. In the nonvolatile storage element M1, charge injection into to the floating gate FG1 or charge emission from the floating gate FG1 does not occur during the operation of the analog circuit. This makes it easier for the nonvolatile storage element M1 to suppress the characteristic fluctuation due to the retention degradation of the analog circuit.

Second Embodiment

A nonvolatile storage element according to a second embodiment of the present invention is described with reference to FIGS. 23A to 23C and FIGS. 24 to 26. First, the schematic configuration of a nonvolatile storage element M2 according to this embodiment is described with reference to FIGS. 23A to 23C.

Figure 23A:
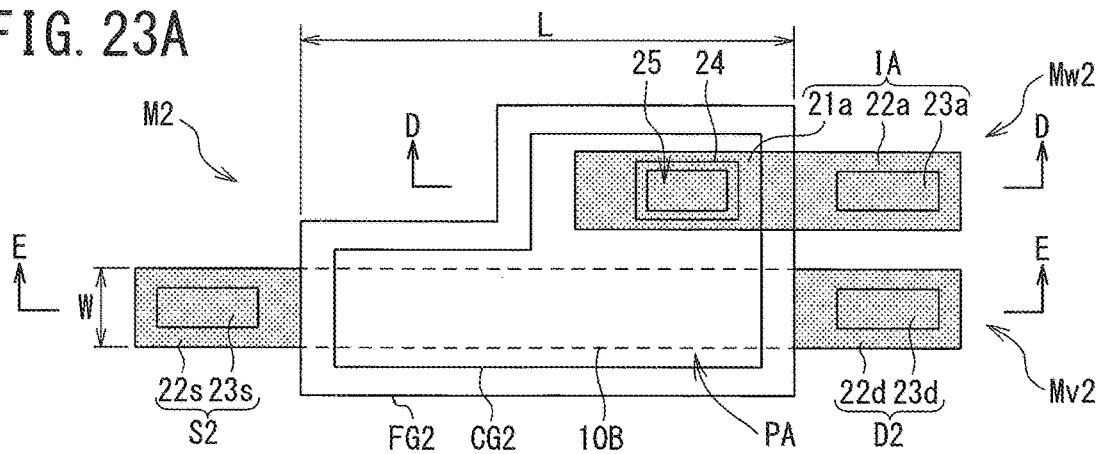
Figure 23B:
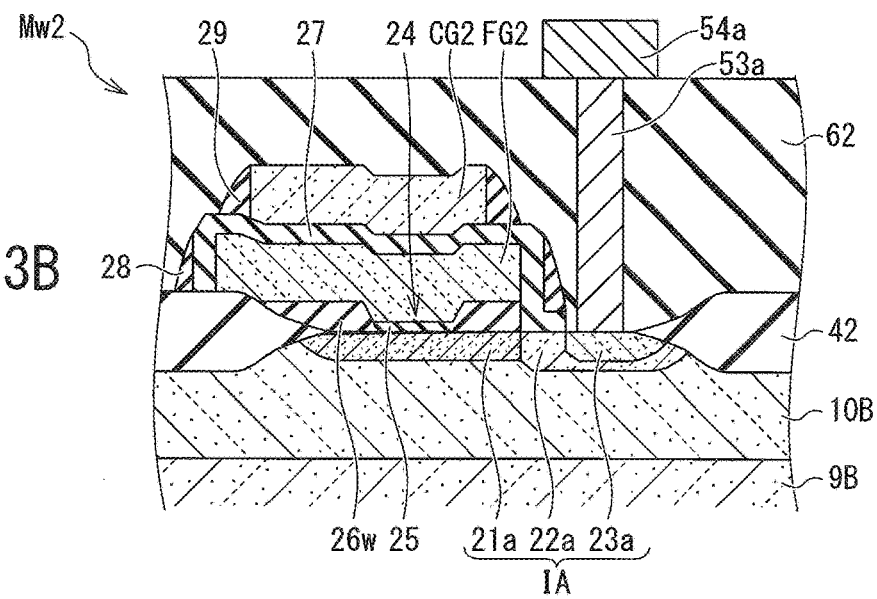
Figure 23C:
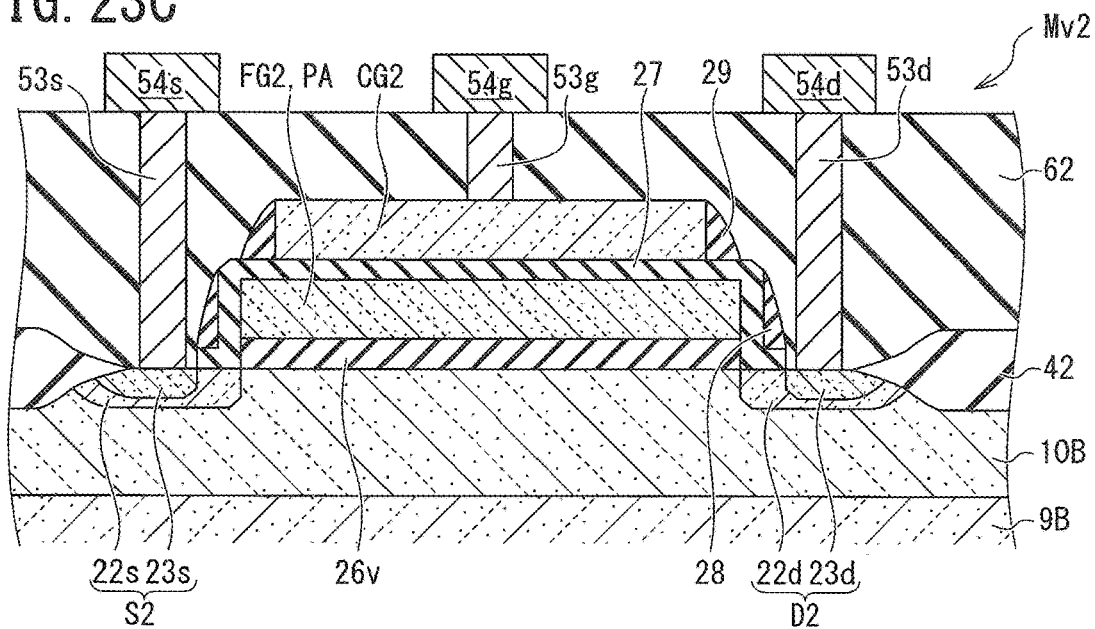

As illustrated in FIGS. 23A to 23C, the nonvolatile storage element M2 according to this embodiment has a FLOTOX structure as with the nonvolatile storage element M1 according to the first embodiment. The nonvolatile storage element M2 according to this embodiment is not limited to the FLOTOX type and may have the other structures insofar as the nonvolatile storage element M2 is an active element (transistor) having a charge retention region. The nonvolatile storage element M2 is element-isolated by an element isolation region 42 formed in a P-type semiconductor substrate 9B, for example, from another nonvolatile storage element (not illustrated) formed on the same semiconductor substrate 9B. The nonvolatile storage element M2 is provided with a writing element Mw2 and a driving element (an example of the driving MOSFET) Mv2 formed on the same semiconductor substrate 9B. As illustrated in FIG. 23A, the writing element Mw2 and the driving element Mv2 are disposed adjacent to each other.

As illustrated in FIG. 23B, the writing element Mw2 provided in the nonvolatile storage element M2 is provided with the semiconductor substrate 9B and a gate insulating film 26w provided on the semiconductor substrate 9B. In the semiconductor substrate 9B, a P-well region 10B is formed. The gate insulating film 26w is made of silicon dioxide ($SiO_2$) and is disposed on the P-well region 10B. The gate insulating film 26w may be made of silicon nitride (SiN) without being limited to the silicon dioxide.

The writing element Mw2 is provided with a floating gate FG2 provided above the semiconductor substrate 9B. A part of the floating gate FG2 is disposed on the gate insulating film 26w. The floating gate FG2 is made of polysilicon. The entire floating gate FG2 has an area of 30 $\mu m^2$ or more and 27000 $\mu m^2$ or less in a plan view of the nonvolatile storage element M2 illustrated in FIG. 23A. Herein, the "entire floating gate FG2" means the floating gate provided in one nonvolatile storage element M2 and does not mean the floating gate in predetermined portions, such as a portion where the writing element Mw2 is provided and a portion where the driving element Mv2 is provided. Therefore, the "entire floating gate FG2" is distinguished from a "specific region PA of the floating FG12" (details are described later) in the portion where the driving element Mv2 is provided. Hereinafter, the "floating gate FG2" means the "entire floating gate FG2" unless otherwise specified as the "specific region PA of the floating gate FG2". The lower limit value of the area of the floating gate FG2 is specified for differentiation from a case where a nonvolatile storage element is used as a memory storing digital data. The area of the floating gate FG2 in this embodiment is 590 $\mu m^2$, for example, in the plan view of the nonvolatile storage element M2. Herein, the plan view refers to a state where the plane (element formation surface) of the semiconductor substrate 9B on which the gate insulating film 26w, the floating gate FG2, and the like are formed is viewed in an orthogonal direction to element formation surface. The floating gate FG2 in this embodiment has an L shape in the plan view of the nonvolatile storage element M2 but may have the other shapes without being limited to the L shape.

The writing element Mw2 is provided with a control gate CG2 which is disposed above the floating gate FG2 to be insulated from the floating gate FG2. The control gate CG2 is made of polysilicon, for example. The control gate CG2 has an area smaller than that of the floating gate FG2 in the plan view of the nonvolatile storage element M2. Although the control gate CG2 has the same shape as that of the floating gate FG2 and has a shape in which the size is one size smaller than that thereof in the plan view of the nonvolatile storage element M2, the control gate CG2 may have the other shapes insofar as at least part thereof is disposed on the floating gate FG2. For example, the control gate CG2 may have a shape projecting outward from the floating gate FG2 in the plan view of the nonvolatile storage element M2. At this time, a contact plug (details are described later) for applying a voltage to the control gate CG2 may be formed in a partial region of the control gate CG2 projecting outward from the floating gate FG2.

The writing element Mw2 is provided with an impurity diffusion region (an example of the first region) IA provided in the semiconductor substrate 9B and partially disposed in a part below the floating gate FG2. The impurity diffusion region IA is provided in the P-well region 10B.

The impurity diffusion region IA has a diffusion layer 21a, an N-type LDD layer 22a, and a contact layer 23a having an impurity concentration higher than that of the LDD layer 22a. The contact layer 23a is provided in the LDD layer 22a. The contact layer 23a is provided in order to take an ohmic contact between the impurity diffusion region IA and a plug 53a (details are described later). The impurity diffusion region IA is formed over a part below the floating gate FG2 and a part of the side (one of both sides) of the floating gate FG2 in the plan view of the nonvolatile storage element M2 (see FIG. 23A). The diffusion layer 21a is provided in a part below the floating gate FG2. The LDD layer 22a and the contact layer 23a are provided in a part of the side of the floating gate FG2.

The writing element Mw2 is provided with a tunnel insulating film 25 at least partially disposed between the floating gate FG2 and the impurity diffusion region IA and having an area ratio to the floating gate FG2 of 0.002 or more and 1 or less. In this embodiment, the entire tunnel insulating film 25 is disposed between the floating gate FG2 and the diffusion layer 21a. The tunnel insulating film 25 is formed to be smaller than the floating gate FG2 in the plan view of the nonvolatile storage element M2. The area of the tunnel insulating film 25 is 0.06 $\mu m^2$ or more and 54 $\mu m^2$ or less in the plan view of the nonvolatile storage element M2. The area of the tunnel insulating film 25 in this embodiment is 25.2 $\mu m^2$, for example. Therefore, in this embodiment, the ratio of the area of the tunnel insulating film 25 to the area of the floating gate FG2 (area ratio), i.e., a value determined by dividing the area of the tunnel insulating film 25 by the area of the floating gate FG2, is 0.043. Since the area ratio of the area the tunnel insulating film 25 to the area (for example, 590 $\mu m^2$) of the floating gate FG2 is 0.043, which is larger than 0.002, the nonvolatile storage element M2 can improve the first mode retention degradation as described in the first embodiment.

In order to perform writing of injecting a charge into the floating gate FG2 or extracting a charge from the floating gate FG2 by FN tunneling, the tunnel insulating film 25 is formed to have a thickness of 7 nm or more and 12 nm or less. In this embodiment, the film thickness of the tunnel insulating film 25 is 9.8 nm, for example. When the film thickness of the tunnel insulating film 25 is 7 to 12 nm, direct tunneling of a charge becomes more unlikely to occur and a charge is more easily retained in the floating gate FG2 as compared with the case where the film thickness is less than 7 nm. On the other hand, when the film thickness of the tunnel insulating film 25 is 7 to 12 nm, the injection of a charge into the floating gate FG2 and the extraction of a charge from the floating gate FG2 can be accelerated as compared with the case where the film thickness is larger than 12 nm. The tunnel insulating film 25 is formed to have a film thickness smaller than that of the gate insulating film 26w. A region of the floating gate FG2 corresponding to the tunnel insulating film 25 serves as a charge inlet 24 injecting a charge into the floating gate FG2 or emitting a charge from the floating gate FG2. More specifically, the floating gate FG2 has the charge inlet 24 for injecting a charge or emitting a charge and functions as a charge retention region.

As illustrated in FIG. 23C, the driving element Mv2 provided in the nonvolatile storage element M2 is provided with the semiconductor substrate 9B and a gate insulating film 26v provided on the semiconductor substrate 9B. In this embodiment, the gate insulating film 26v of the driving element Mv2 is formed to be isolated from the gate insulating film 26w of the writing element Mw2 by the element isolation region 42. The gate insulating film 26v of the driving element Mv2 and the gate insulating film 26w of the writing element Mw2 may be continuously formed and shared. The gate insulating film 26v and the gate insulating film 26w are simultaneously formed of the same material in the same manufacturing process in the formation regions of the driving element Mv2 and the writing element Mw2.

The driving element Mv2 is provided with the floating gate FG2 disposed on the gate insulating film 26v. As with the gate insulating film 26v, the floating gate FG2 is formed continuously formed in and shared by the driving element Mv2 and the writing element Mw2. However, the floating gate FG2 may be isolated in the driving element Mv2 and the writing element Mw2. When the floating gate is isolated, the floating gate of the driving element Mv2 and the floating gate of the writing element Mw2 need to be electrically connected by a plug and a metal wiring line, for example, because the same voltage is applied thereto. The floating gate FG2 is simultaneously formed of the same material in the same manufacturing process in the formation regions of the driving element Mv2 and the writing element Mw2.

The gate insulating film 26v in the driving element Mv2 is disposed between the floating gate FG2 and the semiconductor substrate 9B in the portion where the driving element Mv2 is provided (i.e., specific region PA) and has a film thickness larger than that of the tunnel insulating film 25. The gate insulating film 26v in the driving element Mv2 has an almost constant film thickness. No tunnel insulating film is provided in the region where the gate insulating film 26v is formed in the driving element Mv2. Therefore, the surface where the gate insulating film 26v contacts the floating gate FG2 in the driving element Mv2 has a flat shape.

The tunnel insulating film 25 in this embodiment is formed in an opening portion in which an insulating film for forming the gate insulating film 26w is opened as with the tunnel insulating film 25 in the first embodiment. Therefore, the gate insulating film 26w in the writing element Mw2 has a level difference due to an opening portion in the region where the tunnel insulating film 25 is provided. Therefore, the contact surface with the floating gate FG2 is flatter in the gate insulating film 26v in the driving element Mv2 than in the gate insulating film 26w in the writing element Mw2.

The driving element Mv2 is provided with a source region S2 provided in the semiconductor substrate 9B and a drain region (an example of the second region) D2 provided in the semiconductor substrate 9B and formed to be electrically isolated from the impurity diffusion region IA. The source region S2 and the drain region D2 are provided in the P-well region 10B. The drain region D2 and the source region S2 are defined by a current flowing direction. Therefore, when a direction of passing a current is reversed to a direction of passing a current assumed in the driving element Mv2 illustrated in FIGS. 23A to 23C, the drain region D2 illustrated in FIGS. 23A to 23C serves as the source region S2 and the source region S2 serves as the drain region D2.

The source region S2 is provided in a part of the side (one of both sides) of the floating gate FG2 in the plan view of the nonvolatile storage element M2 (see FIG. 23A). The source region S2 has an N-type LDD layer 22s and a source layer 23s having an impurity concentration higher than that of the LDD layer 22s. The source layer 23s is provided in the LDD layer 22s. The source layer 23s is provided in order to take an ohmic contact between the source region S2 and a plug 53s (details are described later).

The drain region D2 has an N-type LDD layer 22d and a drain layer 23d having an impurity concentration higher than that of the LDD layer 22d. The drain layer 23d is provided in the LDD layer 22d. The drain layer 23d is provided in order to take an ohmic contact between the drain region D2 and a plug 53d (details are described later). The drain region D2 is provided in a part of the side (the other side of both sides) of the floating gate FG2 in the plan view of the nonvolatile storage element M2 (see FIG. 23A). The source region S2 and the drain region D2 are provided with the floating gate FG2 interposed therebetween in the plan view of the nonvolatile storage element M2.

As illustrated in FIGS. 23B and 23C, the nonvolatile storage element M2 is provided with an insulating film 27 disposed on the floating gate FG2 and a sidewall 28 formed around the insulating film 27. The control gate CG2 is formed on the insulating film 27. The floating gate FG2 and the control gate CG2 are insulated by the insulating film 27. The insulating film 27 is configured combining a silicon oxide film and a silicon nitride film and has an oxide/nitride/oxide (ONO) structure. The insulating film 27 is provided covering the upper surface and the side surface of the floating gate FG2 and the side surfaces of the gate insulating films 26w and 26v. The insulating film 27 and the sidewall 28 are continuously formed in and shared by the driving element Mv2 and the writing element Mw2. However, at least one of the insulating film 27 and the sidewall 28 may be isolated in the driving element Mv2 and the writing element Mw2. The insulating film 27 and the sidewall 28 each are simultaneously formed of the same material in the same manufacturing process in the formation regions of the driving element Mv2 and the writing element Mw2.

The insulating film 27 is disposed covering the floating gate FG2 over the writing element Mw2 and the driving element Mv2. The sidewall 28 is disposed surrounding the insulating film 27 in a level difference portion of the lateral wall of the insulating film 27 over the writing element Mw2 and the driving element Mv2. Therefore, the writing element Mw2 and the driving element Mv2 each have the insulating film 27 and the sidewall 28.

The nonvolatile storage element M2 has halogen (for example, fluorine) distributing in at least part of the gate insulating films 26w and 26v, the tunnel insulating film 25, and the insulating film 27. In this embodiment, halogen is contained in all of the gate insulating films 26w and 26v, the tunnel insulating film 25, and the insulating film 27. Due to the fact that the tunnel insulating film 25 contains halogen (for example, fluorine), the defect density of the tunnel insulating film 25 decreases.

The nonvolatile storage element M2 is provided with the control gate CG2 disposed on the insulating film 27 and a sidewall 29 formed around the control gate CG2. The control gate CG2 and the sidewall 29 are continuously formed in and shared by the driving element Mv2 and the writing element Mw2. However, at least one of the control gate CG2 and the sidewall 29 may be isolated in the driving element Mv2 and the writing element Mw2. When the control gate is isolated, the control gate of the driving element Mv2 and the control gate of the writing element Mw2 need to be electrically connected by a plug and a metal wiring line, for example, because the same voltage is applied thereto. The control gate CG2 and the sidewall 29 each are simultaneously formed of the same material in the same manufacturing process in the formation regions of the driving element Mv2 and the writing element Mw2.

The nonvolatile storage element M2 is provided with an interlayer insulating film 62 formed on the element formation surface of the semiconductor substrate 9B. The interlayer insulating film 62 is formed at least in regions where the control gate CG2, the insulating film 27, the sidewalls 28 and 29, the source region S2, the drain region D2, and the element isolation region 42 are provided. The interlayer insulating film 62 is continuously formed in and shared by the driving element Mv2 and the writing element Mw2. The interlayer insulating film 62 exhibits the function as a protective film protecting the control gate CG2, the impurity diffusion region IA, the drain region D2, the source region S2, and the like.

The nonvolatile storage element M2 is provided with a plug 53*g* embedded in an opening portion exposing a part of the control gate CG2 to the bottom surface and formed in the interlayer insulating film 62 and a metal wiring line 54*g* electrically connected to the plug 53*g* and formed on the interlayer insulating film 62. The metal wiring line 54*g* and the control gate CG2 are electrically connected through the plug 53*g*. This makes it possible to apply a voltage of a predetermined level to the control gate CG2 from the metal wiring line 54*g* through the plug 53*g*.

The driving element Mv2 is provided with a plug 53*s* embedded in an opening portion exposing a part of the source layer 23*s* to the bottom surface and formed in the interlayer insulating film 62 and a metal wiring line 54*s* electrically connected to the plug 53*s* and formed on the interlayer insulating film 62. The metal wiring line 54*s* and the source region S2 are electrically connected through the plug 53*s*. This makes it possible to apply a voltage of a predetermined level to the source region S2 from the metal wiring line 54*s* through the plug 53*s*.

The driving element Mv2 is provided with a plug 53*d* embedded in an opening portion exposing a part of the second drain layer 73*d* to the bottom surface and formed in the interlayer insulating film 62 and a metal wiring line 54*d* electrically connected to the plug 53*d* and formed on the interlayer insulating film 62. The metal wiring line 54*d* and the drain region D2 are electrically connected through the plug 53*d*. This makes it possible to apply a voltage of a predetermined level to the drain region D2 from the metal wiring line 54*d* through the plug 53*d*.

The writing element Mw2 is provided with a plug 53*a* embedded in an opening portion exposing a part of the contact layer 23*a* to the bottom surface and formed in the interlayer insulating film 62 and a metal wiring line 54*a* electrically connected to the plug 53*a* and formed on the interlayer insulating film 62. The metal wiring line 54*a* and the impurity diffusion region IA are electrically connected through the plug 53*a*. This makes it possible to apply a voltage of a predetermined level to the impurity diffusion region IA from the metal wiring line 54*a* through the plug 53*a*.

As illustrated in FIG. 23C, the driving element Mv2 configures a MOSFET. The nonvolatile storage element M2 is configured to operate with the other circuits by causing the driving element Mv2 to function as a MOSFET. More specifically, a current path is formed in the drain region D2 and the source region S2 of the driving element Mv2 when the nonvolatile storage element M2 operates with the other circuits. On the other hand, as illustrated in FIG. 23B, the impurity diffusion region IA is in a floating state and the writing element Mw2 does not configure a MOSFET. The writing element Mw2 functions as a voltage application element in writing of injecting a charge into the floating gate FG2 or emitting a charge from the floating gate FG2. More specifically, the impurity diffusion region IA functions as a writing voltage application region and the drain region D2 functions as a drain region of the driving MOSFET.

The FLOTOX nonvolatile storage element M2 according to this embodiment is used as the MOSFET in an analog circuit having an area of the floating gate FG2 of 30 $\mu m^2$ or more as with the nonvolatile storage element M1 according to the first embodiment. In this case, by setting the area of the tunnel insulating film 25 to 50 $\mu m^2$ or less, the probability that a charge in the floating gate FG2 excited by thermal energy jumps over the energy barrier of the tunnel insulating film 25 and leaks is suppressed and the nonvolatile storage element M2 can suppress the second mode retention degradation. Moreover, by setting the area ratio of the tunnel insulating film 25 to the floating gate FG2 to 0.002 or more, the amount of charges passing through the tunnel insulating film 25 per unit area thereof is suppressed and the nonvolatile storage element M2 can also suppress the first mode retention degradation. This makes it possible for the nonvolatile storage element M2 to minimize the influence on analog circuit characteristics caused by the first mode retention degradation and the second mode retention degradation.

The nonvolatile storage element M2 according to this embodiment is provided with the writing element Mw2 having the diffusion layer 21*a* disposed below the tunnel insulating film 25 and the driving element Mv2 configuring a MOSFET not having a tunnel insulating film between the floating gate FG2 shared by the writing element Mw2 and the drain region D2. The impurity diffusion region IA having the diffusion layer 21*a* and the drain region D2 are electrically isolated. Thus, while driving the driving element Mv2, an excessive voltage or current is not generated in the tunnel insulating film 25 through the impurity diffusion region IA. Therefore, charge injection into the floating gate FG2 through the tunnel insulating film 25 due to an electric field during the operation in which the nonvolatile storage element M2 drives the other circuits or injection of a hot carrier generated by a current into the floating gate FG2 does not occur. As a result, the nonvolatile storage element M2 is suitable for the use as a more reliable MOSFET in an analog circuit.

The specific region PA which is a region of the floating gate FG2 in the portion where the driving element Mv2 is provided may have an area of 17.5 $\mu m^2$ or more, for example. When the gate width of the specific region PA of the floating gate FG2 is defined as W and the gate length of the specific region PA of the floating gate FG2 is defined as L (see FIG. 23A), the gate width W and the gate length L of the specific region PA of the floating gate FG2 may satisfy the relationship of Expression (4) described above. When the floating gate FG2 has an area larger than 30 μm², the specific region PA of the floating gate FG2 may have an area of 30 μm² or more. Thus, the nonvolatile storage element M2 according to this embodiment obtains the same effects as those of the nonvolatile storage element M1 according to the first embodiment.

Next, a method for adjusting the threshold voltage Vth of the nonvolatile storage element M2 is described.

For example, when 19 V is applied to the control gate CG2 and 0 V is applied to the impurity diffusion region IA, an electron is injected into the floating gate FG2 through the tunnel insulating film 25, and then the floating gate FG2 is brought into a negatively charged state. In this state, the floating gate FG2 acts in a direction of suppressing an electric field applied to the gate insulating film 26v when a positive bias is applied to the control gate CG2. Therefore, the threshold voltage Vth increases in the driving element Mv2 of the nonvolatile storage element M2 and the driving element Mv2 functions as enhancement type MOSFETs.

On the other hand, when 0 V is applied to the control gate CG2 and 19 V is applied to the drain region D2, for example, an electron is extracted from the floating gate FG2 through the tunnel insulating film 25, and then the floating gate FG2 is brought into a positively charged state. In this state, the floating gate FG2 acts in a direction of intensifying an electric field applied to the gate insulating films 26v when a positive bias is applied to the control gate CG2. Therefore, the threshold voltage Vth decreases in the driving element Mv2 of the nonvolatile storage element M2 and the driving element Mv2 functions as a depression type MOSFET. Thus, the threshold voltage Vth of the nonvolatile storage element M2 can be adjusted to a desired value by controlling the injection of a charge into the floating gate FG2 or the extraction of a charge from the floating gate FG2.

A description of a method for manufacturing the nonvolatile storage element M2 according to this embodiment is omitted because the shape of a resist mask for forming the impurity diffusion region IA, the gate insulating film 26w, the tunnel insulating film 25, and the like is different from that of the nonvolatile storage element M1 according to the first embodiment but the formation material and the formation order of each film are the same as that of the nonvolatile storage element M1 according to the first embodiment.

(Reference Voltage Generation Circuit Provided with Nonvolatile Storage Element)

Next, a reference voltage generation circuit is described with reference to FIGS. 24 to 26 as an example of the analog circuit provided with the nonvolatile storage element M2 according to this embodiment. The analog circuit to which the nonvolatile storage element M2 is applied is not limited to the reference voltage generation circuit insofar as the circuit is a circuit using the nonvolatile storage element M2 in an analog manner. For example, the nonvolatile storage element M2 is effective also in analog circuits requiring accuracy in the threshold voltage of the MOSFET, such as an operational amplifier circuit and a comparator circuit.

Figure 24:
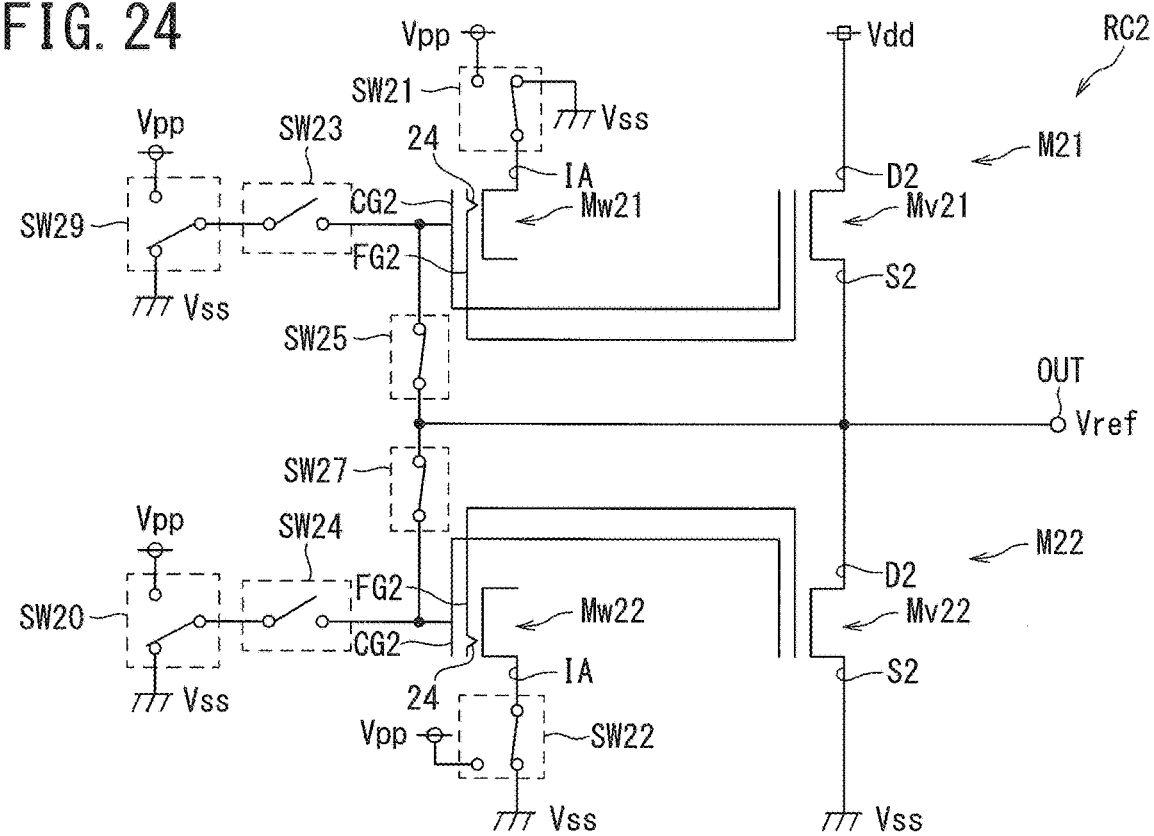
FIG. 24 is a circuit configuration diagram for explaining a reference voltage generation circuit RC2 provided with the nonvolatile storage element according to the second embodiment of the present invention.

As illustrated in FIG. 24, the reference voltage generation circuit RC2 in this embodiment is provided with a nonvolatile storage element M21 and a nonvolatile storage element M22 connected in series. The nonvolatile storage element M21 and the nonvolatile storage element M22 each have the same configuration as that of the nonvolatile storage element M2 according to this embodiment illustrated in FIGS. 23A to 23C. The nonvolatile storage element M21 is provided with a writing element Mw21 and a driving element Mv21. The nonvolatile storage element M22 is provided with a writing element Mw22 and a driving element Mv22. The writing element Mw21 and the writing element Mw22 have the same configuration as that of the writing element Mw2 illustrated in FIG. 23B. The driving element Mv21 and the driving element Mv22 have the same configuration as that of the driving element Mv2 illustrated in FIG. 23C.

The control gate CG2 of the driving element Mv21 and the control gate CG2 of the writing element Mw21 are shared. The floating gate FG2 of the driving element Mv21 and the floating gate FG2 of the writing element Mw21 are shared. The charge inlet 24 (see FIGS. 23A and 23B) provided in the writing element Mw21 is formed in a region not in contact with a current path formed in the driving element Mv21. The charge inlet 24 provided in the writing element Mw21 is formed in a region not in contact with a current path including the drain region D2 and the source region S2 of the driving element Mv21.

The control gate CG2 of the driving element Mv22 and the control gate CG2 of the writing element Mw22 are shared. The floating gate FG2 of the driving element Mv22 and the floating gate FG2 of the writing element Mw22 are shared. The charge inlet 24 (see FIGS. 23A and 23B) provided in the writing element Mw22 is formed in a region not in contact with a current path formed in the driving element Mv22. The charge inlet 24 provided in the writing element Mw22 is formed in a region not in contact with a current path including the drain region D2 and the source region S2 of the driving element Mv22.

The driving element Mv21 and the driving element Mv22 are connected in series between a high voltage supply terminal Vdd and a low voltage supply terminal Vss. Hereinafter, the mark "Vdd" is used also as the mark of a high voltage output from the high voltage supply terminal Vdd. More specifically, the drain region D2 of the driving element Mv21 is connected to the high voltage supply terminal Vdd. The source region S2 of the driving element Mv22 is connected to the low voltage supply terminal Vss. The source region S2 of the driving element Mv21 and the drain region D2 of the driving element Mv22 are connected.

The writing element Mw21 is provided with the impurity diffusion region IA partially disposed below the floating gate FG2. The reference voltage generation circuit RC2 is provided with a switch SW21 having one terminal connected to the impurity diffusion region IA of the writing element Mw21. One of the other terminals of the switch SW21 is connected to a low voltage supply terminal Vss and the other one of the other terminals of the switch SW21 is connected to an application terminal of a pulse voltage Vpp. The reference voltage generation circuit RC2 is configured to be able to apply either one of the low voltage Vss and the pulse voltage Vpp to the impurity diffusion region IA of the writing element Mw21 by switching the switch SW21 as appropriate.

The writing element Mw22 is provided with the impurity diffusion region IA partially disposed below the floating gate FG2. The reference voltage generation circuit RC2 is provided with a switch SW22 having one terminal connected to the impurity diffusion region IA of the writing element Mw22. One of the other terminals of the switch SW22 is connected to the low voltage supply terminal Vss and the other one of the other terminals of the switch SW22 is connected to an application terminal of the pulse voltage Vpp. The reference voltage generation circuit RC2 is configured to be able to apply either one of the low voltage Vss and the pulse voltage Vpp to the impurity diffusion region IA of the writing element Mw22 by switching the switch SW22 as appropriate.

The reference voltage generation circuit RC2 is provided with a switch SW25 and a switch SW27 connected in series between the control gate CG2 of the writing element Mw21 and the control gate CG2 of the writing element Mw22. The other terminals of the switch SW25 and the switch SW27 are connected to each other. The other terminals of the switch SW25 and the switch SW27 are connected to a connection portion where the source region S2 of the driving element Mv21 and the drain region D2 of the driving element Mv22 are connected to each other. The reference voltage generation circuit RC2 is provided with a voltage output terminal OUT connected to the connection portion and outputting the reference voltage Vref.

The reference voltage generation circuit RC2 is provided with a switch SW23 having one terminal connected to the control gate CG2 of the writing element Mw21 and a switch SW29 having one terminal connected to the other terminal of the switch SW23. One of the other terminals of the switch SW29 is connected to an application terminal of a pulse voltage Vpp and the other one of the other terminals of the switch SW29 is connected to a low voltage supply terminal Vss. The reference voltage generation circuit RC2 is configured to be able to apply either one of the pulse voltage Vpp and the low voltage Vss to the control gate CG2 of the writing element Mw21 by switching the switch SW29 as appropriate when the switch SW23 is in a connection state (short-circuit state).

The reference voltage generation circuit RC2 is provided with a switch SW24 having one terminal connected to the control gate CG2 of the writing element Mw22 and a switch SW20 having one terminal connected to the other terminal of the switch SW24. One of the other terminals of the switch SW20 is connected to an application terminal of a pulse voltage Vpp and the other one of the other terminals of the switch SW20 is connected to a low voltage supply terminal Vss. The reference voltage generation circuit RC2 is configured to be able to apply either one of the pulse voltage Vpp and the low voltage Vss to the control gate CG2 of the writing element Mw22 by switching the switch SW20 as appropriate when the switch SW24 is in a connection state (short-circuit state).

The writing element Mw21 is a region present for injecting a charge into the floating gate FG2 of the driving element Mv21 and does not pass a current as a transistor. Similarly, the writing element Mw22 is a region present for injecting a charge into the floating gate FG2 of the driving element Mv22 and does not pass a current as a transistor. Therefore, the writing element Mw21 and the writing element Mw22 need not to have a source region or a drain region and the form is not limited insofar as a structure of having a charge inlet is provided.

As illustrated in FIG. 24, a charge is injected into the floating gate FG2 through the writing elements Mw21 and Mw22 in the charge injection in the reference voltage generation circuit RC2. When operating the reference voltage generation circuit RC2, a current flows through the driving elements Mv21 and Mv22. In the reference voltage generation circuit RC2, the nonvolatile storage element M21 side (i.e., writing element Mw21 and driving element Mv21) is in a depression state and the nonvolatile storage element M22 side (i.e., writing element Mw22 and driving element Mv22) is in an enhancement state.

As illustrated in FIG. 24, the reference voltage generation circuit RC2 switches the switches SW20 to SW25, SW27, and SW29 to the following states when generating the reference voltage Vref (i.e., when the reference voltage generation circuit RC2 operates).

Switch SW20: Arbitrary (low voltage supply terminal Vss side in FIG. 24)
Switch SW21: Low voltage supply terminal Vss side
Switch SW22: Low voltage supply terminal Vss side
Switches SW23 and SW24: Open state (open-circuit state)
Switch SW25, SW27: Connection state (short-circuit state)
Switch SW29: Arbitrary (low voltage supply terminal Vss side in FIG. 24)

Figure 25:
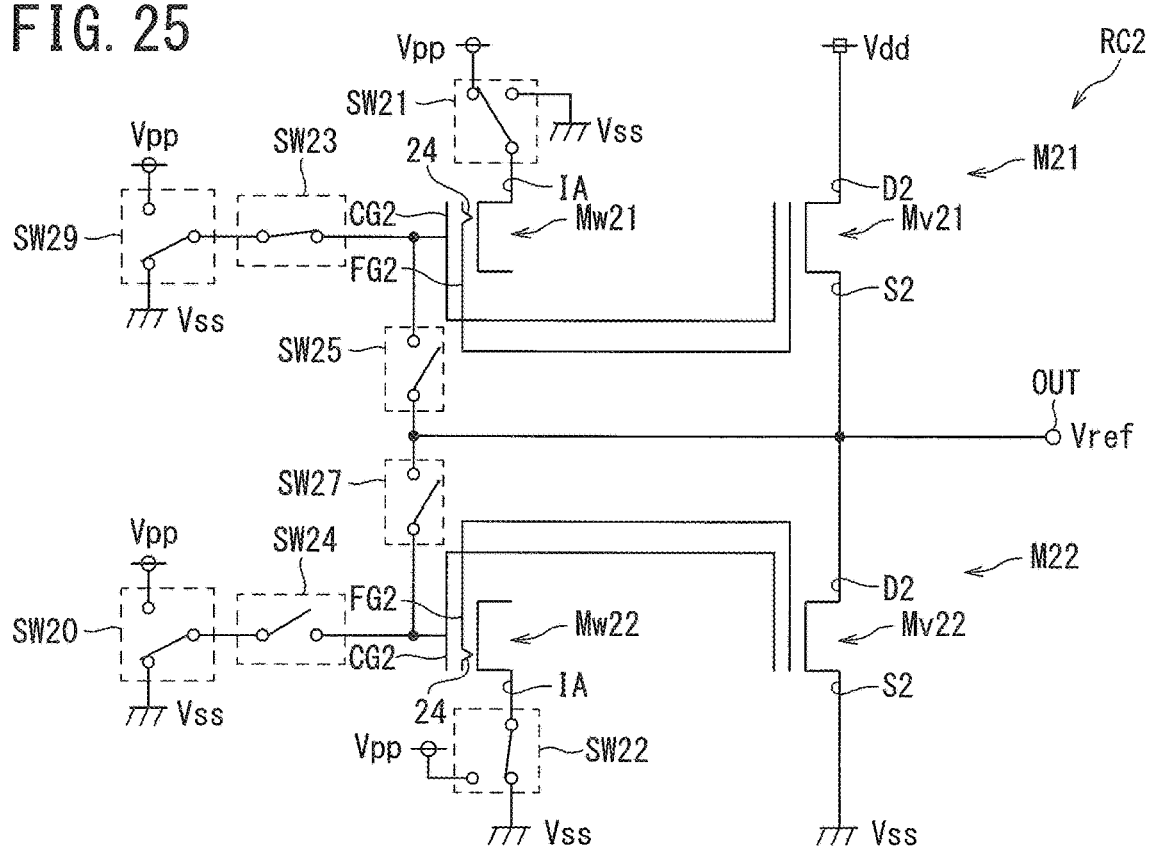
FIG. 25 is a circuit configuration diagram for explaining the reference voltage generation circuit RC2 provided with the nonvolatile storage element according to the second embodiment of the present invention and for explaining a state of adjusting a nonvolatile storage element M21 on the upper stage side of the reference voltage generation circuit RC2 to a depression state.

As illustrated in FIG. 25, the reference voltage generation circuit RC2 switches the switches SW20 to SW25, SW27, and SW29 to the following states in rewriting for bringing the nonvolatile storage element M21 side (i.e., writing element Mw21 and driving element Mv21) into a depression state. Herein, a case where the threshold voltage before the adjustment on the nonvolatile storage element M21 side is higher than the threshold voltage after the adjustment is taken as an example.

Switch SW20: Arbitrary (low voltage supply terminal Vss side in FIG. 25)
Switch SW21: Pulse voltage Vpp side
Switch SW22: Low voltage supply terminal Vss side
Switch SW23: Connection state (short-circuit state)
Switch SW24: Open state (open-circuit state)
Switches SW25 and SW27: Open-circuit state
Switch SW29: Low voltage supply terminal Vss side Therefore, the pulse voltage Vpp is applied to the impurity diffusion region IA of the writing element Mw21 and the low voltage Vss is applied to the control gate CG2, and therefore an electron is emitted to the drain region D2 from the floating gate FG2 through the charge inlet 24 configured in a region where the tunnel insulating film is formed. Thus, the threshold voltage of the writing element Mw21 becomes low. On the contrary, when the low voltage Vss is applied to the drain region D2 of the writing element Mw21 and the pulse voltage Vpp is applied to the control gate CG2, an electron is injected into the floating gate FG2 from the drain region D2 through the charge inlet 24. Thus, the threshold voltage of the writing element Mw21 becomes high. The control gate CG2 and the floating gate FG2 are shared by the writing element Mw21 and the driving element Mv21. Therefore, the driving element Mv21 has the same threshold voltage as that of the writing element Mw21.

Figure 26:
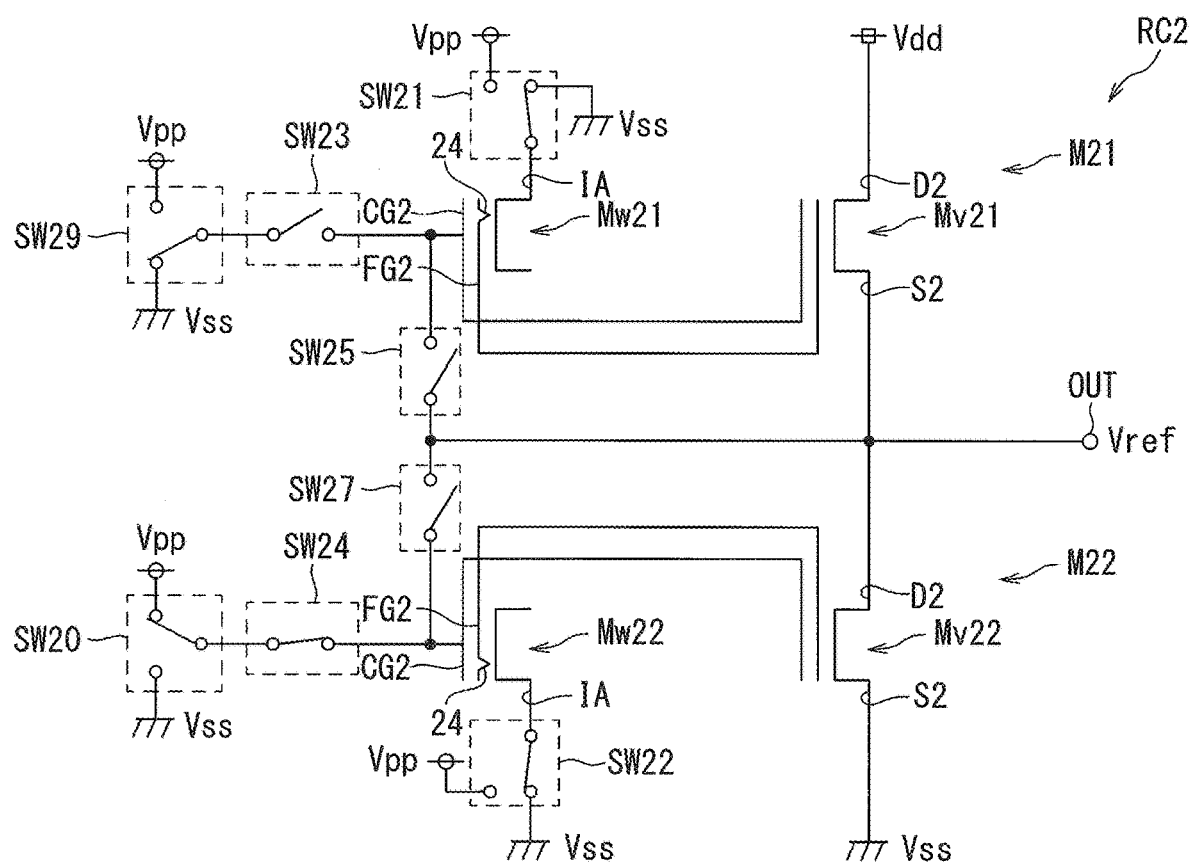
FIG. 26 is a circuit configuration diagram for explaining the reference voltage generation circuit RC2 provided with the nonvolatile storage element according to the second embodiment of the present invention and for explaining a state of adjusting a nonvolatile storage element M22 on the lower stage side of the reference voltage generation circuit RC2 to an enhancement state.

As illustrated in FIG. 26, the reference voltage generation circuit RC2 switches the switches SW20 to SW25, SW27, and SW29 to the following states in rewriting for bringing the nonvolatile storage element M22 side (i.e., writing element Mw22 and driving element Mv22) into an enhancement state. Herein, a case where the threshold voltage before the adjustment on the nonvolatile storage element M22 side is lower than the threshold voltage after the adjustment is taken as an example.

Switch SW20: Pulse voltage Vpp side
Switch SW21: Low voltage supply terminal Vss side
Switch SW22: Low voltage supply terminal Vss side
Switch SW23: Open state (open-circuit state)
Switch SW24: Connection state (short-circuit state)
Switch SW25, SW27: Open state (open-circuit state)
Switch SW29: Arbitrary (low voltage supply terminal Vss side in FIG. 26)

Therefore, the low voltage Vss is applied to the impurity diffusion region IA of the writing element Mw22 and the pulse voltage Vpp is applied to the control gate CG2, and therefore an electron is injected into the floating gate FG2 from the impurity diffusion region IA through the charge inlet 24 configured in the region where the tunnel insulating film is formed. Thus, the threshold voltage of the writing element Mw22 becomes high. On the contrary, when the pulse voltage Vpp is applied to the impurity diffusion region IA of the writing element Mw22 and the low voltage Vss is applied to the control gate CG2, an electron is emitted to the impurity diffusion region IA from the floating gate FG2 through the charge inlet 24. Thus, the threshold voltage of the writing element Mw22 becomes low. The control gate CG2 and the floating gate FG2 are shared by the writing element Mw22 and the driving element Mv22. Therefore, the driving element Mv22 has the same threshold voltage as that of the writing element Mw22.

As described above, this embodiment can achieve a nonvolatile storage element having high charge retention characteristics while giving flexibility to the layout of the elements. Therefore, a highly accurate analog circuit in which the degradation of electric characteristics is effectively suppressed and the influence of manufacturing variations is very low can be achieved. Moreover, according to this embodiment, variations in electric characteristics can be reduced. A nonvolatile storage element having excellent charge retention characteristics and an analog circuit provided with the same can be achieved.

The nonvolatile storage element according to this embodiment and the analog circuit provided with the same can adjust the threshold voltage by adjusting the amount of charges of the floating gates FG2 of the nonvolatile storage elements M21 and M22, and therefore the same effects as those of the nonvolatile storage element according to the first embodiment and the analog circuit provided with the same are obtained.

The reference voltage generation circuit RC2 in this embodiment is provided with the nonvolatile storage element M2 of the configuration illustrated in FIGS. 23A to 23C, and therefore the current path in the charge injection and the charge emission and the current path during the operation of the reference voltage generation circuit RC2 (in driving of driving the other circuits) are separable. Thus, the reference voltage generation circuit RC2 can prevent unexpected rewriting of the nonvolatile storage element and can achieve an improvement of the reliability.

The nonvolatile storage element M2 according to this embodiment is provided with the writing element Mw2 and the driving element Mv2 having the semiconductor substrate 9B, the floating gate FG2 provided above the semiconductor substrate 9B, and the control gate CG2 disposed to be insulated from the floating gate FG2. The writing element Mw2 is provided with the impurity diffusion region IA provided in the semiconductor substrate 9B and partially disposed below the floating gate FG2 and the tunnel insulating film 25 at least partially disposed between the floating gate FG2 and the first impurity diffusion region IAa and having an area ratio to the floating gate FG2 of 0.002 or more and 1 or less. The driving element Mv2 is provided with the drain region D2 provided in the semiconductor substrate 9A and formed to be electrically isolated from the impurity diffusion region IA and the source region S2 provided in the semiconductor substrate 9A.

The nonvolatile storage element M2 having such a configuration can suppress the first mode retention degradation and the second mode retention degradation.

The nonvolatile storage element M2 according to this embodiment is provided with the floating gate FG2 having an area of 30 $\mu m^2$ or more. Thus, the nonvolatile storage element M2 according to this embodiment is usable as a MOSFET suitable for an analog circuit, such as a reference voltage generating circuit. In the analog circuit provided with the nonvolatile storage element M2 according to this embodiment, a characteristic fluctuation due to the retention degradation is suppressed and the influence of manufacturing variations or temperature characteristics can be reduced. Furthermore, in the nonvolatile storage element M2, charge injection into to the floating gate FG2 or charge emission from the floating gate FG2 does not occur during the operation of the analog circuit. This makes it easier for the nonvolatile storage element M2 to suppress the characteristic fluctuation due to the retention degradation of the analog circuit.

Third Embodiment

A nonvolatile storage element according to a third embodiment of the present invention is described with reference to FIGS. 27A and 27B to 31. First, the schematic configuration of the nonvolatile storage element according to this embodiment is described with reference to FIGS. 27A and 27B.

Figure 27A:
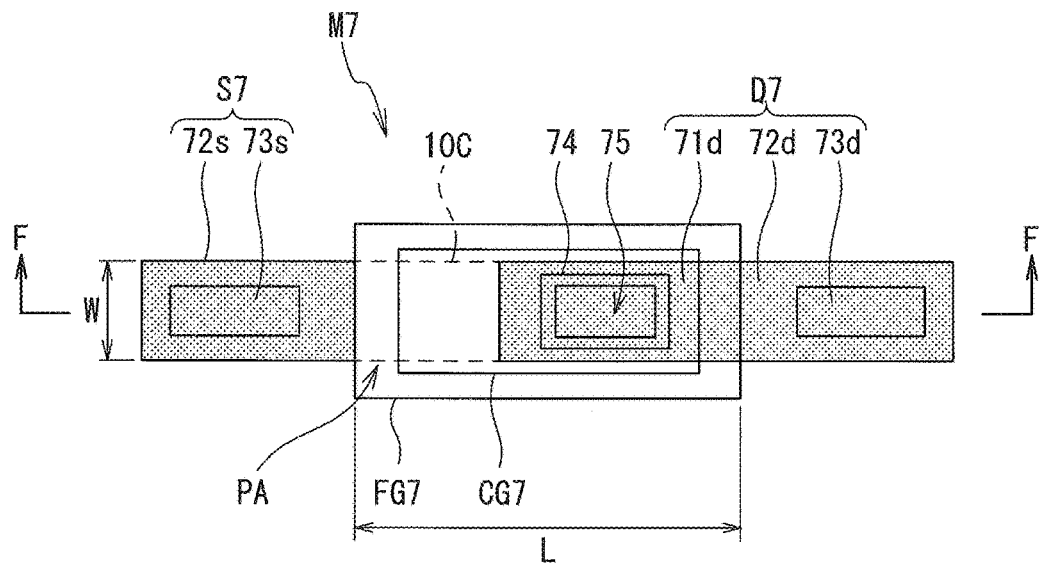
Figure 27B:
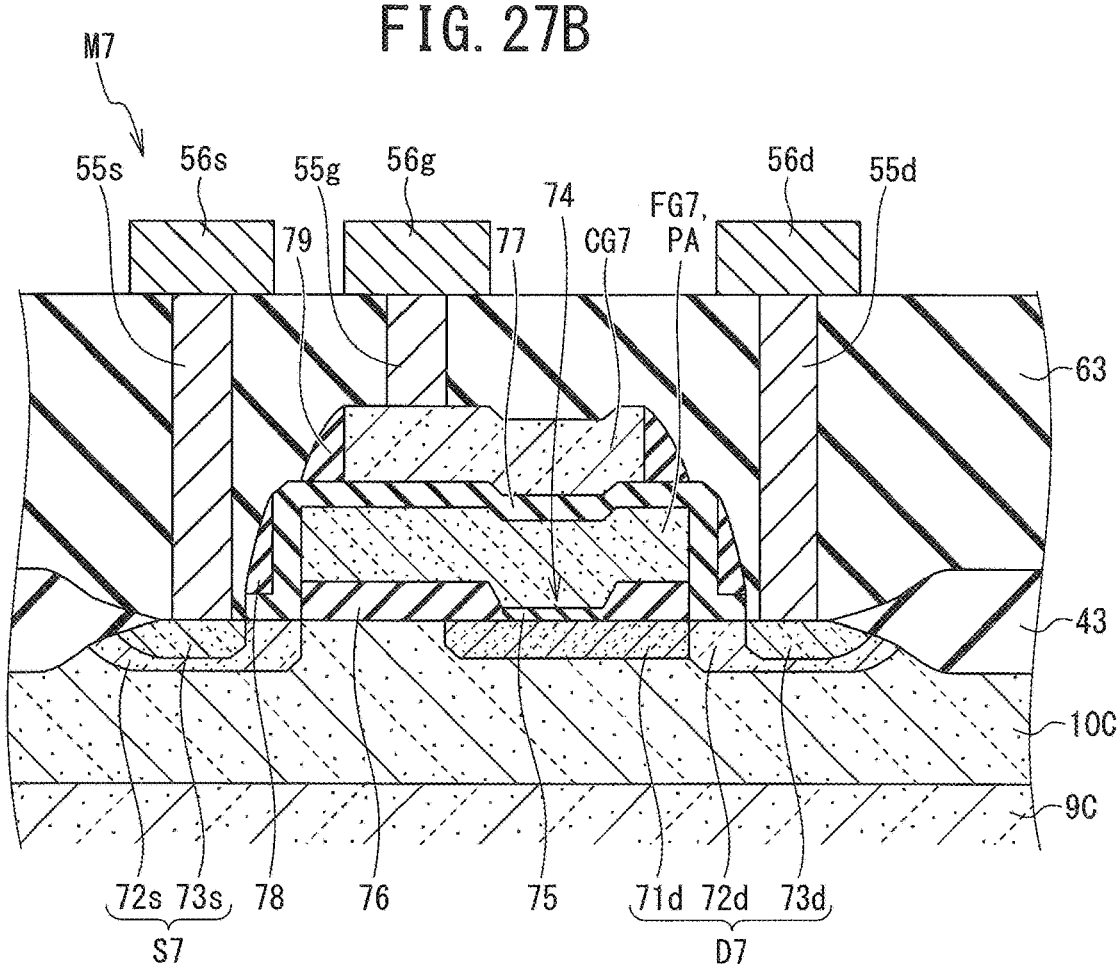

As illustrated in FIG. 27A, a wiring element and a driving element are not isolated and a writing operation and a driving operation are performed by one element in a nonvolatile storage element M7 according to this embodiment unlike the nonvolatile storage elements M1 and M2 according to the first and second embodiments, respectively. As illustrated in FIG. 27B, the nonvolatile storage element M7 according to this embodiment has a FLOTOX type structure as with the nonvolatile storage element M1 according to the first embodiment. The nonvolatile storage element M7 according to this embodiment is not limited to the FLOTOX type and may have the other structures insofar as the nonvolatile storage element M7 is an active element (transistor) having a charge retention region.

The nonvolatile storage element M7 according to this embodiment is element-isolated by an element isolation region 43 formed in a P-type semiconductor substrate 9C, for example, from another nonvolatile storage element (not illustrated) formed on the same semiconductor substrate 9C.

As illustrated in FIG. 27B, the nonvolatile storage element M7 according to this embodiment is provided with the semiconductor substrate 9C and a gate insulating film 76 provided on the semiconductor substrate 9C. A P-well region 10C is formed in the semiconductor substrate 9C. The gate insulating film 76 is made of silicon dioxide ($SiO_2$) and is disposed on the P-well region 10C. The gate insulating film 76 may be made of silicon nitride (SiN) without being limited to the silicon dioxide.

The nonvolatile storage element M7 is provided with a floating gate FG7 provided above the semiconductor substrate 9C. A part of the floating gate FG7 is disposed on the gate insulating film 76. The floating gate FG7 is made of polysilicon. The entire floating gate FG7 has an area of 30 $\mu m^2$ or more and 27000 $\mu m^2$ or less in a plan view of the nonvolatile storage element M7 illustrated in FIG. 27A. Herein, the "entire floating gate FG7" means the floating gate provided in one nonvolatile storage element M7. A region of the floating gate in portions functioning as a writing element and a driving element (i.e., specific region of the floating gate) is formed to be smaller than the entire floating gate FG7. Therefore, the "entire floating gate FG7" is distinguished from the "specific region PA of the floating FG7" in the portions functioning as the writing element and the driving element. Hereinafter, the "floating gate FG7"

means the "entire floating gate FG7" unless otherwise specified as the "specific region PA of the floating gate FG7". The lower limit value of the area of the floating gate FG7 is specified for differentiation from a case where a nonvolatile storage element is used as a memory storing digital data. The area of the floating gate FG7 in this embodiment is 1422 µm², for example, in the plan view of the nonvolatile storage element M7. Herein, the plan view refers to a state where the plane (element formation surface) of the semiconductor substrate 9C on which the gate insulating film 76, the floating gate FG7, and the like are formed is viewed in an orthogonal direction to the element formation surface. The floating gate FG7 in this embodiment has a rectangular shape in the plan view of the nonvolatile storage element M7 but may have the other shapes without being limited to the rectangular shape.

The nonvolatile storage element M7 is provided with an insulating film 77 disposed on the floating gate FG7 and a sidewall 78 formed around the insulating film 77. The insulating film 77 is configured combining a silicon oxide film and a silicon nitride film and has an oxide/nitride/oxide (ONO) structure. The insulating film 77 is provided covering the upper surface and the side surface of the floating gate FG7 and the side surface of the gate insulating film 76.

The nonvolatile storage element M7 is provided with a control gate CG7 disposed above the floating gate FG7 to be insulated from the floating gate FG7 and a sidewall 79 formed around the control gate CG7. The control gate CG7 is made of polysilicon, for example. The control gate CG7 has an area smaller than that of the floating gate FG7 in the plan view of the nonvolatile storage element M7 (see FIG. 27A). The control gate CG7 has a rectangular shape in the plan view of the nonvolatile storage element M7 but may have the other shapes insofar as the control gate CG7 is disposed on the floating gate FG7 without being limited to the rectangular shape. The control gate CG7 is disposed on the insulating film 77. The control gate CG7 is insulated from the floating gate FG7 by the insulating film 77.

The nonvolatile storage element M7 is provided with a source region S7 provided in the semiconductor substrate 9C and a drain region (an example of the first region) D7 provided in the semiconductor substrate 9C and partially disposed below the floating gate FG7. The source region S7 and the drain region D7 are provided in the P-well region 10C. The drain region D7 and the source region S7 are defined by a current flowing direction. Therefore, when a direction of passing a current is reversed to a direction of passing a current assumed in the nonvolatile storage element M7 illustrated in FIGS. 27A and 27B, the drain region D7 illustrated in FIGS. 27A and 27B serves as the source region S7 and the source region S7 serves as the drain region D7.

The source region S7 is provided in a part of the side (one of both sides) of the floating gate FG7 in the plan view of the nonvolatile storage element M7 (see FIG. 27A). The source region S7 has an N-type LDD layer 72s and a source layer 73s having an impurity concentration higher than that of the LDD layer 72s. The source layer 73s is provided in the LDD layer 72s. The source layer 73s is provided in order to take an ohmic contact between the source region S7 and a plug 55s (details are described later).

The drain region D7 has a first drain layer 71d, an N-type LDD layer 72d, and a second drain layer 73d having an impurity concentration higher than that of the LDD layer 72d. The second drain layer 73d is provided in the LDD layer 72d. The drain layer 73d is provided in order to take an ohmic contact between the drain region D7 and a plug 55d (details are described later). The drain region D7 is provided over a part below the floating gate FG7 and the side (the other side of both sides) of the floating gate FG7 in the plan view of the nonvolatile storage element M7 (see FIG. 27A). The first drain layer 71d is provided below the floating gate FG7 and the LDD layer 72d and the second drain layer 73d are provided on the side of the floating gate FG7. The LDD layer 72d and the LDD layer 72s are provided with the floating gate FG7 interposed therebetween in the plan view of the nonvolatile storage element M7.

The nonvolatile storage element M7 is provided with a tunnel insulating film 75 at least partially disposed between the floating gate FG7 and the drain region D7 and having an area ratio to the floating gate FG7 of 0.002 or more and 1 or less. In this embodiment, the entire tunnel insulating film 75 is disposed between the floating gate FG7 and the first drain layer 71d. The tunnel insulating film 75 is formed to be smaller than the floating gate FG7 in the plan view of the nonvolatile storage element M7. The area of the tunnel insulating film 75 is 0.06 µm² or more and 54 µm² or less in the plan view of the nonvolatile storage element M7. When the area of the entire floating gate FG7 is 30 µm² of the minimum value and the area ratio of the tunnel insulating film 75 to the floating gate FG7 is 0.002 of the minimum value, the area of the tunnel insulating film 75 is 0.06 µm² of the minimum value. The area of the tunnel insulating film 75 in this embodiment is 25 µm², for example. Therefore, in this embodiment, the ratio of the area of the tunnel insulating film 75 to the area of the floating gate FG7 (area ratio), i.e., a value determined by dividing the area of the tunnel insulating film 75 by the area of the floating gate FG7, is 0.017. Since the area ratio of the area of the tunnel insulating film 75 to the area of the floating gate FG7 is 0.017, which is larger than 0.002, the nonvolatile storage element M7 can improve the first mode retention degradation as described in the first embodiment.

In order to perform writing of injecting a charge into the floating gate FG7 or extracting a charge from the floating gate FG7 by FN tunneling, the thickness of the tunnel insulating film 75 may be 7 nm or more and 12 nm or less. In this embodiment, the film thickness of the tunnel insulating film 75 is 9.8 nm, for example. When the film thickness of the tunnel insulating film 75 is 7 to 12 nm, direct tunneling of a charge becomes more unlikely to occur and a charge is more easily retained in the floating gate FG7 as compared with the case where the film thickness is less than 7 nm. On the other hand, when the film thickness of the tunnel insulating film 75 is 7 to 12 nm, the injection of a charge into the floating gate FG7 and the extraction of a charge from the floating gate FG7 can be accelerated as compared with a case where the film thickness is larger than 12 nm. The tunnel insulating film 75 may be formed to have a film thickness smaller than that of the gate insulating film 76. A region of the floating gate FG7 corresponding to the tunnel insulating film 75 serves as a charge inlet 74 injecting a charge into the floating gate FG7 or emitting a charge from the floating gate FG7. More specifically, the floating gate FG7 has the charge inlet 74 for injecting a charge or emitting a charge and functions as a charge retention region.

The nonvolatile storage element M7 has halogen (for example, fluorine) distributing in at least part of the tunnel insulating film 75, the gate insulating film 76, and the insulating film 77. In this embodiment, halogen is contained in all of the tunnel insulating film 75, the gate insulating film 76, and the insulating film 77. Due to the fact that the tunnel insulating film 75 contains halogen (for example, fluorine), the defect density of the tunnel insulating film 75 decreases.

The nonvolatile storage element M7 is provided with an interlayer insulating film 63 formed on the element formation surface of the semiconductor substrate 9C. The interlayer insulating film 63 is formed at least in regions where the control gate CG7, the insulating film 77, the sidewalls 78 and 79, the drain region D7, the source region S7, and the element isolation region 43 are provided. The interlayer insulating film 63 exhibits the function as a protective film protecting the control gate CG7, the drain region D7, the source region S7, and the like.

The nonvolatile storage element M7 is provided with a plug 55g embedded in an opening portion exposing a part of the control gate CG7 to the bottom surface and formed in the interlayer insulating film 63 and a metal wiring line 56g electrically connected to the plug 55g and formed on the interlayer insulating film 63. The metal wiring line 56g and the control gate CG7 are electrically connected through the plug 55g. This makes it possible to apply a voltage of a predetermined level to the control gate CG7 from the metal wiring line 56g through the plug 55g.

The nonvolatile storage element M7 is provided with a plug 55d embedded in an opening portion exposing a part of the second drain layer 73d to the bottom surface and formed in the interlayer insulating film 63 and a metal wiring line 56d electrically connected to the plug 55d and formed on the interlayer insulating film 63. The metal wiring line 56d and the drain region D7 are electrically connected through the plug 55d. This makes it possible to apply a voltage of a predetermined level to the drain region D7 from the metal wiring line 56d through the plug 55d.

The nonvolatile storage element M7 is provided with a plug 55s embedded in an opening portion exposing a part of the source layer 73s to the bottom surface and formed in the interlayer insulating film 63 and a metal wiring line 56s electrically connected to the plug 55s and formed on the interlayer insulating film 63. The metal wiring line 56s and the source region S7 are electrically connected through the plug 55s. This makes it possible to apply a voltage of a predetermined level to the source region S7 from the metal wiring line 56s through the plug 55s.

The specific region PA of the floating gate FG7 may have an area of 17.5 $\mu m^2$ or more, for example. When the gate width of the specific region PA of the floating gate FG7 is defined as W and the gate length of the specific region PA of the floating gate FG7 is defined as L (see FIG. 27A), the gate width W and the gate length L of the specific region PA of the floating gate FG7 may satisfy the relationship of Expression (4) described above. When the floating gate FG7 has an area larger than 30 $\mu m^2$, the specific region PA of the floating gate FG7 may have an area of 30 $\mu m^2$ or more. Thus, the nonvolatile storage element M7 according to this embodiment obtains the same effects as those of the nonvolatile storage element M1 according to the first embodiment.

Next, a method for adjusting the threshold voltage Vth of the nonvolatile storage element M7 is described.

For example, when 19 V is applied to the control gate CG7 and 0 V is applied to the drain region D7, an electron is injected into the floating gate FG7 through the tunnel insulating film 75, and then the floating gate FG7 is brought into a negatively charged state. In this state, the floating gate FG7 acts in a direction of suppressing an electric field applied to the gate insulating film 76 when a positive bias is applied to the control gate CG7. Therefore, the threshold voltage Vth increases in the nonvolatile storage element M7 and the nonvolatile storage element M7 functions as an enhancement type MOSFET.

On the other hand, when 0 V is applied to the control gate CG7 and 19 V is applied to the drain region D7, for example, an electron is extracted from the floating gate FG7 through the tunnel insulating film 75, and then the floating gate FG7 is brought into a positively charged state. In this state, the floating gate FG7 acts in a direction of intensifying an electric field applied to the gate insulating films 76 when a positive bias is applied to the control gate CG7. Therefore, the threshold voltage Vth decreases in the nonvolatile storage element M7 and the nonvolatile storage element M7 functions as a depression type MOSFET. Thus, the threshold voltage Vth of the nonvolatile storage element M7 can be adjusted to a desired value by controlling the injection of a charge into the floating gate FG7 or the extraction of a charge from the floating gate FG7.

(Reference Voltage Generation Circuit Provided with Nonvolatile Storage Element)

Next, a reference voltage generation circuit is described with reference to FIGS. 28 to 31 as an example of the analog circuit provided with the nonvolatile storage element M7 according to this embodiment. The analog circuit to which the nonvolatile storage element M7 is applied is not limited to the reference voltage generation circuit insofar as the circuit is a circuit using the nonvolatile storage element M7 in an analog manner. For example, the nonvolatile storage element M7 is effective also in analog circuits requiring accuracy in the threshold voltage of the MOSFET, such as an operational amplifier circuit and a comparator circuit.

Figure 28:
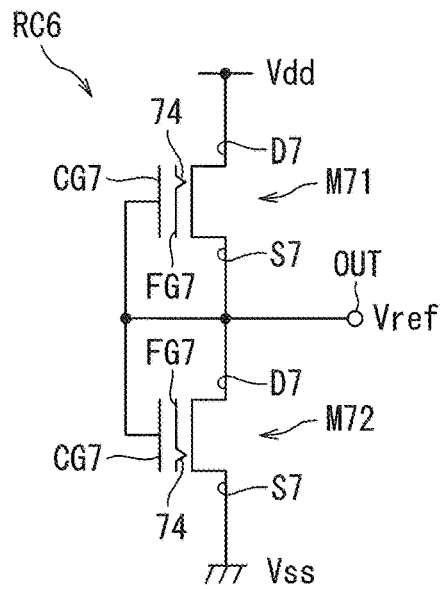
FIG. 28 is a circuit configuration diagram for explaining a reference voltage generation circuit RC6 provided with the nonvolatile storage element according to the third embodiment of the present invention.

As illustrated in FIG. 28, the reference voltage generation circuit RC6 in this embodiment is provided with a plurality (two in this example) of nonvolatile storage elements M71 and M72. At least some of the plurality of nonvolatile storage elements M71 and M72 (both the nonvolatile storage elements in this example) are connected in series and a voltage output terminal OUT outputting the reference voltage Vref is connected to a connection portion of the plurality of nonvolatile storage elements M71 and M72 connected in series. Both the nonvolatile storage element M71 and the nonvolatile storage element M72 have the FLOTOX type configuration of an N-type MOSFET and have the same configuration as that of the nonvolatile storage element M7 illustrated in FIGS. 27A and 27B.

The nonvolatile storage element M71 and the nonvolatile storage element M72 are connected in series between a high voltage supply terminal Vdd to which a high voltage is supplied and a low voltage supply terminal Vss to which a low voltage is supplied. The drain region D7 of the nonvolatile storage element M71 is connected to the high voltage supply terminal Vdd. A source region S7 of the nonvolatile storage element M72 is connected to the low voltage supply terminal Vss. The source region S7 and the control gate CG7 of the nonvolatile storage element M71 are connected to each other. The drain region D7 and the control gate CG7 of the nonvolatile storage element M72 are connected to each other. The source region S7 and the control gate CG7 of the nonvolatile storage element M71 and the drain region D7 and the control gate CG7 of the nonvolatile storage element M72 are connected to each other. The voltage output terminal OUT is connected to a connection portion of the source region S7 of the nonvolatile storage element M71 and the drain region D7 of the nonvolatile storage element M72.

In the reference voltage generation circuit RC6, the nonvolatile storage element M72 on the lower stage side (low voltage supply terminal Vss side) is adjusted to be brought into an enhancement state and the nonvolatile storage element M71 on the upper stage side (high voltage supply terminal Vdd side) is adjusted to be brought into a depression state. The nonvolatile storage elements M71 and M72 each have the control gate CG7 and the floating gate FG7, in which fluorine is distributed as halogen in the tunnel insulating film 75, the gate insulating film 76, and the insulating film 77 (see FIG. 27B) around the floating gate FG7. Thus, the nonvolatile storage elements M71 and M72 can perform writing/erasing and can hold a writing state over a long period of time. The threshold voltage of a depression type transistor becomes negative and the threshold voltage of an enhancement type transistor becomes positive. Therefore, the plurality of nonvolatile storage elements provided in the reference voltage generation circuit RC6 as the analog circuit according to this embodiment contain at least the nonvolatile storage element M71 having a negative threshold voltage and the nonvolatile storage element M72 having a positive threshold voltage. The nonvolatile storage elements M71 and M72 do not have an array structure.

Figure 29:
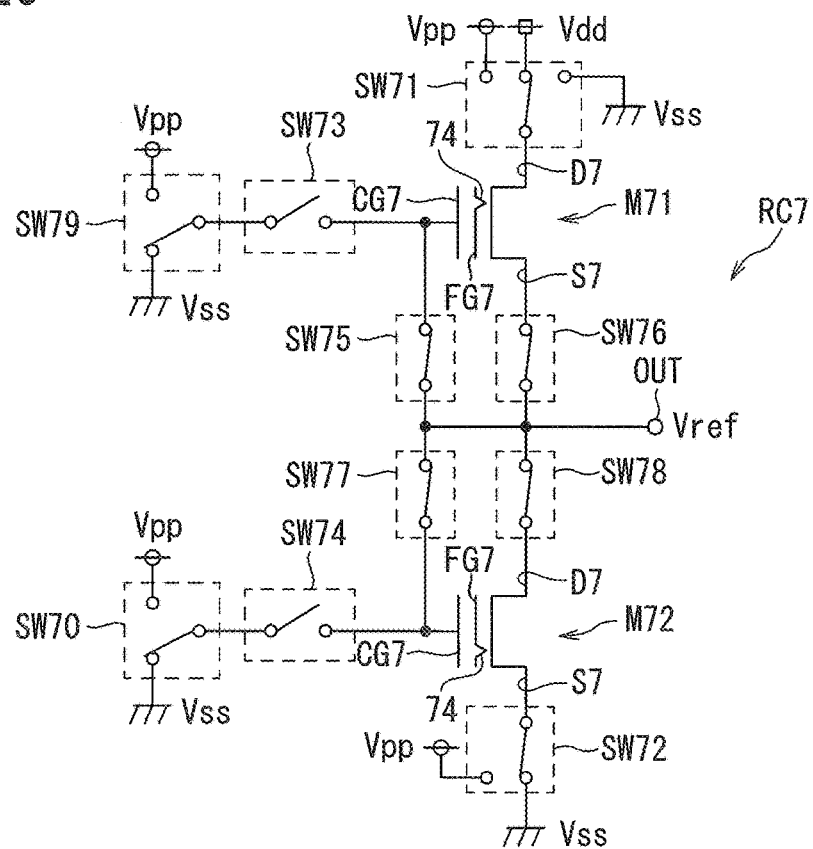
FIG. 29 is a circuit configuration diagram for explaining a reference voltage generation circuit RC7 provided with the nonvolatile storage element according to the third embodiment of the present invention.

As illustrated in FIG. 29, a reference voltage generation circuit RC7 which is the analog circuit according to this embodiment and which can perform writing in the nonvolatile storage elements M71 and M72 is provided with a switch SW71 having one terminal connected to the drain region D7 of the nonvolatile storage element M71. One of the other terminals of the switch SW71 is connected to a high voltage supply terminal Vdd, another of the other terminals of the switch SW71 is connected to a low voltage supply terminal Vss, and the other one of the other terminals of the switch SW71 is connected to an application terminal of a pulse voltage Vpp. The reference voltage generation circuit RC7 is configured to be able to apply either one of the high voltage Vdd, the low voltage Vss, and the pulse voltage Vpp to the drain region D7 of the nonvolatile storage element M71 by switching the switch SW71 as appropriate.

The reference voltage generation circuit RC7 is provided with a switch SW72 having one terminal connected to the source region S7 of the nonvolatile storage element M72. One of the other terminals of the switch SW72 is connected to a low voltage supply terminal Vss and the other one of the other terminals of the switch SW72 is connected to an application terminal of a pulse voltage Vpp. The reference voltage generation circuit RC7 is configured to be able to apply either one of the low voltage Vss and the pulse voltage Vpp to the source region S7 of the nonvolatile storage element M72 by switching the switch SW72 as appropriate.

The reference voltage generation circuit RC7 is provided with a switch SW76 and a switch SW78 connected in series between the source region S7 of the nonvolatile storage element M71 and the drain region D7 of the nonvolatile storage element M72. The source region S7 of the nonvolatile storage element M71 is connected to one terminal of the switch SW76 and the drain region D7 of the nonvolatile storage element M72 is connected to one terminal of the switch SW78. The other terminal of the switch SW76 and the other terminal of the switch SW78 are connected.

The reference voltage generation circuit RC7 is provided with a switch SW75 and a switch SW77 connected in series between the control gate CG7 of the nonvolatile storage element M71 and the control gate CG7 of the nonvolatile storage element M72. The control gate CG7 of the nonvolatile storage element M71 is connected to one terminal of the switch SW75 and the control gate CG7 of the nonvolatile storage element M72 is connected to one terminal of the switch SW77. The other terminal of the switch SW75 and the other terminal of the switch SW77 are connected.

The other terminals of the switch SW75, the switch SW76, the switch SW77, and the switch SW78 are connected to each other. The reference voltage generation circuit RC7 is provided with the voltage output terminal OUT connected to a connection portion where the other terminals of the switch SW75, the switch SW76, the switch SW77, and the switch SW78 are connected to each other.

The reference voltage generation circuit RC7 is provided with a switch SW73 having one terminal connected to the control gate CG7 of the nonvolatile storage element M71 and a switch SW79 having one terminal connected to the other terminal of the switch SW73. One of the other terminals of the switch SW79 is connected to an application terminal of a pulse voltage Vpp and the other one of the other terminals of the switch SW79 is connected to a low voltage supply terminal Vss. The reference voltage generation circuit RC7 is configured to be able to apply either one of the pulse voltage Vpp and the low voltage Vss to the control gate CG7 of the nonvolatile storage element M71 by switching the switch SW79 as appropriate when the switch SW73 is in a connection state (short-circuit state).

The reference voltage generation circuit RC7 is provided with a switch SW74 having one terminal connected to the control gate CG7 of the nonvolatile storage element M72 and a switch SW70 having one terminal connected to the other terminal of the switch SW74. One of the other terminals of the switch SW70 is connected to an application terminal of a pulse voltage Vpp and the other one of the other terminals of the switch SW70 is connected to a low voltage supply terminal Vss. The reference voltage generation circuit RC7 is configured to be able to apply either one of the pulse voltage Vpp and the low voltage Vss to the control gate CG7 of the nonvolatile storage element M72 by switching the switch SW70 as appropriate when the switch SW74 is in a connection state (short-circuit state).

As illustrated in FIG. 29, the reference voltage generation circuit RC7 switches the switches SW70 to SW79 to the following states when outputting the reference voltage Vref from the voltage output terminal OUT.

Switch SW70: Arbitrary (low voltage Vss side in FIG. 29)
Switch SW71: High voltage supply terminal Vdd side
Switch SW72: Low voltage supply terminal Vss side
Switch SW73, SW74: Open state (open-circuit state)
Switches SW75, SW76, SW77, SW78: Connection state (short-circuit state)
Switch SW79: Arbitrary (low-voltage Vss side in FIG. 29)

In the reference voltage generation circuit RC7, a reference voltage Vref is generated by bringing the switches SW70 to SW79 into the switched state illustrated in FIG. 29 when the nonvolatile storage element M71 is in a depression state and the nonvolatile storage element M72 is in an enhancement state. More specifically, the reference voltage generation circuit RC7 is provided with a switch portion including the switches SW70 to SW79 setting the potential of each terminal of the nonvolatile storage elements M71 and M72 to a desired potential.

Figure 30:
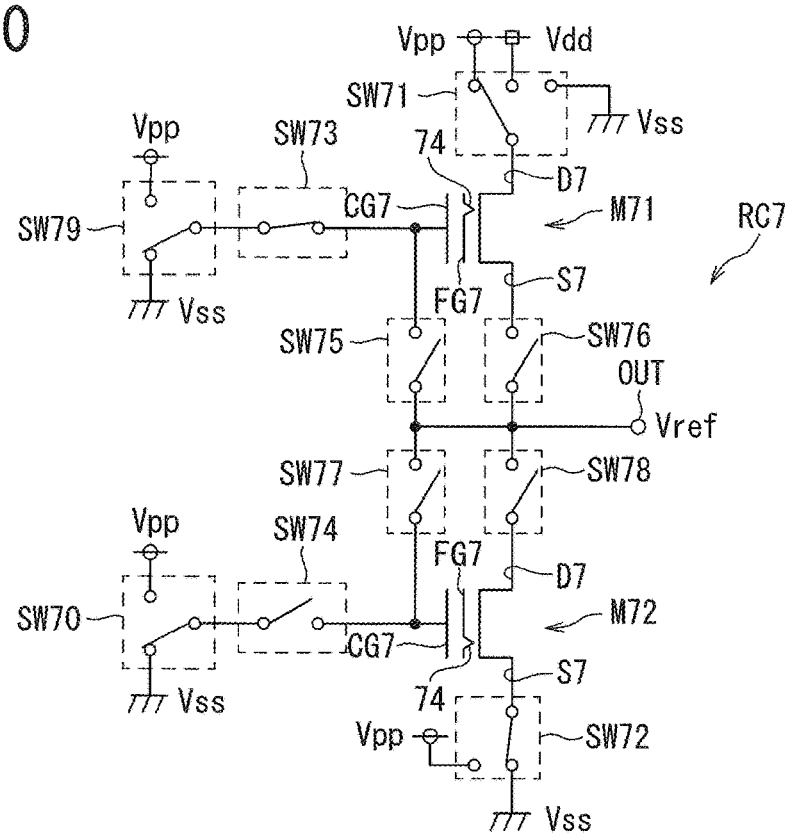
FIG. 30 is a circuit configuration diagram for explaining a reference voltage generation circuit RC7 provided with the nonvolatile storage element according to the third embodiment of the present invention and for explaining a state of adjusting a nonvolatile storage element M71 on the upper stage side of the reference voltage generation circuit RC7 to a depression state.

As illustrated in FIG. 30, the reference voltage generation circuit RC switches the switches SW70 to SW79 to the following states in rewriting for bringing the nonvolatile storage element M71 into a depression state. Herein, a case where the threshold voltage before the adjustment on the nonvolatile storage element M71 side is higher than the threshold voltage after the adjustment is taken as an example.

Switch SW70: Arbitrary (low voltage supply terminal Vss side in FIG. 30)

Switch SW71: Pulse voltage Vpp side

Switch SW72: Low voltage supply terminal Vss side switch

SW73: Connection state (short-circuit state)

Switch SW74: Open state (open-circuit state)

Switches SW75, SW76, SW77, SW78: Open-circuit state

Switch SW79: Low voltage supply terminal Vss side

Therefore, the pulse voltage Vpp is applied to the drain region D7 of the nonvolatile storage element M71 and the low voltage Vss is applied to the control gate CG7, and therefore an electron is emitted to the drain region D7 from the floating gate FG7 through the charge inlet 74. Thus, the threshold voltage of the nonvolatile storage element M71 becomes low. On the contrary, when the low voltage Vss is applied to the drain region D7 of the nonvolatile storage element M71 and the pulse voltage Vpp is applied to the control gate CG7, an electron is injected into the floating gate FG7 from the drain region D7 through the charge inlet 74. Thus, the threshold voltage of the nonvolatile storage element M71 becomes high.

Figure 31:
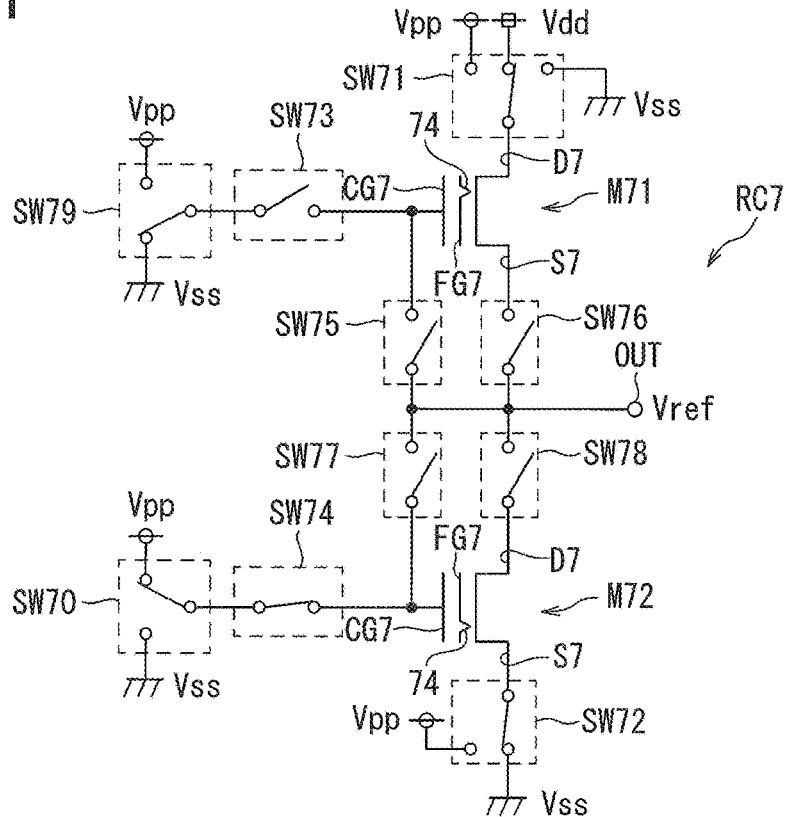
FIG. 31 is a circuit configuration diagram for explaining the reference voltage generation circuit RC7 provided with the nonvolatile storage element according to the third embodiment of the present invention and for explaining a state of adjusting a nonvolatile storage element M72 on the lower stage side of the reference voltage generation circuit RC7 to an enhancement state.
Figure 32B:
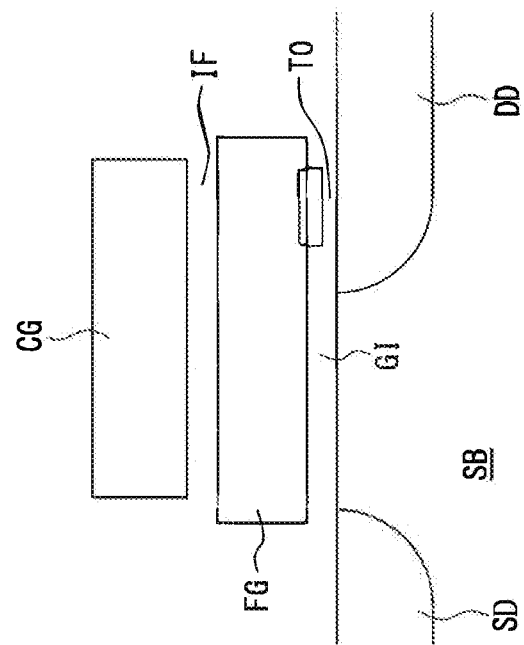
Figure 32A:
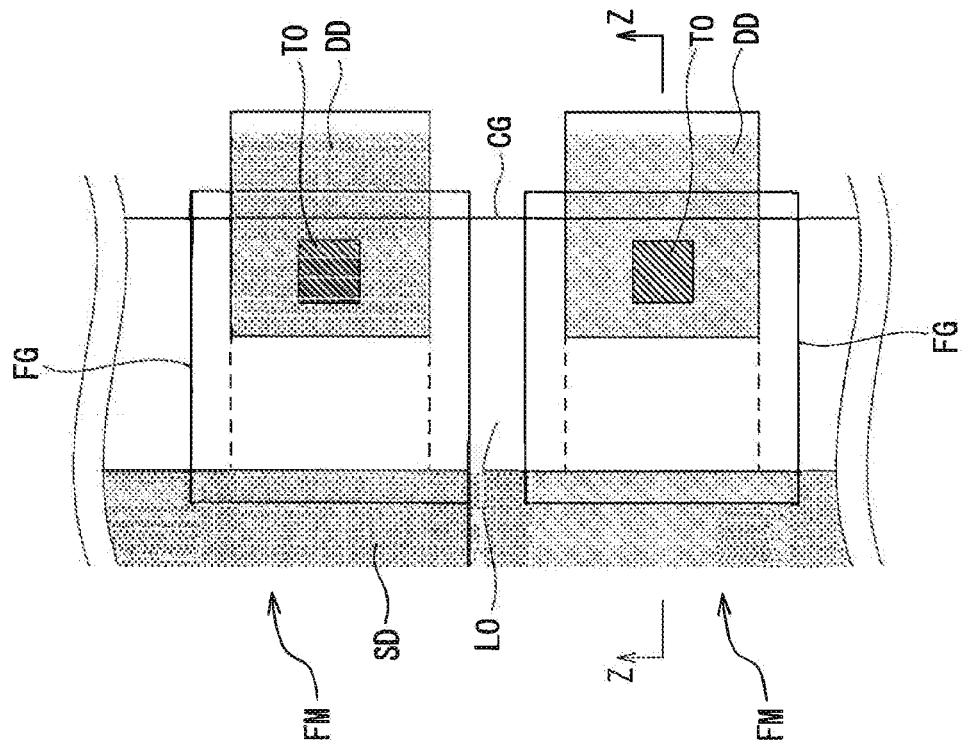

As illustrated in FIG. 31, the reference voltage generation circuit RC7 switches the switches SW70 to SW79 to the following states in rewriting for bringing the nonvolatile storage element M72 into an enhancement state. Herein, a case where the threshold voltage before the adjustment on the nonvolatile storage element M72 side is lower than the threshold voltage after the adjustment is taken as an example.

Switch SW70: Pulse voltage Vpp side

Switch SW71: High voltage supply terminal Vdd side

Switch SW72: Low voltage supply terminal Vss side

Switch SW73: Open state (open-circuit state)

Switch SW74: Connection state (short-circuit state)

Switches SW75, SW76, SW77, SW78: Open state (open-circuit state)

Switch SW79: Arbitrary (low voltage supply terminal Vss side in FIG. 31)

Therefore, the low voltage Vss is applied to the source region S7 of the nonvolatile storage element M72 and the pulse voltage Vpp is applied to the control gate CG7, and therefore an electron is injected into the floating gate FG7 from the source region S7 through the charge inlet 74. Thus, the threshold voltage of the nonvolatile storage element M72 becomes high. On the contrary, when the pulse voltage Vpp is applied to the source region S7 of the nonvolatile storage element M72 and the low voltage Vss is applied to the control gate CG7, an electron is emitted to the source region S7 from the floating gate FG7 through the charge inlet 74. Thus, the threshold voltage of the nonvolatile storage element M72 becomes low.

As illustrated in FIGS. 29 to 31, the reference voltage generation circuit RC7 can rewrite the threshold voltages Vth of the specific nonvolatile storage elements M71 and M72 to desired values, and then generate a reference voltage Vref in a state finally illustrated in FIG. 29 by switching the switches SW70 to SW79 as appropriate.

Thus, the drain regions D7 of the nonvolatile storage elements M71 and M72 receive a voltage when varying the threshold voltage to serve as a current path in the generation of the reference voltage Vref of the reference voltage generation circuit RC7. More specifically, in the nonvolatile storage element M71 and M72, the drain regions D7 function as a writing voltage application region and a drain region of the driving MOSFET.

Since the nonvolatile storage elements of the same type are used as the MOSFETs configuring the reference voltage generation circuits RC6 and RC7 in this embodiment, i.e., as the transistors, as with the reference voltage generation circuits in the first embodiment described above, the conductance or the temperature characteristics can be made identical in the two transistors, and thus the ideally translated characteristics of the two transistors can be obtained.

As described above, the nonvolatile storage element M7 according to this embodiment is provided with the semiconductor substrate 9C, the floating gate FG7 provided on the semiconductor substrate 9C, the control gate CG7 disposed above the floating gate FG7 to be insulated from the floating gate FG7, the drain region D7 provided in the semiconductor substrate 9C and partially disposed below the floating gate FG7, and the tunnel insulating film 75 at least partially disposed between the floating gate FG7 and the drain region D7 and having an area ratio to the floating gate FG7 of 0.002 or more and 1 or less.

The nonvolatile storage element M7 having such a configuration can suppress the first mode retention degradation and the second mode retention degradation.

The nonvolatile storage element M7 according to this embodiment is provided with the floating gate FG7 having an area of 30 $\mu m^2$ or more. Thus, the nonvolatile storage element M7 according to this embodiment is usable as a MOSFET suitable for an analog circuit, such as a reference voltage generating circuit. In the analog circuit provided with the nonvolatile storage element M7 according to this embodiment, a characteristic fluctuation due to the retention degradation is suppressed and the influence of manufacturing variations or temperature characteristics can be reduced.

The present invention is not limited to the above-described embodiments and can be variously modified.

The tunnel insulating film may be formed by partially reducing the film thickness of the gate insulating film. Also in this case, the first mode retention degradation and the second mode retention degradation can be suppressed due to the fact that the floating gate is formed to have an area of 30 $\mu m^2$ or more and the tunnel insulating film is formed to have an area ratio to the floating gate of 0.002 or more 1 or less.

When the nonvolatile storage element is provided with the writing element and the driving element and the tunnel insulating film is formed by reducing the film thickness of the gate insulating film, a recessed portion (level difference structure) is formed on the floating gate side in the gate insulating film in the writing element. Therefore, the contact surface with the floating gate FG is flatter in the gate insulating film in the driving element than in the gate insulating film in the writing element.

Although the writing elements in the first and second embodiments have the gate insulating film and the tunnel insulating film having a thickness smaller than that of the gate insulating film, the present invention is not limited thereto. For example, the writing elements in the first and second embodiments may have a flat insulating film formed immediately under the floating gate with such a film thickness that the insulating film functions as a tunnel insulating film. In this case, the insulating film functions as a tunnel insulating film and also functions as a gate insulating film, and therefore the writing elements having the insulating film can obtain the same effects as those of the writing elements in the first and second embodiments. When the area of the insulating film and the area of the floating gate are the same, the area ratio of the tunnel insulating film to the floating gate is 1.

Although the nonvolatile storage element according to the third embodiment has the gate insulating film and the tunnel insulating film having a thickness smaller than that of the gate insulating film, the present invention is not limited thereto. For example, the nonvolatile storage element according to the third embodiment may have a flat insulating film formed immediately under the floating gate with such a film thickness that the insulating film functions as a tunnel insulating film. In this case, the insulating film functions as a tunnel insulating film and functions also as a gate insulating film, and therefore the nonvolatile storage element having the insulating film obtains the same effects as those of the nonvolatile storage element according to the third embodiment. When the area of the insulating film and the area of the floating gate are the same, the area ratio of the tunnel insulating film to the floating gate is 1.

The floating gate FG1 in the first embodiment may be isolated in the writing element Mw1, the driving element Mv1, and the dummy element Mm1. When the floating gate is isolated, the floating gate of the writing element Mw1, the floating gate of the driving element Mv1, and the floating gate of the dummy element Mm1 need to be electrically connected by a plug and a metal wiring line, for example, because the same voltage is applied thereto.

The control gate CG1 in the first embodiment may be isolated in the writing element Mw1, the driving element Mv1, and the dummy element Mm1. When the control gate is isolated, the control gate of the writing element Mw1, the control gate of the driving element Mv1, and the control gate of the dummy element Mm1 need to be electrically connected by a plug and a metal wiring line, for example, because the same voltage is applied thereto.

REFERENCE SIGNS LIST 9A, 9B, 9c semiconductor substrate
10A, 10B, 10c P-well region
10z, 16z oxide film
11a, 21a diffusion layer
11m, 11v, 71d first drain layer
12a, 12b, 12md, 12ms, 12vd, 12vm, 12vs, 22a, 22d, 22s, 72d, 72 LDD layer
13a, 13b, 23a contact layer
13md, 13vd, 73d second drain layer
13ms, 13vs, 23s, 73s source layer
14, 24, 74 charge inlet
15, 25, 75 tunnel insulating film
15z opening portion
16m, 16v, 16w, 26v, 26w, 76 gate insulating film
17, 27, 77 insulating film
17z ONO film
18, 19, 28, 29, 78, 79 sidewall
23d drain layer
41, 42, 43 element isolation region
51a, 51b, 51g, 51md, 51ms, 51vd, 51vs, 53a, 53d, 53g, 53s, 55d, 55g, 55s plug
52a, 52b, 52g, 52md, 52ms, 52vd, 52vs, 54a, 54d, 54g, 54s, 56d, 56g, 56s metal wiring line
61, 62, 63 interlayer insulating film
81 main circuit portion
82 multistage inverter circuit
83 switching circuit
811 logic circuit portion
812 analog circuit portion
821 initial state inverter circuit
821a PMOSFET
822 final stage inverter circuit
CG1, CG2, CG7 control gate
CGy oxide film
CGz, FGz polysilicon film
D1, D2, D7, Dm1, Dv1 drain region
EC electronic circuit
FA fluoride existing region
FG1, FG2, FG7 floating gate
IA impurity diffusion region
IAa first impurity diffusion region
IAb second impurity diffusion region
M1, M2, M7, M11, M13, M21, M22, M31, M33, M51, M53, M71, M73 nonvolatile storage element
Mm1, Mm11, Mm13, Mm31, Mm33, Mm51, Mm53 dummy element
Mv1, Mv2, Mv11, Mv13, Mv21, Mv22, Mv31, Mv33, Mv51, Mv53 driving element
Mw1, Mw2, Mw11, Mw13, Mw21, Mw22, Mw31, Mw33, Mw51, Mw53 writing element
PA specific region
RC2, RC3, RC6, RC7 reference voltage generation circuit
RM11, RM15, RMc, RMf, RMfg resist mask
S1, S2, S7, Sm1, Sv1 source region
SW10 to SW15, S17, SW19, SW20 to SW25, SW27, SW29, SW30 to SW35,
S37, SW39, SW50 to SW55, S57, SW59, SW70 to 79 switch

What is claimed is:
1. A nonvolatile storage element comprising:
a semiconductor substrate; and
a floating gate provided above the semiconductor substrate,
wherein
a specific region of the floating gate has an area of 17.5 µm² or more, and
when a gate width of the specific region is defined as W and a gate length of the specific region is defined as L, a relationship given by Expression 1 is satisfied:

Expression 1
$$9.28 \times 10^{-5} \geq \frac{W^{2.036}}{L^{2.215}}.$$

2. The nonvolatile storage element according to claim 1, wherein the specific region has an area of 30 µm² or more.
3. The nonvolatile storage element according to claim 1 further comprising:
a first region provided in the semiconductor substrate and partially disposed below the floating gate; and
a tunnel insulating film at least partially disposed between the floating gate and the first region and having an area ratio to the floating gate of 0.002 or more and 1 or less.
4. The nonvolatile storage element according to claim 2 further comprising:
a first region provided in the semiconductor substrate and partially disposed below the floating gate; and
a tunnel insulating film at least partially disposed between the floating gate and the first region and having an area ratio to the floating gate of 0.002 or more and 1 or less.
5. The nonvolatile storage element according to claim 3, wherein an area of the tunnel insulating film is 0.06 µm² or more and 54 µm² or less.
6. The nonvolatile storage element according to claim 3, wherein a thickness of the tunnel insulating film is 7 nm or more and 12 nm or less.
7. The nonvolatile storage element according to claim 3, wherein the tunnel insulating film contains fluorine.

8. The nonvolatile storage element according to claim 3, wherein the first region functions as a writing voltage application region and a drain region of a driving MOSFET.

9. The nonvolatile storage element according to claim 3 comprising:
a gate insulating film disposed between the floating gate and the semiconductor substrate and having a film thickness larger than a film thickness of the tunnel insulating film.

10. The nonvolatile storage element according to claim 3 further comprising:
a second region provided in the semiconductor substrate and formed to be electrically isolated from the first region.

11. The nonvolatile storage element according to claim 10, wherein the first region functions as a writing voltage application region, and the second region functions as a drain region of a driving MOSFET.

12. The nonvolatile storage element according to claim 5, wherein a thickness of the tunnel insulating film is 7 nm or more and 12 nm or less.

13. The nonvolatile storage element according to claim 5, wherein the tunnel insulating film contains fluorine.

14. The nonvolatile storage element according to claim 5, wherein the first region functions as a writing voltage application region and a drain region of a driving MOSFET.

15. The nonvolatile storage element according to claim 5 comprising:
a gate insulating film disposed between the floating gate and the semiconductor substrate and having a film thickness larger than a film thickness of the tunnel insulating film.

16. The nonvolatile storage element according to claim 5 further comprising:
a second region provided in the semiconductor substrate and formed to be electrically isolated from the first region.

17. The nonvolatile storage element according to claim 4, wherein an area of the tunnel insulating film is 0.06 $\mu m^2$ or more and 54 $\mu m^2$ or less.

* * * * *